(12) United States Patent
Lee et al.

(10) Patent No.: US 12,588,187 B2
(45) Date of Patent: Mar. 24, 2026

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Hye Ran Lee, Hwaseong-si (KR); Kyung Soo Kim, Hwaseong-si (KR); Kyoung Cho Na, Hwaseong-si (KR); Se Ryeun Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 623 days.

(21) Appl. No.: 17/901,368

(22) Filed: Sep. 1, 2022

(65) Prior Publication Data

US 2023/0148126 A1 May 11, 2023

(30) Foreign Application Priority Data

Nov. 8, 2021 (KR) ........................ 10-2021-0152101

(51) Int. Cl.
| | |
|---|---|
| *H10B 12/00* | (2023.01) |
| *H10D 30/62* | (2025.01) |
| *H10D 62/13* | (2025.01) |
| *H10D 64/01* | (2025.01) |

(52) U.S. Cl.
CPC .......... *H10B 12/315* (2023.02); *H10B 12/36* (2023.02); *H10B 12/50* (2023.02); *H10D 30/6211* (2025.01); *H10D 62/151* (2025.01); *H10D 64/021* (2025.01)

(58) Field of Classification Search
CPC ........ H10B 12/00; H10B 12/36; H10B 12/56; H10B 12/50; H10B 12/033; H10B 12/0335; H10B 12/315; H10B 12/31
See application file for complete search history.

(56) References Cited

U.S. PATENT DOCUMENTS

| | | |
|---|---|---|
| 9,214,348 B2 | 12/2015 | Son et al. |
| 10,790,282 B2 | 9/2020 | Choi et al. |

(Continued)

FOREIGN PATENT DOCUMENTS

| | | |
|---|---|---|
| KR | 101402580 B1 | 5/2014 |
| KR | 101598690 B1 | 2/2016 |
| KR | 101656151 B1 | 9/2016 |

*Primary Examiner* — Julio J Maldonado
*Assistant Examiner* — Nathan Pridemore
(74) *Attorney, Agent, or Firm* — Muir Patent Law, PLLC

(57) ABSTRACT

A semiconductor memory device includes a substrate including cell and peripheral regions, a cell gate electrode disposed at the cell region, a bit line structure disposed at the cell region and including a cell conductive line and a cell line capping film disposed thereon, fin-type patterns disposed at the peripheral region, a peripheral gate electrode crossing the fin-type patterns, a peripheral gate separation pattern disposed on a sidewall of the peripheral gate electrode and having an upper surface higher than an upper surface of the peripheral gate electrode, and a peripheral interlayer insulating film covering the peripheral gate electrode, the peripheral gate separation pattern and a portion of a sidewall of the peripheral gate separation pattern. An upper surface of the peripheral interlayer insulating film and an uppermost surface of the cell line capping film are positioned at the same height relative to the substrate.

18 Claims, 57 Drawing Sheets

(56) References Cited

U.S. PATENT DOCUMENTS

| 2009/0294857 | A1* | 12/2009 | Lee | H10B 12/056 |
| | | | | 257/E29.264 |
| 2011/0159663 | A1* | 6/2011 | Kang | H10B 12/50 |
| | | | | 257/E21.573 |
| 2014/0131786 | A1* | 5/2014 | Ryu | H10D 30/6894 |
| | | | | 257/316 |
| 2014/0327087 | A1* | 11/2014 | Kim | H10D 84/834 |
| | | | | 257/392 |
| 2015/0079779 | A1 | 3/2015 | Nishi et al. | |
| 2021/0202488 | A1 | 7/2021 | Choi | |
| 2021/0242210 | A1 | 8/2021 | Lee | |

* cited by examiner

Figure 39:
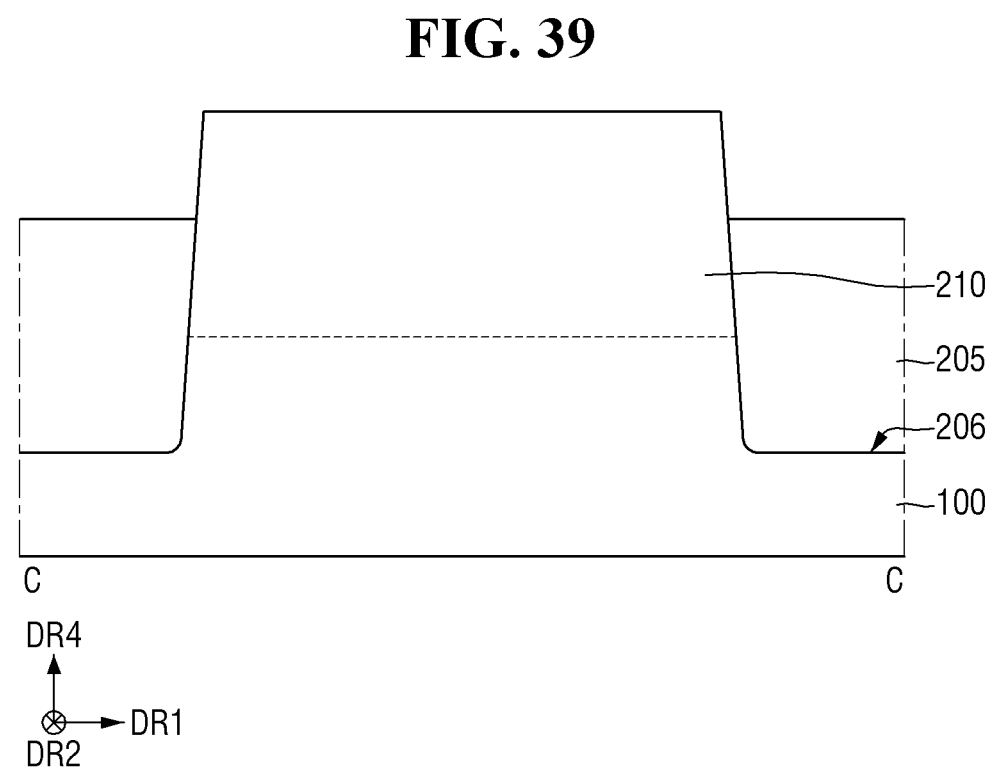

Figure 40:
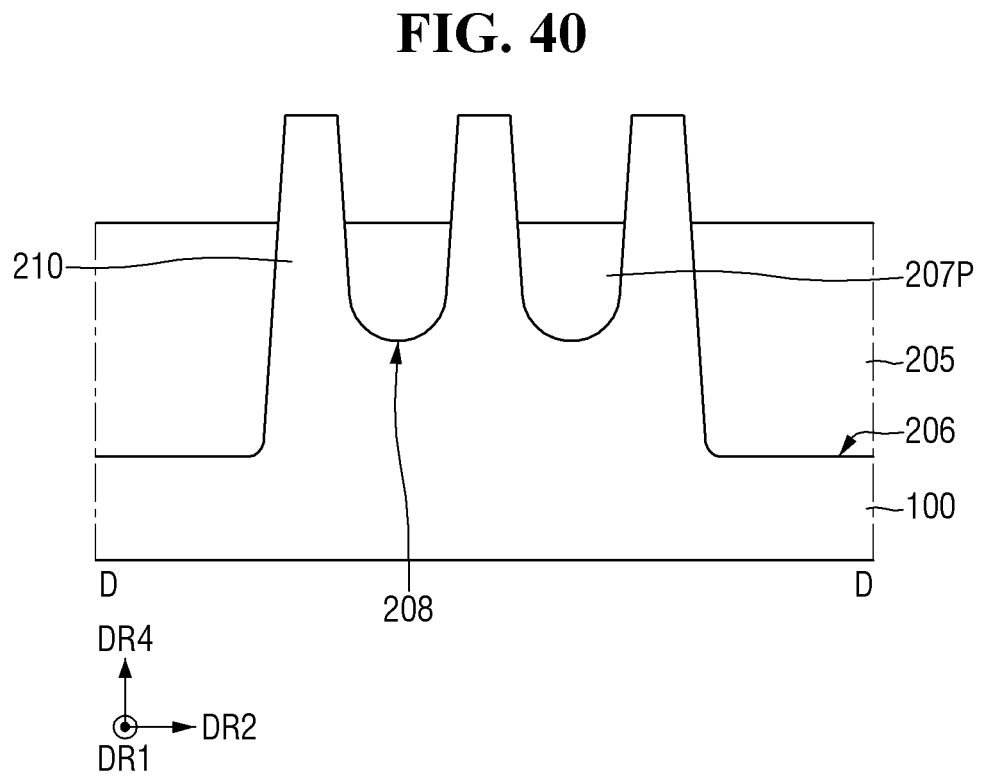

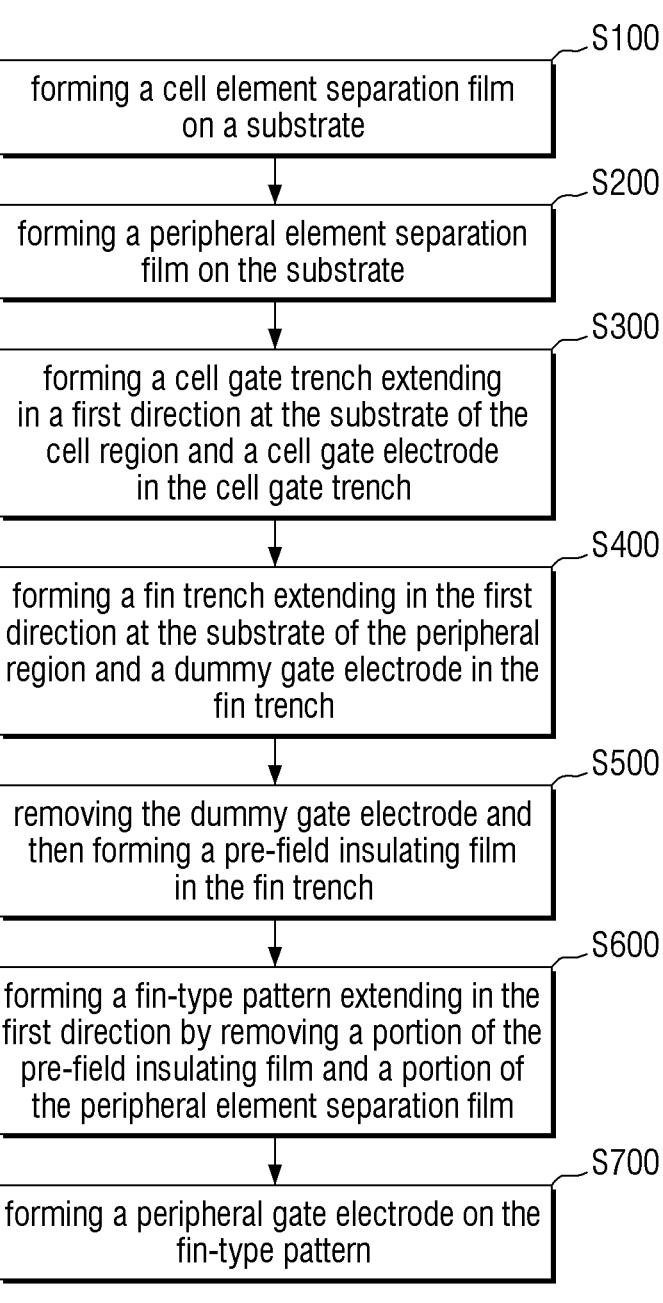

S100
forming a cell element separation film
on a substrate

S200
forming a peripheral element separation
film on the substrate

S300
forming a cell gate trench extending
in a first direction at the substrate of the
cell region and a cell gate electrode
in the cell gate trench S400
forming a fin trench extending in the first
direction at the substrate of the peripheral
region and a dummy gate electrode in the
fin trench S500
removing the dummy gate electrode and
then forming a pre-field insulating film
in the fin trench S600
forming a fin-type pattern extending in the
first direction by removing a portion of the
pre-field insulating film and a portion of
the peripheral element separation film S700
forming a peripheral gate electrode on the
fin-type pattern

1

SEMICONDUCTOR MEMORY DEVICE AND METHOD FOR FABRICATING THE SAME

CROSS-REFERENCE TO RELATED APPLICATION

This application claims priority from Korean Patent Application No. 10-2021-0152101 filed on Nov. 8, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor memory device and a method of fabricating the same, and more particularly, to a semiconductor memory device including a plurality of wiring lines and node pads crossing each other, and a method of fabricating the same.

2. Description of the Related Art

As semiconductor elements are increasingly highly integrated, individual circuit patterns have become finer in order to implement more semiconductor elements in the same area. That is, as a degree of integration of the semiconductor element increases, design rules for components of the semiconductor element have decreased.

In a highly scaled semiconductor element, a process of forming a plurality of wiring lines and a plurality of buried contacts (BC) interposed between the plurality of wiring lines has become increasingly complicated and difficult to implement.

SUMMARY

Aspects of the present disclosure provide a semiconductor memory device capable of improving performance and reliability.

Aspects of the present disclosure also provide a method for fabricating a semiconductor memory device capable of improving performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor memory device comprising a substrate including a cell region and a peripheral region surrounding the cell region, the cell region including a cell active region, a cell gate electrode disposed at the substrate of the cell region and extending in a first direction, a bit line structure disposed at the substrate of the cell region and including a cell conductive line extending in a second direction different from the first direction and a cell line capping film disposed on the cell conductive line, a plurality of fin-type patterns disposed at the substrate of the peripheral region, extending in the first direction, and being spaced apart from each other in the second direction, a peripheral gate electrode crossing the plurality of fin-type patterns and including a first sidewall extending in the first direction and a second sidewall extending in the second direction, a peripheral gate separation pattern disposed on the first sidewall of the peripheral gate electrode and having an upper surface higher than an upper surface of the peripheral gate electrode, and a peripheral interlayer insulating film covering the upper surface of the peripheral gate electrode, the upper surface of the peripheral gate separation pattern and a portion of a sidewall of the peripheral gate separation pattern. An upper surface of the peripheral interlayer insulating film and an uppermost surface of the cell line capping film are positioned at the same height relative to the substrate.

According to an aspect of the present disclosure, there is provided a semiconductor memory device comprising a substrate including a cell region and a peripheral region surrounding the cell region, the cell region including a cell active region, a cell element separation film on the substrate and defining the cell active region, a cell gate structure disposed at the substrate of the cell region and including a cell gate trench extending in a first direction across the cell element separation film and the cell active region, and a cell gate electrode in the cell gate trench, a bit line structure disposed at the substrate of the cell region and including a cell conductive line extending in a second direction different from the first direction and a cell line capping film disposed on the cell conductive line, a plurality of fin-type patterns disposed at the substrate of the peripheral region, extending in the first direction, and being spaced apart from each other in the second direction, a fin trench separating the plurality of fin-type patterns adjacent to each other in the second direction from each other, a peripheral gate electrode crossing the plurality of fin-type patterns, and a peripheral interlayer insulating film disposed on the peripheral gate electrode. A depth of the cell gate trench is the same as a depth of the fin trench.

According to an aspect of the present disclosure, there is provided a semiconductor memory device comprising a substrate including a cell region and a peripheral region surrounding the cell region, the cell region including a cell active region, a plurality of cell gate electrodes disposed at the substrate of the cell region and extending in a first direction, a bit line structure disposed at the substrate of the cell region and including a cell conductive line extending in a second direction different from the first direction and a cell line capping film disposed on the cell conductive line, a plurality of fin-type patterns disposed at the substrate of the peripheral region, extending in the first direction, and being spaced apart from each other in the second direction, a plurality of fin trenches separating the plurality of fin-type patterns from each other and spaced apart from each other in the second direction, a peripheral gate electrode crossing the plurality of fin-type pattern, and a peripheral interlayer insulating film disposed on the peripheral gate electrode. An interval between two adjacent cell gate electrodes of the plurality of cell gate electrodes spaced apart from each other in the second direction is the same as an interval between two adjacent fin trenches of the plurality of fin trenches spaced apart from each other in the second direction.

According to still another aspect of the present disclosure, there is provided a method of fabricating a semiconductor device comprising forming a cell element separation film on a cell region of a substrate, the cell element separation film defining a cell active region in the cell region, forming a peripheral element separation film on a peripheral region of the substrate, the peripheral element separation film defining a peripheral active region in a peripheral region surrounding the cell active region, forming a cell gate trench extending in a first direction at the substrate of the cell region and a cell gate electrode in the cell gate trench, forming a fin trench extending in the first direction at the substrate of the peripheral region and a dummy gate electrode in the fin trench, the cell gate trench and the fin trench being simultaneously formed, the cell gate electrode and the dummy gate electrode being simultaneously formed, and the dummy gate electrode being formed at the substrate of the peripheral active region, removing the dummy gate electrode and then forming a pre-field insulating film in the fin trench, forming a fin-type pattern extending in the first direction by removing a portion of the pre-field insulating film and a portion of the peripheral element separation film, and forming a peripheral gate electrode on the fin-type pattern. The peripheral gate electrode crosses the fin-type pattern.

BRIEF DESCRIPTION OF THE DRAWINGS

The above and other aspects and features of the present disclosure will become more apparent by describing in detail exemplary embodiments thereof with reference to the attached drawings, in which:

FIGS. 23 to 56 are views for describing intermediate steps of a method for fabricating a semiconductor memory device according to some exemplary embodiments.

FIG. 57 shows a flowchart of fabricating a semiconductor memory device according to some exemplary embodiments.

DETAILED DESCRIPTION OF THE EMBODIMENTS

Figure 1:
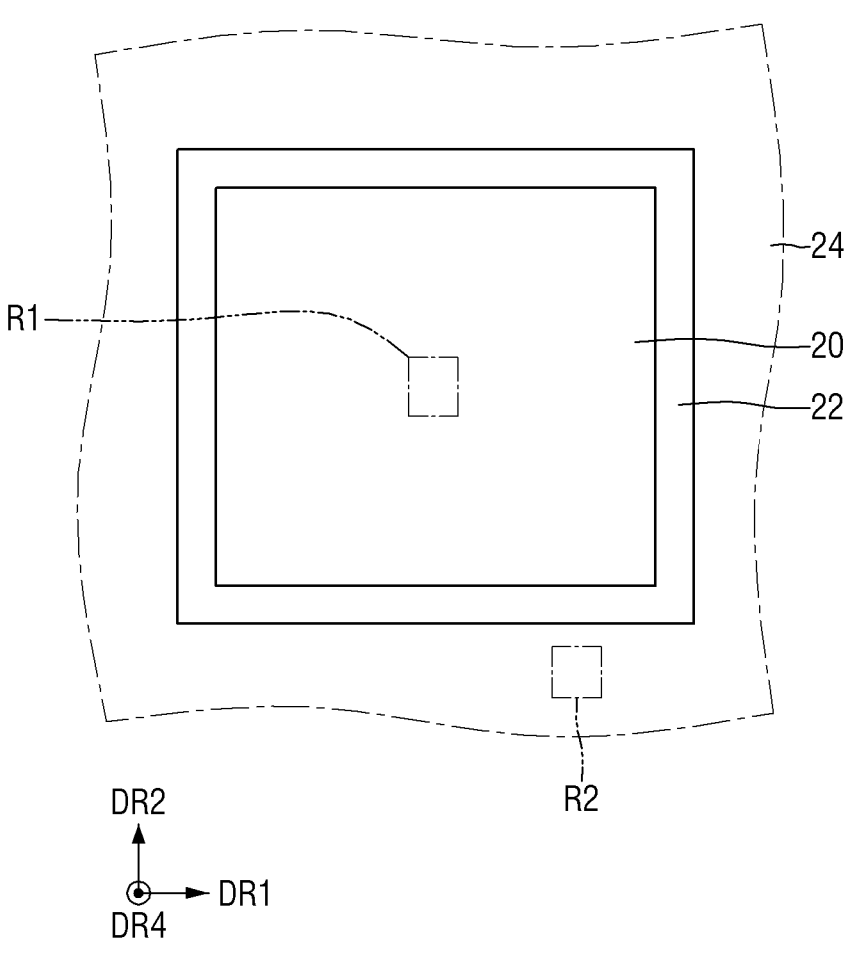
FIG. 1 is a schematic layout diagram of a semiconductor memory device according to some exemplary embodiments.
Figure 2:
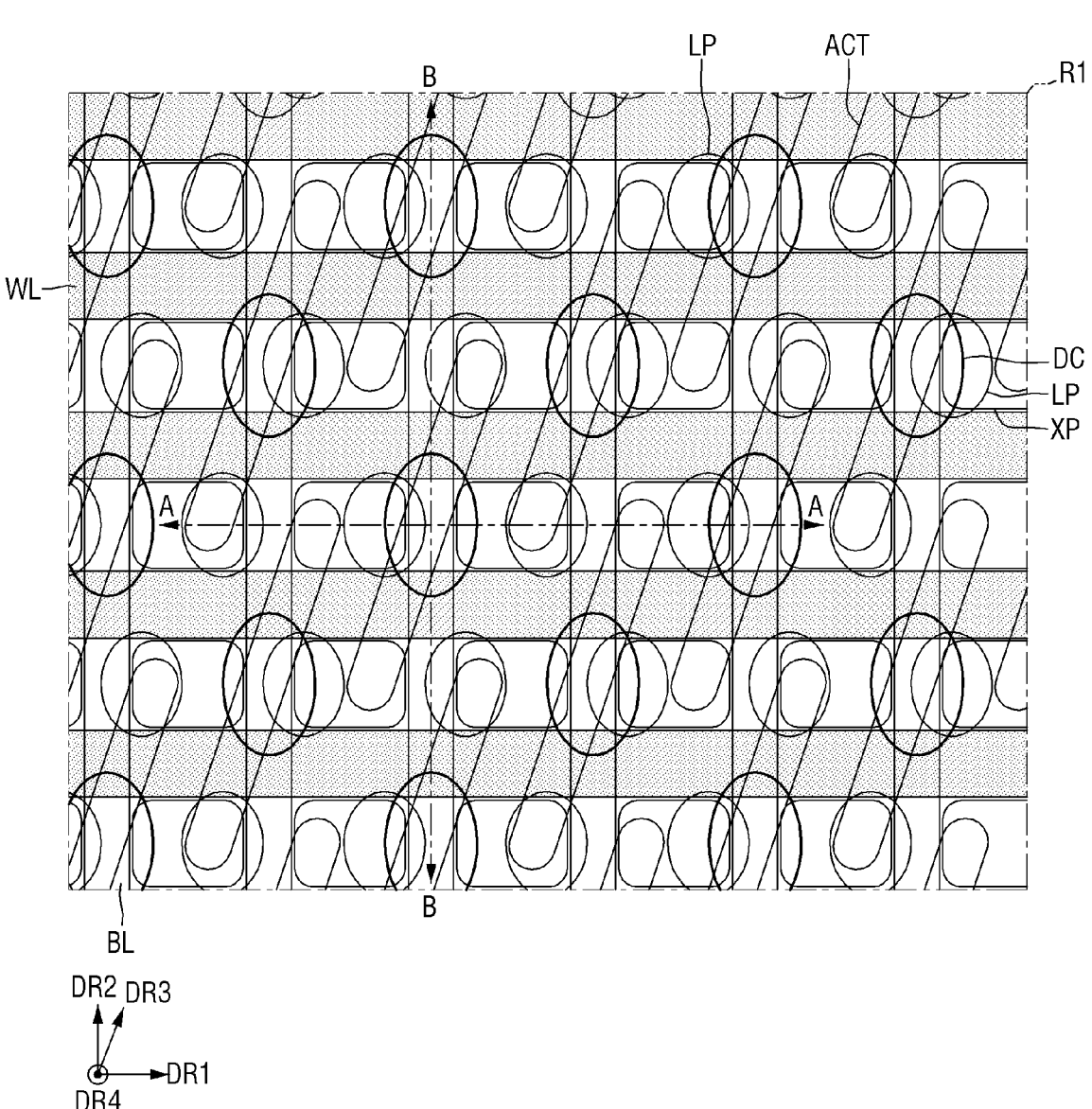
FIG. 2 is a schematic layout of region R1 of FIG. 1.
Figure 3:
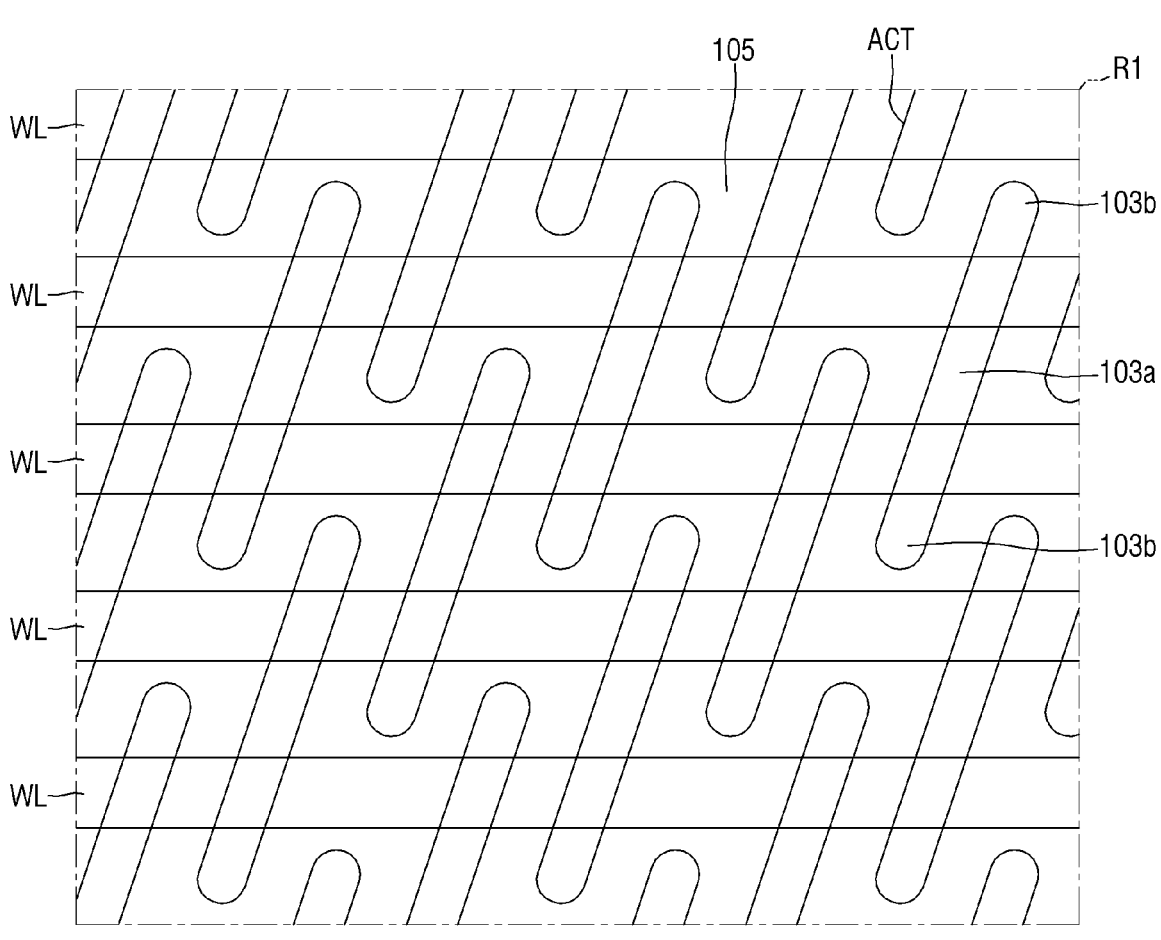
FIG. 3 is a layout diagram illustrating only a word line and an active region of FIG. 2.
Figure 3:
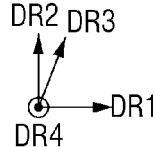
Figure 4:
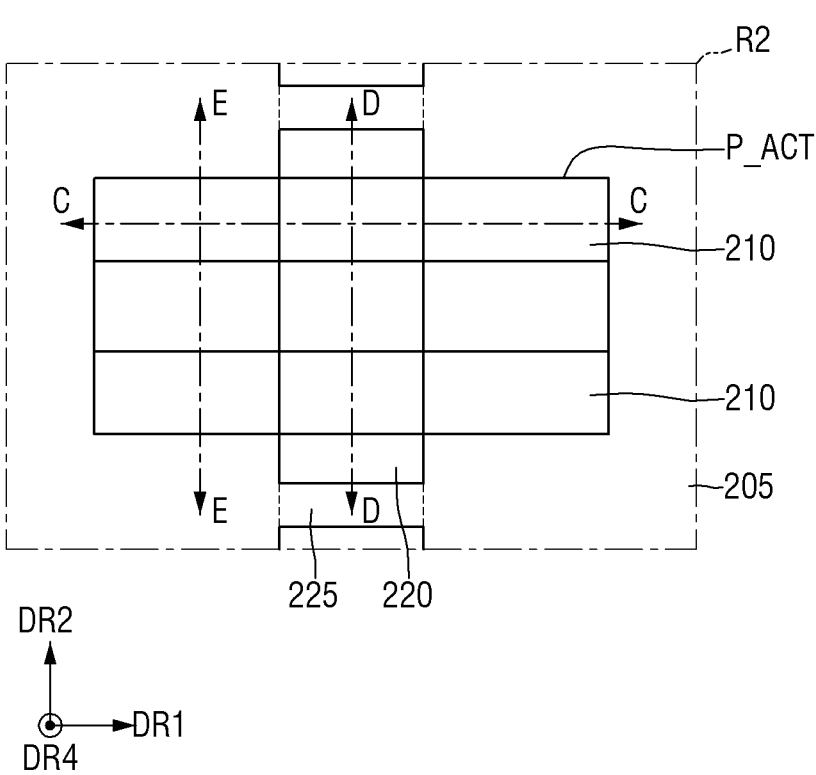
FIG. 4 is a schematic layout diagram of region R2 of FIG. 1.
Figure 5:
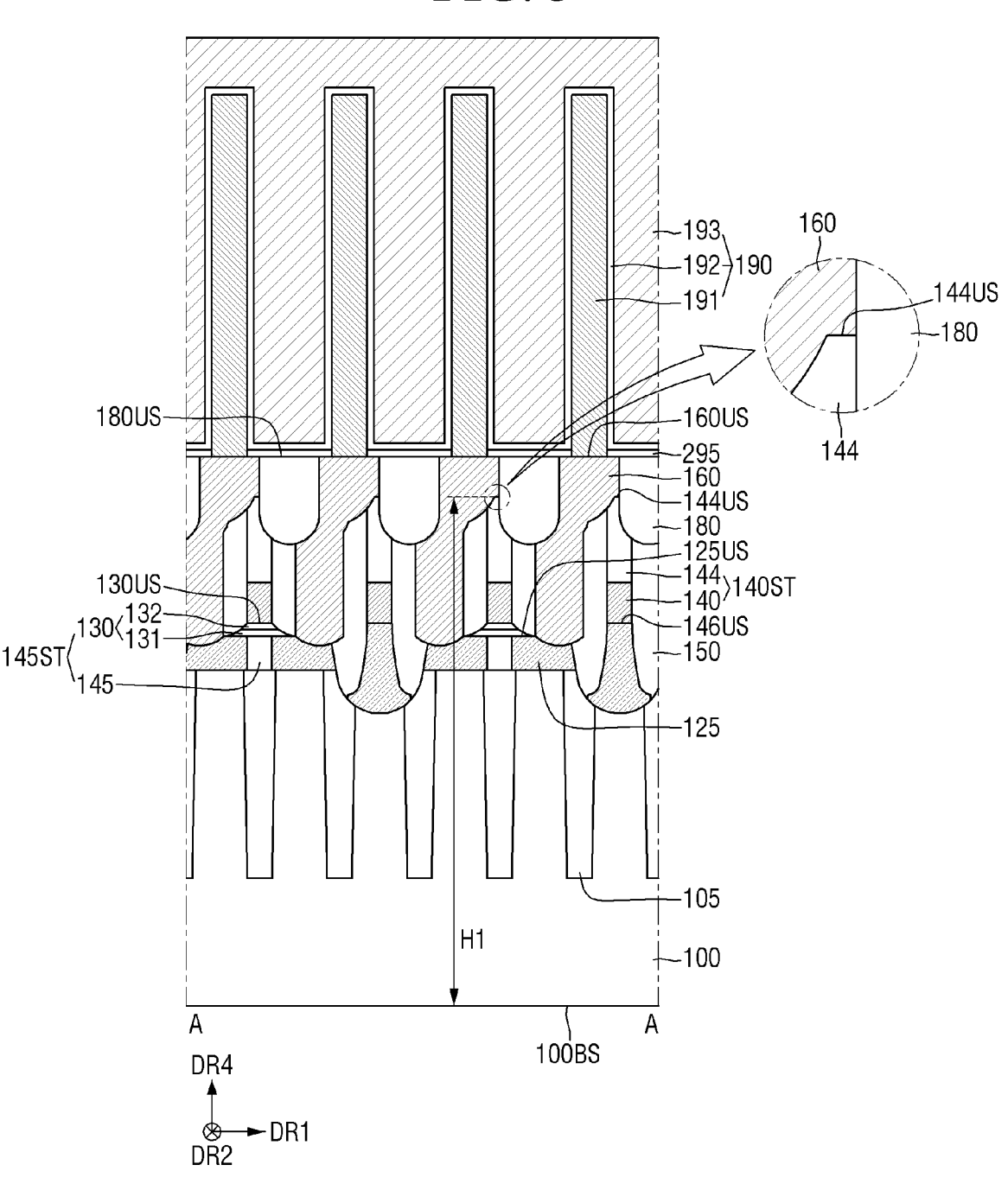
FIGS. 5 and 6 are illustrative cross-sectional views taken along line A-A and line B-B of FIG. 2, respectively.
Figure 6:
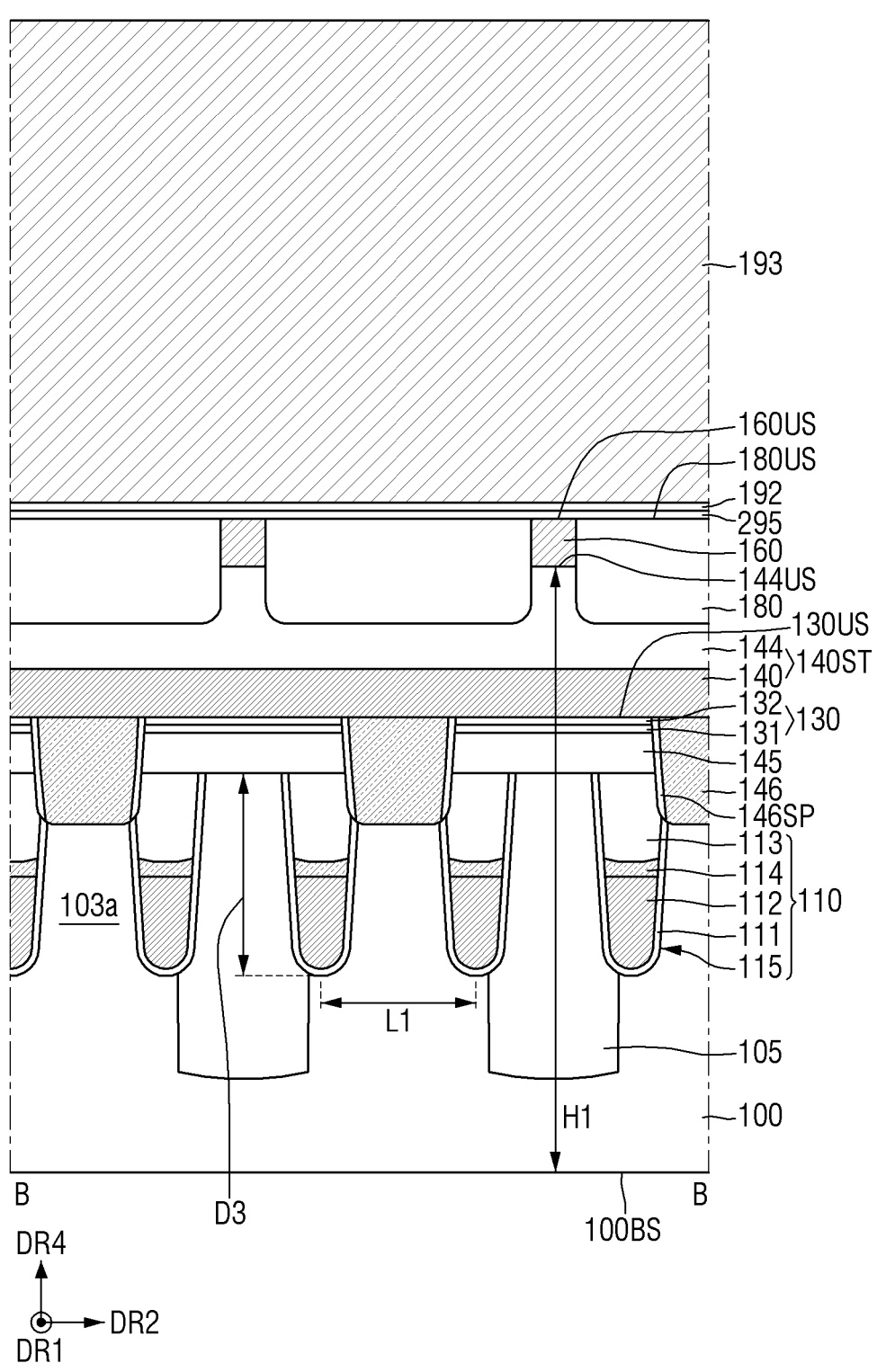
Figure 7:
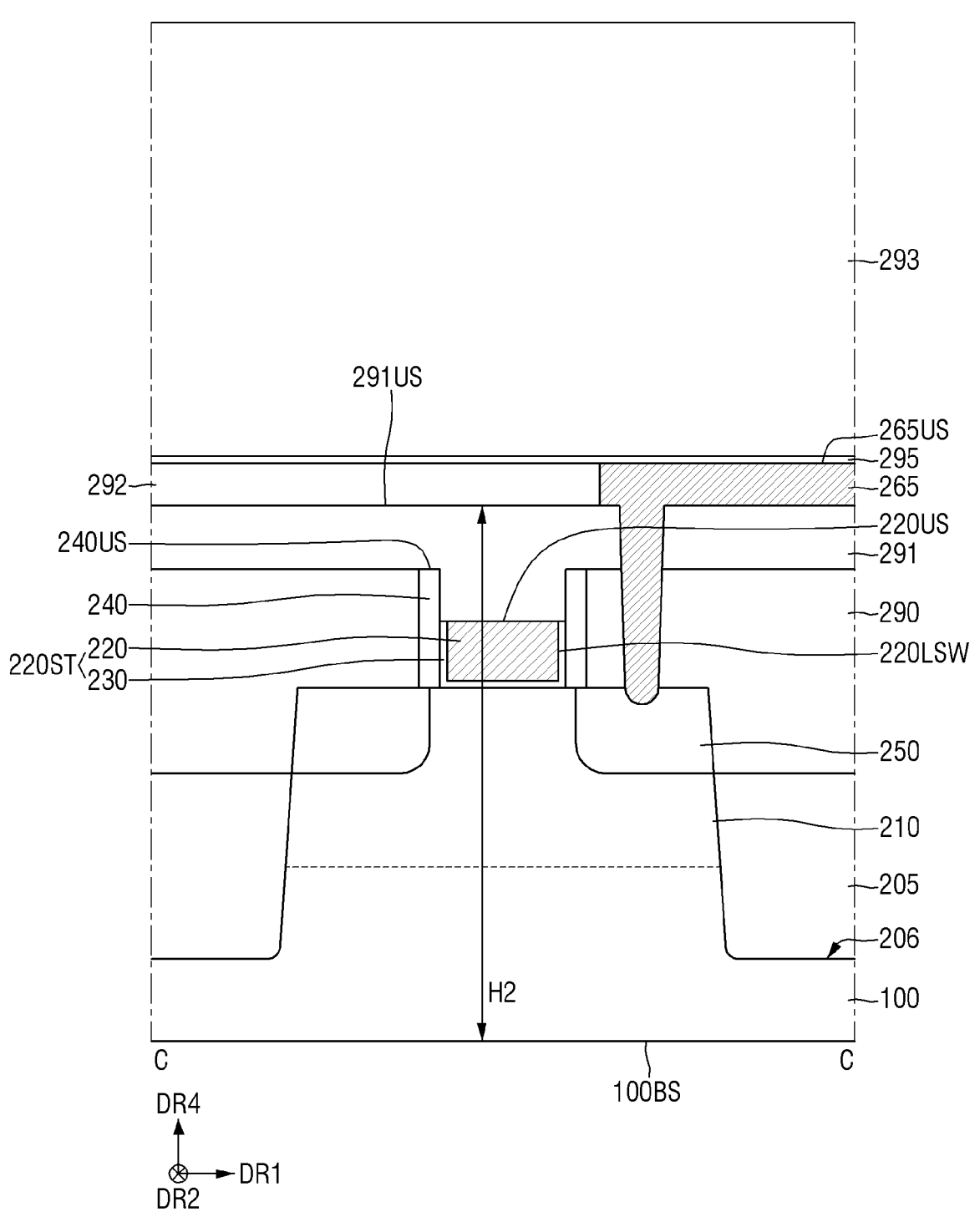
FIGS. 7 to 9 are illustrative cross-sectional views taken along line C-C, line D-D, and line E-E of FIG. 4, respectively.
Figure 8:
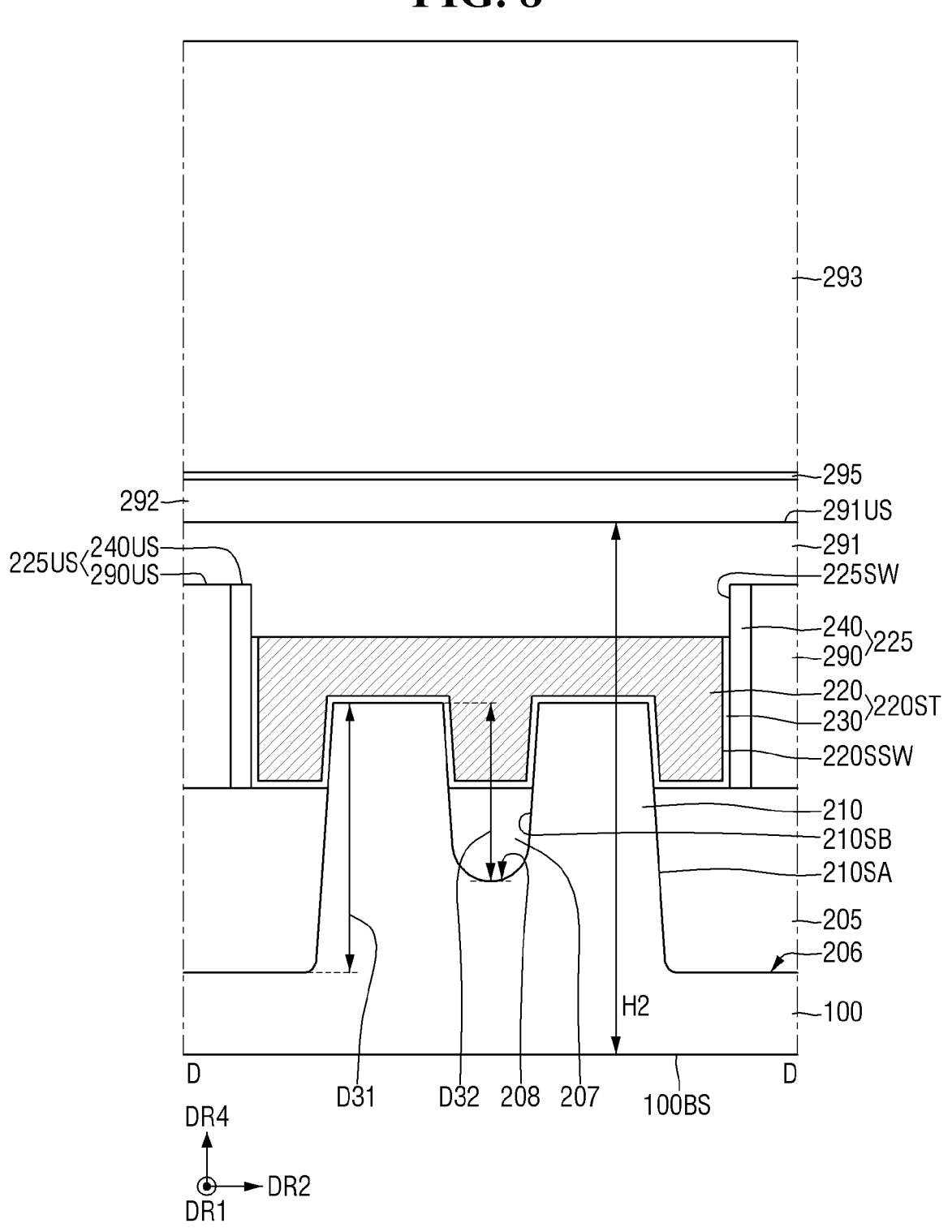
Figure 9:
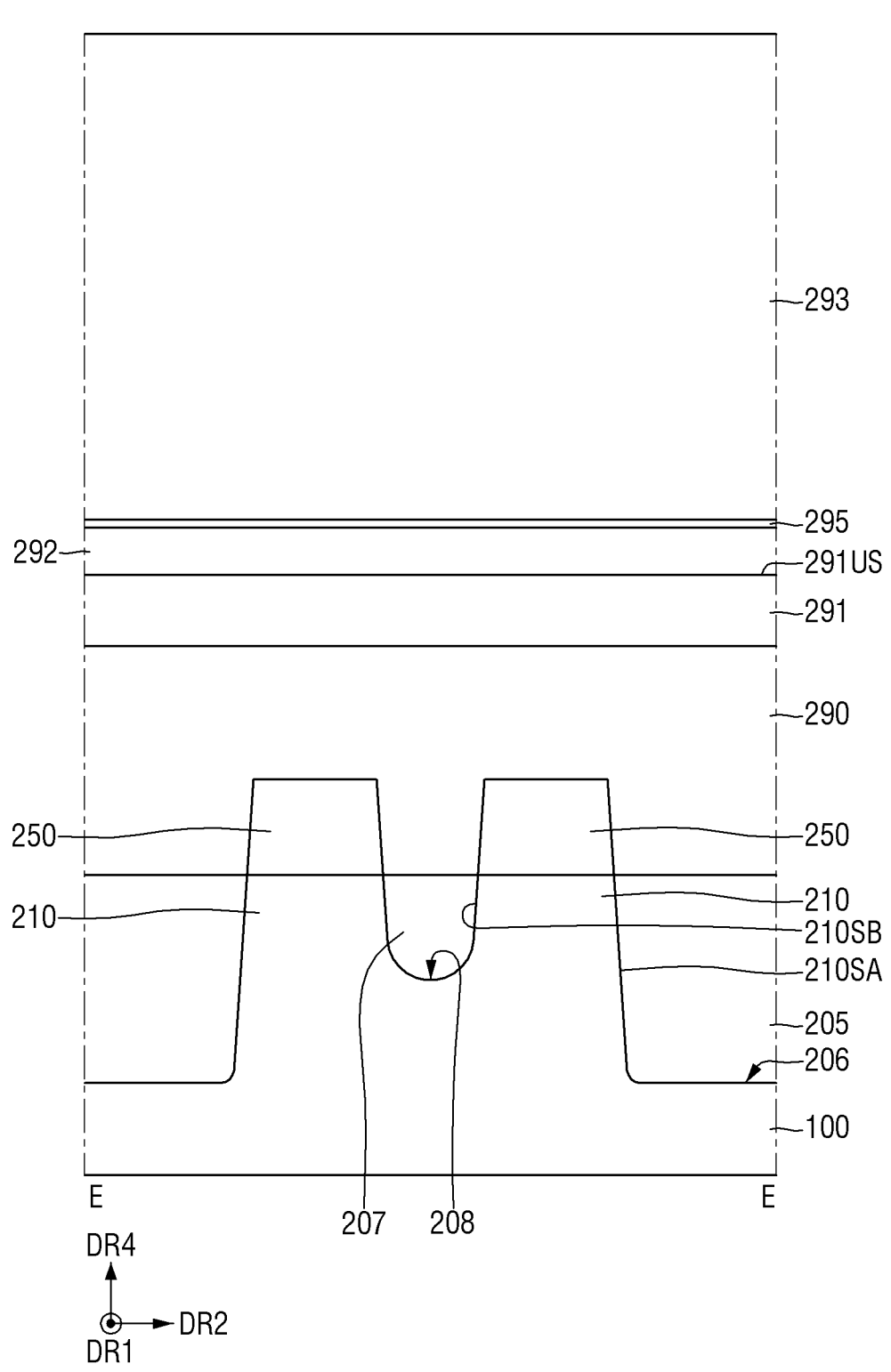

FIG. 1 is a schematic layout diagram of a semiconductor memory device according to some exemplary embodiments. FIG. 2 is a schematic layout of region R1 of FIG. 1. FIG. 3 is a layout diagram illustrating only a word line and an active region of FIG. 2. FIG. 4 is a schematic layout diagram of region R2 of FIG. 1. FIGS. 5 and 6 are illustrative cross-sectional views taken along line A-A and line B-B of FIG. 2, respectively. FIGS. 7 to 9 are illustrative cross-sectional views taken along line C-C, line D-D, and line E-E of FIG. 4, respectively.

In the drawings of a semiconductor memory device according to some exemplary embodiments, a dynamic random access memory (DRAM) is illustrated, but the present disclosure is not limited thereto.

Referring to FIGS. 1 to 4, a semiconductor memory device according to some exemplary embodiments may include a cell region 20, a cell region separation film 22, and a peripheral region 24.

The cell region separation film 22 may be formed along the perimeter of the cell region 20. The cell region separation film 22 may separate the cell region 20 and the peripheral region 24 from each other. The peripheral region 24 may be defined around the cell region 20.

The cell region 20 may include a plurality of cell active regions ACT. The cell active regions ACT may be defined by cell element separation films 105 formed in a substrate 100 (see FIG. 5). In accordance with a decrease in design rule of the semiconductor memory device, the cell active region ACT may be disposed in a bar shape of a diagonal line or an oblique line as illustrated in FIGS. 2 and 3. For example, the cell active region ACT may extend in a third direction DR3.

A plurality of gate electrodes extending in a first direction DR1 across the cell active region ACT may be disposed. The plurality of gate electrodes may extend in parallel with each other. The plurality of gate electrodes may be, for example, a plurality of word lines WL. The word lines WL may be arranged at equal intervals. A width of the word line WL or an interval between the word lines WL may be determined according to the design rule.

The word line WL may extend from the cell region 20 to the cell region separation film 22. A portion of the word line WL may overlap the cell region separation film 22 in a fourth direction DR4.

Each cell active region ACT may be divided into three portions by two word lines WL extending in the first direction DR1. The cell active region ACT may include storage connection regions 103b and a bit line connection region 103a. The bit line connection region 103a may be positioned at a central portion of the cell active region ACT, and the storage connection regions 103b may be positioned at end portions of the cell active region ACT.

The bit line connection region 103a may be a region connected to a bit line BL, and the storage connection region 103b may be a region connected to an information storage part 190 (see FIG. 5). In other words, the bit line connection region 103a may correspond to a common drain region, and the storage connection region 103b may correspond to a source region. Each word line WL and the bit line connection region 103a and the storage connection region 103b adjacent to each word line WL may constitute a transistor.

A plurality of bit lines BL extending in a second direction DR2 orthogonal to the word lines WL may be disposed on the word lines WL. The plurality of bit lines BL may extend in parallel with each other. The bit lines BL may be arranged at equal intervals. A width of the bit line BL or an interval between the bit lines BL may be determined according to the design rule.

The bit line BL may extend from the cell region 20 to the cell region separation film 22. A portion of the bit line BL may overlap the cell region separation film 22 in the fourth direction DR4. The fourth direction DR4 may be perpendicular to the first direction DR1, the second direction DR2, and the third direction DR3. The fourth direction DR4 may be a thickness direction of the substrate 100.

The semiconductor memory device according to some exemplary embodiments may include various contact arrangements formed on the cell active regions ACT. The various contact arrangements may include, for example, direct contacts DC, node pads XP, and landing pads LP, and the like.

The direct contact DC may refer to a contact electrically connecting the cell active region ACT to the bit line BL. The node pad XP may be a connection pad connecting the cell active region ACT to a lower electrode 191 (see FIG. 5) of a capacitor. Due to an arrangement structure, a contact area between the node pad XP and the cell active region ACT may be small. Accordingly, the landing pad LP having conductivity may be introduced in order to increase a contact area with the cell active region ACT and a contact area with the lower electrode 191 (see FIG. 5) of the capacitor. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The landing pad LP may be disposed between the node pad XP and the lower electrode 191 (see FIG. 5) of the capacitor. A contact resistance between the cell active region ACT and the lower electrode 191 of the capacitor may be decreased by increasing the contact area through the introduction of the landing pad LP.

The direct contact DC may be connected to the bit line connection region 103a. The node pads XP may be connected to the storage connection regions 103b. As the node pads XP are disposed at opposite portions of the cell active region ACT, the landing pad LP may be disposed to at least partially overlap the node pads XP at positions adjacent to opposite ends of the cell active region ACT. In other words, the node pad XP may be formed to overlap the cell active region ACT and the cell element separation film 105 (see FIG. 5) between adjacent word lines WL and adjacent bit lines BL.

The word line WL may be buried in the substrate 100. The word line WL may be disposed across the cell active region ACT between the direct contacts DC or the node pads XP. As illustrated in FIGS. 2 and 3, two word lines WL may be disposed to traverse one cell active region ACT. The cell active region ACT extends in the third direction DR3, and thus, the word line WL may have an angle less than 90° with respect to the cell active region ACT.

The direct contacts DC and the node pads XP may be symmetrically or periodically disposed on the cell region 20. For example, the direct contacts DC and the node pads XP may be disposed on a straight line along the first direction DR1 and the second direction DR2. Meanwhile, unlike the direct contacts DC and the node pads XP, the landing pads LP may be disposed in a zigzag shape in the second direction DR2 in which the bit lines BL extend. In addition, the landing pads LP may be disposed to overlap the same side portions of each bit line BL in the first direction DR1 in which the word lines WL extend. For example, each of the landing pads LP of a first line may overlap a left side surface of the corresponding bit line BL, and each of the landing pads LP of a second line may overlap a right side of the corresponding bit line BL.

The peripheral region 24 may include a peripheral active region P_ACT. The peripheral active region P_ACT may be defined by a peripheral element separation film 205 formed in a substrate 100 (see FIG. 7).

A plurality of fin-type active patterns 210 extending in the first direction DR1 may be disposed in the peripheral active region P_ACT. The fin-type active patterns 210 may be spaced apart from each other in the second direction DR2.

A peripheral gate electrode 220 may be disposed on the fin-type active patterns 210. The peripheral gate electrode 220 may cross the fin-type active patterns 210. The peripheral gate electrode 220 may extend in the second direction DR2.

Referring to FIGS. 1 to 9, the semiconductor memory device according to some exemplary embodiments includes a plurality of cell gate structures 110, a plurality of bit line structures 140ST, a plurality of node connection pads 125, a plurality of bit line contacts 146, the information storage part 190, the fin-type active pattern 210, and a peripheral gate structure 220ST.

The substrate 100 may include the cell region 20, the cell region separation film 22, and the peripheral region 24. The substrate 100 may be a silicon substrate or a silicon-on-insulator (SOI). In an embodiment, the substrate 100 may include or may be formed of silicon germanium, silicon germanium on insulator (SGOI), indium antimonide, a lead tellurium compound, indium arsenide, indium phosphide, gallium arsenide, or gallium antimonide, but is not limited thereto.

The plurality of cell gate structures 110, the plurality of bit line structures 140ST, the plurality of node connection pads 125, the plurality of bit line contacts 146, and the information storage part 190 may be disposed in the cell region 20. The fin-type active pattern 210 and the peripheral gate structure 220ST may be disposed in the peripheral region 24.

The cell element separation films 105 may be formed in the substrate 100 of the cell region 20. The cell element separation film 105 may have a shallow trench separation (STI) structure having excellent element separation characteristics. The cell element separation film 105 may define the cell active region ACT in the cell region 20. The cell active region ACT defined by the cell element separation film 105 may have a long island shape including a short axis and a long axis as illustrated in FIGS. 2 and 3. The cell active region ACT may have a diagonal line or oblique line shape so as to have an angle less than 90° with respect to the word line WL formed in the cell element separation film 105. In addition, the cell active region ACT may have a diagonal line or oblique shape so as to have an angle less than 90° with respect to the bit line BL formed on the cell element separation film 105.

A cell boundary separation film having an STI structure may be formed in the cell region separation film 22. The cell region 20 may be defined by the cell region separation film 22.

The peripheral element separation film 205 may have an STI structure. The peripheral element separation film 205 may define the peripheral active region P_ACT. The peripheral element separation film 205 may fill a peripheral separation trench 206 formed in the substrate 100. The peripheral separation trench 206 may be disposed at the perimeter of the peripheral active region P_ACT.

Each of the cell element separation film 105, the peripheral element separation film 205, and the cell region separation film 22 may include or may be formed of, for example, at least one of a silicon oxide film, a silicon nitride film, and a silicon oxynitride film, but is not limited thereto. It has been illustrated in FIGS. 5 to 9 that each of the cell element separation film 105 and the peripheral element separation film 205 is formed as a single insulating film, but this is only for convenience of explanation and the present disclosure is not limited thereto. Depending on widths of the cell element separation film 105 and the peripheral element separation film 205, each of the cell element separation film 105 and the peripheral element separation film 205 may be formed as a signal insulating film or be formed as a plurality of insulating films.

It has been illustrated in FIGS. 6 and 8 that an upper surface of the cell element separation film 105 and an upper surface of the substrate 100 are disposed on the same plane, but this is only for convenience of explanation and the present disclosure is not limited thereto.

The cell gate structure 110 may be formed in the substrate 100 and the cell element separation film 105. The cell gate structure 110 may be formed across the cell element separation film 105 and the cell active region ACT defined by the cell element separation film 105.

The cell gate structure 110 may include a cell gate trench 115, a cell gate insulating film 111, a cell gate electrode 112, a cell gate capping pattern 113, and a cell gate capping conductive film 114 that are formed in the substrate 100 and the cell element separation film 105. Here, the cell gate electrode 112 may correspond to the word line WL. Unlike illustrated in FIG. 6, the cell gate structure 110 may not include the cell gate capping conductive film 114.

Although not illustrated, the cell gate trench 115 may be relatively deep in the cell element separation film 105 and be relatively shallow in the cell active regions ACT. A bottom surface of the word line WL may be curved. That is, a depth of the cell gate trench 115 in the cell element separation film 105 may be greater than a depth of the cell gate trench 115 in the cell active region ACT.

The cell gate trenches 115 may be spaced apart from each other by a first interval L1 and be disposed in the second direction DR2. That is, an interval between the cell gate trenches 115 adjacent to each other in the second direction DR2 is the first interval L1.

The cell gate insulating film 111 may extend along sidewalls and a bottom surface of the cell gate trench 115. The cell gate insulating film 111 may extend along a profile of at least a portion of the cell gate trench 115. The cell gate insulating film 111 may include or may be formed of, for example, at least one of silicon oxide, silicon nitride, silicon oxynitride, and a high-k material having a dielectric constant higher than that of silicon oxide. The high-k material may be, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The cell gate electrode 112 may be disposed on the cell gate insulating film 111. The cell gate electrode 112 may fill a portion of the cell gate trench 115. The cell gate capping conductive film 114 may extend along an upper surface of the cell gate electrode 112. Since the cell gate electrode 112 is disposed in the cell gate trench 115, an interval between the cell gate electrodes 112 adjacent to each other in the second direction DR2 is the first interval L1.

The cell gate electrode 112 may include or may be formed of at least one of metal, a metal alloy, conductive metal nitride, conductive metal carbonitride, conductive metal carbide, metal silicide, a doped semiconductor material, conductive metal oxynitride, and conductive metal oxide. The cell gate electrode 112 may include or may be formed of, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof, but is not limited thereto. The cell gate capping conductive film 114 may include or may be formed of, for example, polysilicon or polysilicon-germanium, but is not limited thereto.

The cell gate capping pattern 113 may be disposed on the cell gate electrode 112 and the cell gate capping conductive film 114. The cell gate capping pattern 113 may fill the cell gate trench 115 remaining after the cell gate electrode 112 and the cell gate capping conductive film 114 are formed. It has been illustrated in FIG. 6 that the cell gate insulating film 111 extends along sidewalls of the cell gate capping pattern 113, but the present disclosure is not limited thereto. The cell gate capping pattern 113 may include or may be formed of, for example, at least one of silicon nitride (SiN), silicon oxynitride (SiON), silicon oxide (SiO$_2$), silicon carbonitride (SiCN), silicon oxycarbonitride (SiOCN), and combinations thereof.

It has been illustrated in FIG. 6 that an upper surface of the cell gate capping pattern 113 is disposed on the same plane as the upper surface of the cell element separation film 105, but the present disclosure is not limited thereto.

Although not illustrated, an impurity doped region may be formed on at least one side of the cell gate structure 110. The impurity doped region may be a source/drain region of a transistor. The impurity doped region may be formed in the storage connection region 103b and the bit line connection region 103a of FIG. 3.

The bit line structure 140ST may include a cell conductive line 140 and a cell line capping film 144. The cell conductive line 140 may be formed on the substrate 100 in which the cell gate structure 110 is formed and the cell element separation film 105. The cell conductive line 140 may cross the cell element separation film 105 and the cell active region ACT defined by the cell element separation film 105. The cell conductive line 140 may be formed to cross the cell gate structure 110. Here, the cell conductive line 140 may correspond to the bit line BL.

The cell conductive line 140 may include or may be formed of, for example, at least one of a semiconductor material doped with impurities, a conductive silicide compound, conductive metal nitride, a two-dimensional (2D) material, a metal, and a metal alloy. In the semiconductor memory device according to some exemplary embodiments, the 2D material may be a metallic material and/or a semiconductor material. The 2D material may be a 2D allotrope or a 2D compound, and may include or may be, for example, at least one of graphene, molybdenum disulfide (MoS$_2$), molybdenum diselenide (MoSe$_2$), tungsten diselenide (WSe$_2$), and tungsten disulfide (WS$_2$), but is not limited thereto. That is, the above-described 2D materials have been enumerated as an example, and thus, the 2D material that may be included in the semiconductor memory device according to the present disclosure is not limited by the above-described materials.

It has been illustrated in FIGS. 5 and 6 that the cell conductive line 140 is a single film, but this is only for convenience of explanation and the present disclosure is not limited thereto. That is, unlike illustrated in FIGS. 5 and 6, the cell conductive line 140 may include a plurality of conductive films on which conductive materials are stacked.

The cell line capping film 144 may be disposed on the cell conductive line 140. The cell line capping film 144 may extend in the second direction DR2 along an upper surface of the cell conductive line 140. The cell line capping film 144 may include or may be formed of, for example, at least one of silicon nitride, silicon oxynitride, silicon carbonitride, and silicon oxycarbonitride. In the semiconductor memory device according to some exemplary embodiments, the cell line capping film 144 may include or may be a silicon nitride film. It has been illustrated in FIGS. 5 and 6 that the cell line capping film 144 is a single film, but the present disclosure is not limited thereto.

The bit line contact 146 may be formed between the cell conductive line 140 and the substrate 100. The cell conductive line 140 may be formed on the bit line contact 146. The bit line contact 146 may be formed between the bit line connection region 103a of the cell active region ACT and the cell conductive line 140. The bit line contact 146 may be connected to the bit line connection region 103a.

When viewed in a plan view, the bit line contact 146 may have a circular or elliptical shape. When viewed in a plan view, an area of the bit line contact 146 may be greater than an area in which the bit line connection region 103a and one cell conductive line 140 overlap each other. When viewed in a plan view, an area of the bit line contact 146 in plan view may be greater than an area of one bit line connection region 103a.

The bit line contact 146 may include an upper surface 146US connected to the cell conductive line 140. As the bit line contact 146 becomes distant from the upper surface 146US of the bit line contact 146, the bit line contact 146 may include a portion in which a width of the bit line contact 146 in the first direction DR1 increases.

The bit line contact 146 may electrically connect the cell conductive line 140 and the substrate 100 to each other. Here, the bit line contact 146 may correspond to the direct contact DC. The bit line contact 146 may include or may be formed of, for example, at least one of a semiconductor material doped with impurities, a conductive silicide compound, conductive metal nitride, metal, and a metal alloy.

The node connection pad 125 may be disposed on the substrate 100. The node connection pad 125 may be disposed on the storage connection region 103b of the cell active region ACT. The node connection pad 125 may be connected to the storage connection region 103b. For example, the node connection pad 125 may contact the storage connection region 103b of the cell active region ACT.

The node connection pad 125 may be disposed between the cell conductive lines 140 adjacent to each other in the first direction DR1. Although not illustrated, the node connection pad 125 may be disposed between the cell gate electrodes 112 adjacent to each other in the second direction DR2.

Based on the upper surface of the cell element separation film 105, an upper surface 125US of the node connection pad is lower than the upper surface 146US of the bit line contact. Based on the upper surface of the cell element separation film 105, the upper surface 125US of the node connection pad is lower than a lower surface of the cell conductive line 140.

The node connection pad 125 may electrically connect the information storage part 190 and the substrate 100 to each other. For example, the storage connection region 103b of the cell active region ACT may be connected to the lower electrode 191 of the information storage part 190 via the node connection pad 125 and a storage pad 160. The storage pad 160 will be described later. Here, the node connection pad 125 may correspond to the node pad XP. The node connection pad 125 may include or may be formed of, for example, at least one of a semiconductor material doped with impurities, a conductive silicide compound, conductive metal nitride, a metal, and a metal alloy.

A pad separation structure 145ST may space the node connection pads 125 adjacent to each other in the first direction DR1 apart from each other. Although not illustrated, the pad separation structure 145ST may space the node connection pads 125 adjacent to each other in the second direction DR2 apart from each other. The pad separation structure 145ST covers the upper surface 125US of the node connection pad.

The pad separation structure 145ST may include a pad separation pattern 145 and an upper cell insulating film 130. The upper cell insulating film 130 may be disposed on the pad separation pattern 145.

When the node connection pad 125 includes a first node connection pad and a second node connection pad spaced apart from each other in the first direction DR1, the pad separation pattern 145 may separate the first node connection pad and the second node connection pad from each other in the first direction DR1. Although not illustrated, the pad separation pattern 145 may also separate the node connection pads 125 adjacent to each other in the second direction DR2 from each other.

The upper cell insulating film 130 covers the upper surface 125US of the node connection pad. When the node connection pad 125 includes the first node connection pad and the second node connection pad spaced apart from each other in the first direction DR1, the upper cell insulating film 130 may cover an upper surface of the first node connection pad and an upper surface of the second node connection pad. An upper surface 130US of the upper cell insulating film may be disposed on the same plane as the upper surface 146US of the bit line contact. That is, based on the upper surface of the cell element separation film 105, a height of the upper surface 130US of the upper cell insulating film may be the same as a height of the upper surface 146US of the bit line contact.

The pad separation pattern 145 and the upper cell insulating film 130 may be disposed between the bit line contacts 146 adjacent to each other in the second direction DR2. The cell conductive line 140 may be disposed on an upper surface of the pad separation structure 145ST. The cell conductive line 140 may be disposed on the upper surface 130US of the upper cell insulating film. The upper surface of the pad separation structure 145ST may be the upper surface 130US of the upper cell insulating film.

A bit line contact spacer 146SP may be disposed between the bit line contact 146 and the pad separation pattern 145. In FIG. 5, the bit line contact spacers 146SP are not illustrated. As an example, the bit line contact spacer 146SP may be included in a cell line spacer 150 to be described later. As another example, while the bit line contact 146 is formed, the bit line contact spacer 146SP that may be seen in a cross section as illustrated in FIG. 5 may be removed. The bit line contact spacer 146SP may include or may be formed of, for example, at least one of silicon nitride (SiN), silicon oxynitride (SiON), and silicon oxide (SiO$_2$).

The pad separation pattern 145 may include or may be formed of, for example, at least one of silicon nitride (SiN), silicon oxynitride (SiON), silicon oxide (SiO$_2$), silicon carbonitride (SiCN), silicon oxycarbonitride (SiOCN), and combinations thereof. The upper cell insulating film 130 may be a single film, but as illustrated in FIGS. 5 and 6, the upper cell insulating film 130 may be multiple films including a first upper cell insulating film 131 and a second upper cell insulating film 132. For example, the first upper cell insulating film 131 may include or may be a silicon oxide film, and the second upper cell insulating film 132 may include or may be a silicon nitride film, but the present disclosure is not limited thereto. It has been illustrated in FIG. 5 that a width of the upper cell insulating film 130 in the first direction DR1 decreases as the upper cell insulating film 130 becomes distant from the substrate 100, but the present disclosure is not limited thereto.

The cell line spacer 150 may be disposed on sidewalls of the cell conductive line 140 and the cell line capping film 144. In a portion of the cell conductive line 140 where the bit line contact 146 is formed, the cell line spacer 150 may be disposed on sidewalls of the cell conductive line 140, the cell line capping film 144, and the bit line contact 146. In the other portion of the cell conductive line 140 where the bit line contact 146 is not formed, the cell line spacer 150 may be disposed on the upper cell insulating film 130.

It has been illustrated in FIG. 5 that the cell line spacer 150 is a single film, but this is only for convenience of explanation and the present disclosure is not limited thereto. That is, unlike illustrated in FIG. 5, the cell line spacer 150 may have a multiple-film structure. The cell line spacer 150 may include or may be, for example, one of a silicon oxide film, a silicon nitride film, a silicon oxynitride film (SiON), a silicon oxycarbonitride film (SiOCN), air, and combinations thereof, but is limited thereto.

A storage pad 160 may be disposed on each node connection pad 125. The storage pad 160 may be electrically connected to the node connection pad 125. The storage pad 160 may be connected to the storage connection region 103b of the cell active region ACT. Here, the storage pad 160 may correspond to the landing pad LP.

In the semiconductor memory device according to some exemplary embodiments, the storage pad 160 may extend to the node connection pad 125 to be connected to the node connection pad 125. The storage pad 160 may overlap a portion of an upper surface of the bit line structure 140ST. The storage pad 160 may include or may be formed of, for example, at least one of a semiconductor material doped with impurities, a conductive silicide compound, conductive metal nitride, conductive metal carbide, a metal, and a metal alloy.

A pad separation insulating film 180 may be formed on the storage pad 160 and the bit line structure 140ST. For example, the pad separation insulating film 180 may be disposed on the cell line capping film 144. The pad separation insulating film 180 may define the storage pad 160 forming a plurality of isolation regions. The pad separation insulating film 180 may not cover an upper surface 160US of the storage pad. The pad separation insulating film 180 may fill a pad separation recess. The pad separation recess may separate adjacent storage pads 160 from each other. For example, the upper surface 160US of the storage pad may be disposed on the same plane as an upper surface 180US of the pad separation insulating film.

The pad separation insulating film 180 may include or may be formed of an insulating material and may electrically separate a plurality of storage pads 160 from each other. For example, the pad separation insulating film 180 may include or may be at least one of a silicon oxide film, a silicon nitride film, a silicon oxynitride film, a silicon oxycarbonitride film, and a silicon carbonitride film, but is not limited thereto.

The plurality of fin-type active patterns 210 may be disposed on the substrate 100 of the peripheral region 24. The fin-type active patterns 210 may protrude from the substrate 100, more specifically, the peripheral active region P_ACT in the fourth direction DR4.

The fin-type active patterns 210 may extend in the first direction DR1. The fin-type active patterns 210 may be spaced apart from each other in the second direction DR2. That is, the plurality of fin-type active patterns 210 may be spaced apart from each other in the second direction DR2 and be arranged in the second direction DR2.

The fin-type active pattern 210 may be defined by a peripheral separation trench 206 and a fin trench 208 extending in the first direction DR1. In the semiconductor memory device according to some exemplary embodiments, the plurality of fin-type active patterns 210 may include two fin-type active patterns 210 separated from each other by one fin trench 208. One fin trench 208 may be disposed in one peripheral active region P_ACT. The fin trench 208 may separate the fin-type active patterns 210 adjacent to each other in the second direction DR2 from each other.

Each fin-type active pattern 210 may include a first sidewall 210SA defined by the peripheral separation trench 206 and a second sidewall 210SB defined by the fin trench 208. In one fin-type active pattern 210, the first sidewall 210SA of the fin-type active pattern and the second sidewall 210SB of the fin-type active pattern may be opposite to each other in the second direction DR2. Each of the first sidewall 210SA of the fin-type active pattern and the second sidewall 210SB of the fin-type active pattern may extend in the first direction DR1.

Based on an upper surface of the fin-type active pattern 210, a depth D31 of the peripheral separation trench 206 is different from a depth D32 of the fin trench 208. In other words, a height D31 of the first sidewall 210SA of the fin-type active pattern 210 is different from a height D32 of the second sidewall 210SB of the fin-type active pattern. For example, based on the upper surface of the fin-type active pattern 210, the depth D31 of the peripheral separation trench 206 is greater than the depth D32 of the fin trench 208. The height D31 of the first sidewall 210SA of the fin-type active pattern is greater than the height D32 of the second sidewall 210SB of the fin-type active pattern. In an embodiment, two adjacent fin-type active patterns 210 may have lower portions that are connected with each other side by side, and the second sidewall 210SB, inner sidewall, of the two adjacent fin-type active patterns 210 has a shorter height than a height of first sidewall 210SA, outer sidewall, of the two adjacent fin-type active patterns 210.

A peripheral field insulating film 207 may be disposed on the substrate 100 of the peripheral region 24. The peripheral field insulating film 207 may fill a portion of the fin trench 208.

The peripheral field insulating film 207 may cover a portion of the second sidewall 210SB of the fin-type active pattern. The peripheral element separation film 205 may cover a portion of the first sidewall 210SA of the fin-type active pattern. Each fin-type active pattern 210 may protrude above an upper surface of the peripheral field insulating film 207 and an upper surface of the peripheral element separation film 205.

The peripheral field insulating film 207 may include or may be formed of, for example, an oxide film, a nitride film, an oxynitride film, or combinations thereof, but is not limited thereto.

The peripheral gate structure 220ST may be disposed on the plurality of fin-type active patterns 210. The peripheral gate structure 220ST may cross the plurality of fin-type active patterns 210. The peripheral gate structure 220ST may be disposed on the peripheral element separation film 205 and the peripheral field insulating film 207.

The peripheral gate structure 220ST may include a peripheral gate electrode 220 and a peripheral gate insulating film 230.

The peripheral gate electrode 220 may be disposed on the fin-type active patterns 210 and may cross the fin-type active patterns 210. The peripheral gate electrode 220 may surround the fin-type active patterns 210 protruding above the upper surface of the peripheral field insulating film 207 and the upper surface of the peripheral element separation film 205.

The peripheral gate electrode 220 may extend in the second direction DR2. The peripheral gate electrode 220 may include a first sidewall 220SSW extending in the first direction DR1 and a second sidewall 220LSW extending in the second direction DR2.

The peripheral gate electrode 220 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Tr), osmium (Os), silver (Ag), gold (Au), zinc (Zn), vanadium (V), and combinations thereof. The peripheral gate electrode 220 may include or may be formed of conductive metal oxide, conductive metal oxynitride, or the like, and may include an oxidized form of the above-described material as a material of peripheral gate electrode 220.

The peripheral gate insulating film 230 may extend along a bottom surface of the peripheral gate electrode 220, the first sidewall 220SSW of the peripheral gate electrode, and the second sidewall 220LSW of the peripheral gate electrode. The peripheral gate insulating film 230 may be formed on the fin-type active pattern 210, the peripheral element separation film 205, and the peripheral field insulating film 207. The peripheral gate insulating film 230 may be disposed between the fin-type active pattern 210 and the peripheral gate electrode 220.

The peripheral gate insulating film 230 may be formed along a profile of the fin-type active pattern 210 protruding above the upper surface of the peripheral field insulating film 207 and the upper surface of the peripheral element separation film 205, the upper surface of the peripheral field insulating film 207, and the peripheral element separation film 205. Although not illustrated, the peripheral gate insulating film 230 may further include an interface film.

The peripheral gate insulating film 230 may include or may be formed of silicon oxide, silicon oxynitride, silicon nitride, or a high-k material having a dielectric constant greater than that of the silicon oxide.

The semiconductor memory device according to some exemplary embodiments may include a negative capacitance (NC) field effect transistor (FET) using a negative capacitor. For example, the peripheral gate insulating film 230 may include or may be formed of a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected to each other in series and capacitances of respective capacitors have a positive value, a total capacitance decreases as compared with a capacitance of each individual capacitor. On the other hand, when at least one of capacitances of two or more capacitors connected to each other in series has a negative value, a total capacitance may have a positive value and be greater than an absolute value of each individual capacitance.

When the ferroelectric material film having the negative capacitance and the paraelectric material film having the positive capacitance are connected to each other in series, a total capacitance value of the ferroelectric material film and the paraelectric material film connected to each other in series may increase. A transistor including the ferroelectric material film may have a subthreshold swing (SS) less than 60 mV/decade at room temperature using the increase in the total capacitance value.

The ferroelectric material film may have the ferroelectric characteristics. The ferroelectric material film may include or may be formed of, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include or may be at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may change depending on a type of ferroelectric material included in the ferroelectric material film.

When the ferroelectric material film includes or is formed of hafnium oxide, the dopant included in the ferroelectric material film may include or may be, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, a ratio of the dopant may be a ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have the paraelectric characteristics. The paraelectric material film may include or may be formed of, for example, at least one of silicon oxide and metal oxide having a high dielectric constant. The metal oxide included in the paraelectric material film may include, for example, at least one of hafnium oxide, zirconium oxide, and aluminum oxide, but is not limited thereto.

The ferroelectric material film and the paraelectric material film may include or may be formed of the same material. The ferroelectric material film may have the ferroelectric characteristics, but the paraelectric material film may not have the ferroelectric characteristics. For example, when each of the ferroelectric material film and the paraelectric material film includes or is formed of hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm, but is not limited thereto. Since a critical thickness representing the ferroelectric characteristics may change for each ferroelectric material, the thickness of the ferroelectric material film may change depending on a ferroelectric material.

As an example, the peripheral gate insulating film 230 may include or may be one ferroelectric material film or a single ferroelectric material film. As another example, the peripheral gate insulating film 230 may include or may be formed of a plurality of ferroelectric material films spaced apart from each other. The peripheral gate insulating film 230 may have a stacked film structure in which a plurality of ferroelectric material films and a plurality of paraelectric material films are alternately stacked.

A peripheral gate spacer 240 may be disposed on the first sidewall 220SSW of the peripheral gate electrode and the second sidewall 220LSW of the peripheral gate electrode. An upper surface 240US of the peripheral gate spacer is higher than an upper surface 220US of the peripheral gate electrode. That is, based on the upper surface of the fin-type active pattern 210, a height of the upper surface 240US of the peripheral gate spacer is greater than a height of the upper surface 220US of the peripheral gate electrode.

The peripheral gate insulating film 230 may extend between the peripheral gate electrode 220 and the peripheral gate spacer 240. The peripheral gate insulating film 230 may extend along a sidewall of the peripheral gate spacer 240.

The peripheral gate spacer 240 may include or may be formed of, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations thereof.

Peripheral source/drain regions 250 may be disposed on both sides of the peripheral gate electrode 220. In the semiconductor memory device according to some exemplary embodiments, the peripheral source/drain regions 250 may be portions of the fin-type active pattern 210 doped with p-type or n-type impurities. That is, portions of the fin-type active pattern 210 doped with p-type or n-type impurities may be the peripheral source/drain regions 250.

A lower peripheral interlayer insulating film 290 may cover the peripheral source/drain regions 250. The lower peripheral interlayer insulating film 290 may cover the peripheral element separation film 205 and the peripheral field insulating film 207. The lower peripheral interlayer insulating film 290 may cover a sidewall of the peripheral gate spacers 240. The lower peripheral interlayer insulating film 290 does not cover the upper surface 240US of the peripheral gate spacer. An upper surface 290US of the lower peripheral interlayer insulating film may be disposed on the same plane as the upper surface 240US of the peripheral gate spacer.

The lower peripheral interlayer insulating film 290 may include or may be formed of, for example, an oxide-based insulating material.

A peripheral gate separation pattern 225 may separate the peripheral gate structures 220ST adjacent to each other in the second direction DR2 from each other. In the semiconductor memory device according to some exemplary embodiments, the peripheral gate separation pattern 225 may include the peripheral gate spacer 240 disposed on the first sidewall 220SSW of the peripheral gate electrode and the lower peripheral interlayer insulating film 290.

The upper surface 225US of the peripheral gate separation pattern includes the upper surface 240US of the peripheral gate spacer and the upper surface 290US of the lower peripheral interlayer insulating film. The upper surface 225US of the peripheral gate separation pattern is higher than the upper surface 220US of the peripheral gate electrode.

A sidewall 225SW of the peripheral gate separation pattern may be the sidewall of the peripheral gate spacer 240 disposed on the first sidewall 220SSW of the peripheral gate electrode. The sidewall 225SW of the peripheral gate separation pattern faces the first sidewall 220SSW of the peripheral gate electrode. The peripheral gate insulating film 230 may extend along the sidewall 225SW of the peripheral gate separation pattern.

An upper peripheral interlayer insulating film 291 is disposed on the peripheral gate electrode 220, the peripheral gate spacer 240, and the lower peripheral interlayer insulating film 290. The upper peripheral interlayer insulating film 291 covers the upper surface 220US of the peripheral gate electrode, the upper surface 240US of the peripheral gate spacer, and the upper surface 290US of the lower peripheral interlayer insulating film. The upper peripheral interlayer insulating film 291 covers a portion of the sidewall 225SW of the peripheral gate separation pattern and the upper surface 225US of the peripheral gate separation pattern.

As an example, an upper surface 291US of the upper peripheral interlayer insulating film may be disposed on the same plane as the upper surface 144US of the cell line capping film. In an embodiment, the upper surface 291US of the upper peripheral interlayer insulating film and the upper surface 144US of the cell line capping film may be coplanar. In an embodiment, the upper surface 291US of the upper peripheral interlayer insulating film and the upper surface 144US of the cell line capping film may be positioned at the same height relative to a bottom surface 100BS of the substrate 100. The upper surface 144US of the cell line capping film may refer to an uppermost surface above an etched upper surface of the cell line capping film as shown in FIG. 5. For example, the upper surface 144US of the cell line capping film may be positioned at a first height H1 relative to the bottom surface 100BS of the substrate as shown in FIGS. 5 and 6, and the upper surface 291US of the upper peripheral interlayer insulating film may be positioned at a second height H2 relative to the bottom surface 100BS of the substrate as shown in FIGS. 7 and 8. In an embodiment, the first height H1 may be the same as the second height H2. The upper peripheral interlayer insulating film 291 may contact the upper surface of 220US of the peripheral gate electrode, and may be provided with a contact hole via which the source/drain plug wiring 256 contacts a corresponding peripheral source/drain region 250. The upper peripheral interlayer insulating film 291 and the lower peripheral interlayer insulating film 290 may cover the corresponding peripheral source drain region 250, and the contact hole may penetrate the upper peripheral interlayer insulating film 291 and the lower peripheral interlayer insulating film 290. An opening of the contact hole may be formed at the upper surface of the 291US of the upper peripheral interlayer insulating film. The present invention is not limited thereto. As an example, the upper surface 291US of the upper peripheral interlayer insulating film may be higher than the upper surface 144US of the cell line capping film 144 relative to the bottom surface 100BS of the substrate.

In FIGS. 6 and 8, based on the upper surface of the cell gate capping pattern 113, a depth D3 of the cell gate trench 115 may be the same as a depth D32 of the fin trench 208. The depth D3 of the cell gate trench 115 is a depth of the cell gate trench 115 in the cell active region ACT rather than a depth of the cell gate trench 115 in the cell element separation film 105.

The upper peripheral interlayer insulating film 291 may include or may be formed of the same material as the cell line capping film 144. When the cell line capping film 144 has a multilayer film structure, the upper peripheral interlayer insulating film 291 may include or may be formed of the same material as the uppermost film disposed on the uppermost portion of multilayer films. The upper peripheral interlayer insulating film 291 may include or may be formed of, for example, a nitride-based insulating material. For example, the upper peripheral interlayer insulating film 291 may include or may be formed of silicon nitride.

A source/drain plug wiring 265 may be connected to the peripheral source/drain region 250. The source/drain plug wiring 265 may penetrate through the upper peripheral interlayer insulating film 291 and the lower peripheral interlayer insulating film 290 and be connected to the peripheral source/drain region 250. A portion of the source/drain plug wiring 265 may be disposed on the upper surface 291US of the upper peripheral interlayer insulating film.

Although not illustrated, a gate plug wiring connected to the peripheral gate electrode 220 may be disposed.

An upper surface 265US of the source/drain plug wiring of the peripheral region 24 may be disposed on the same plane as the upper surface 160US of the storage pad of the cell region 20. The source/drain plug wiring 265 may include or may be formed of, for example, at least one of a semiconductor material doped with impurities, a conductive silicide compound, conductive metal nitride, conductive metal carbide, a metal, and a metal alloy.

When the upper surface 265US of the source/drain plug wiring is disposed on the same plane as the upper surface 160US of the storage pad of the cell region 20, a depth of the cell gate trench 115 based on the upper surface 160US of the storage pad may be the same as a depth of the fin trench 208 based on the upper surface 265US of the source/drain plug wiring.

A first peripheral interlayer insulating film 292 may be disposed on the upper peripheral interlayer insulating film 291. An upper surface of the first peripheral interlayer insulating film 292 may be disposed on the same plane as the upper surface 265US of the source/drain plug wiring, but is not limited thereto.

The first peripheral interlayer insulating film 292 may include or may be, for example, at least one of a silicon oxide film, a silicon nitride film, a silicon oxynitride film, a silicon oxycarbonitride film, and a silicon carbonitride film.

An etch stop film 295 may be disposed on the storage pad 160, the pad separation insulating film 180, the source/drain plug wiring 265, and the first peripheral interlayer insulating film 292. The etch stop film 295 may extend not only to the cell region 20 but also to the peripheral region 24. The etch stop film 295 may include or may be at least one of a silicon nitride film, a silicon carbonitride film, a silicon boron nitride film (SiBN), a silicon oxynitride film, and a silicon oxycarbide film.

The information storage part 190 may be disposed on the storage pad 160. The information storage part 190 may be electrically connected to the storage pad 160. A portion of the information storage part 190 may be disposed in the etch stop film 295. The information storage part 190 may include or may be, for example, a capacitor, but is not limited thereto. The information storage part 190 includes a lower electrode 191, a capacitor dielectric film 192, and an upper electrode 193. For example, the upper electrode 193 may be a plate upper electrode having a plate shape.

The lower electrode 191 may be disposed on the storage pad 160. In an embodiment, the lower electrode 191 may contact the storage pad 160. It has been illustrated in FIG. 5 that the lower electrode 191 has a pillar shape, but the present disclosure is not limited thereto. The lower electrode 191 may also have a cylindrical shape. The capacitor dielectric film 192 is formed on the lower electrode 191. The capacitor dielectric film 192 may be formed along a profile of the lower electrode 191. The upper electrode 193 is formed on the capacitor dielectric film 192. The upper electrode 193 may surround outer sidewalls of the lower electrode 191.

As an example, the capacitor dielectric film 192 may not be disposed on a portion overlapping the upper electrode 193 in the fourth direction DR4, that is, the peripheral region 24. As another example, unlike illustrated, the capacitor dielectric film 192 may extend from _____ to the peripheral region 24.

Each of the lower electrode 191 and the upper electrode 193 may include or may be formed of, for example, a doped semiconductor material, conductive metal nitride (e.g., titanium nitride, tantalum nitride, niobium nitride, or tungsten nitride), a metal (e.g., ruthenium, iridium, titanium, or tantalum), and conductive metal oxide (e.g., iridium oxide or niobium oxide), and the like, but is not limited thereto.

The capacitor dielectric film 192 may include or may be formed of, for example, one of silicon oxide, silicon nitride, silicon oxynitride, a high-k material, and combinations thereof, but is not limited thereto. In the semiconductor memory device according to some exemplary embodiments, the capacitor dielectric film 192 may have a stacked film structure in which zirconium oxide, aluminum oxide, and zirconium oxide are sequentially stacked. In the semiconductor memory device according to some exemplary embodiments, the capacitor dielectric film 192 may include or may be a dielectric film including hafnium (Hf). In the semiconductor memory device according to some exemplary embodiments, the capacitor dielectric film 192 may have a stacked film structure of a ferroelectric material film and a paraelectric material film.

A second peripheral interlayer insulating film 293 may be disposed on the etch stop film 295. The second peripheral interlayer insulating film 293 may cover sidewalls of the upper electrode 193. The second peripheral interlayer insulating film 293 may include or may be formed of an insulating material.

Figure 10:
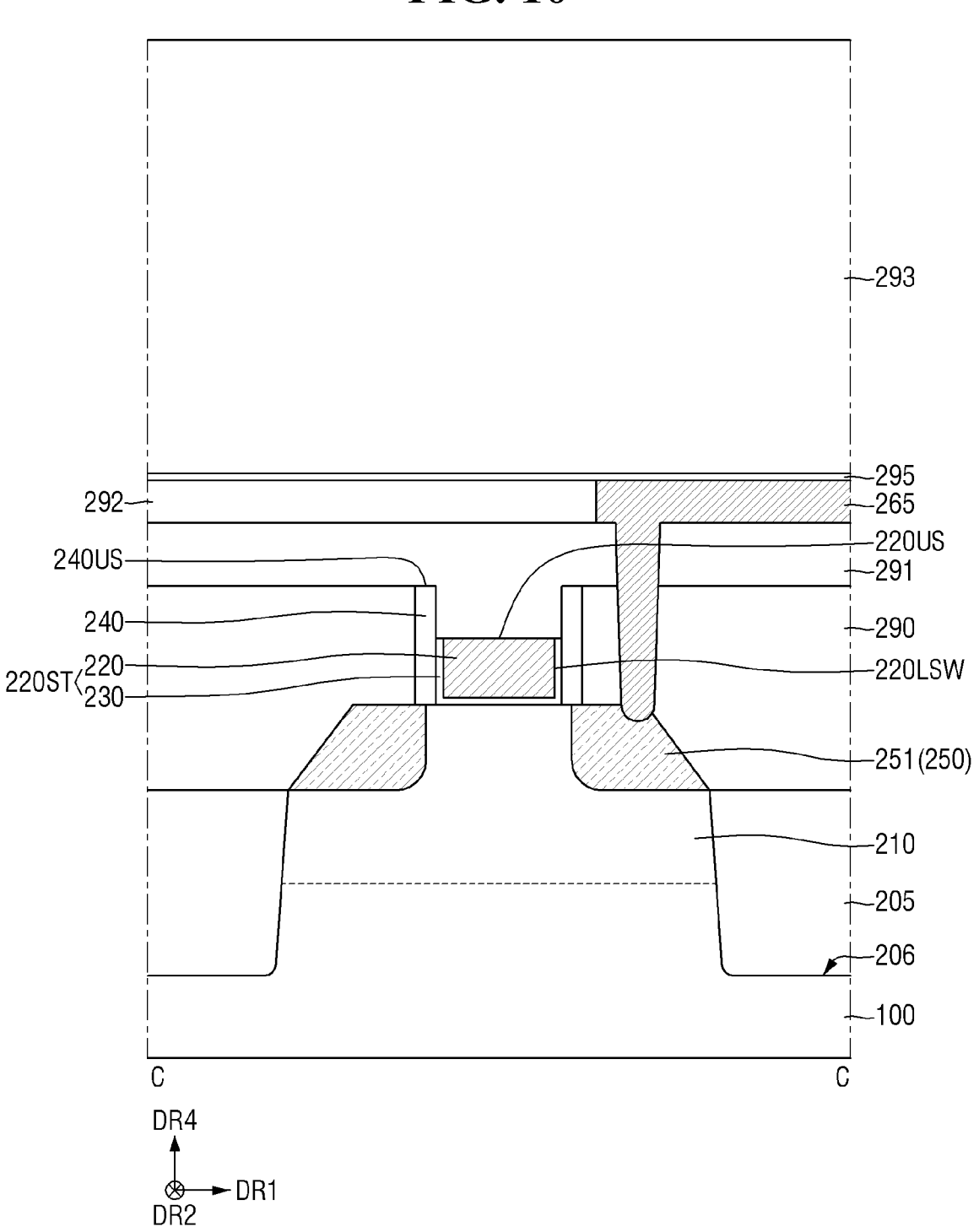
FIGS. 10 and 11 are views for describing a semiconductor memory device according to some exemplary embodiments.
Figure 11:
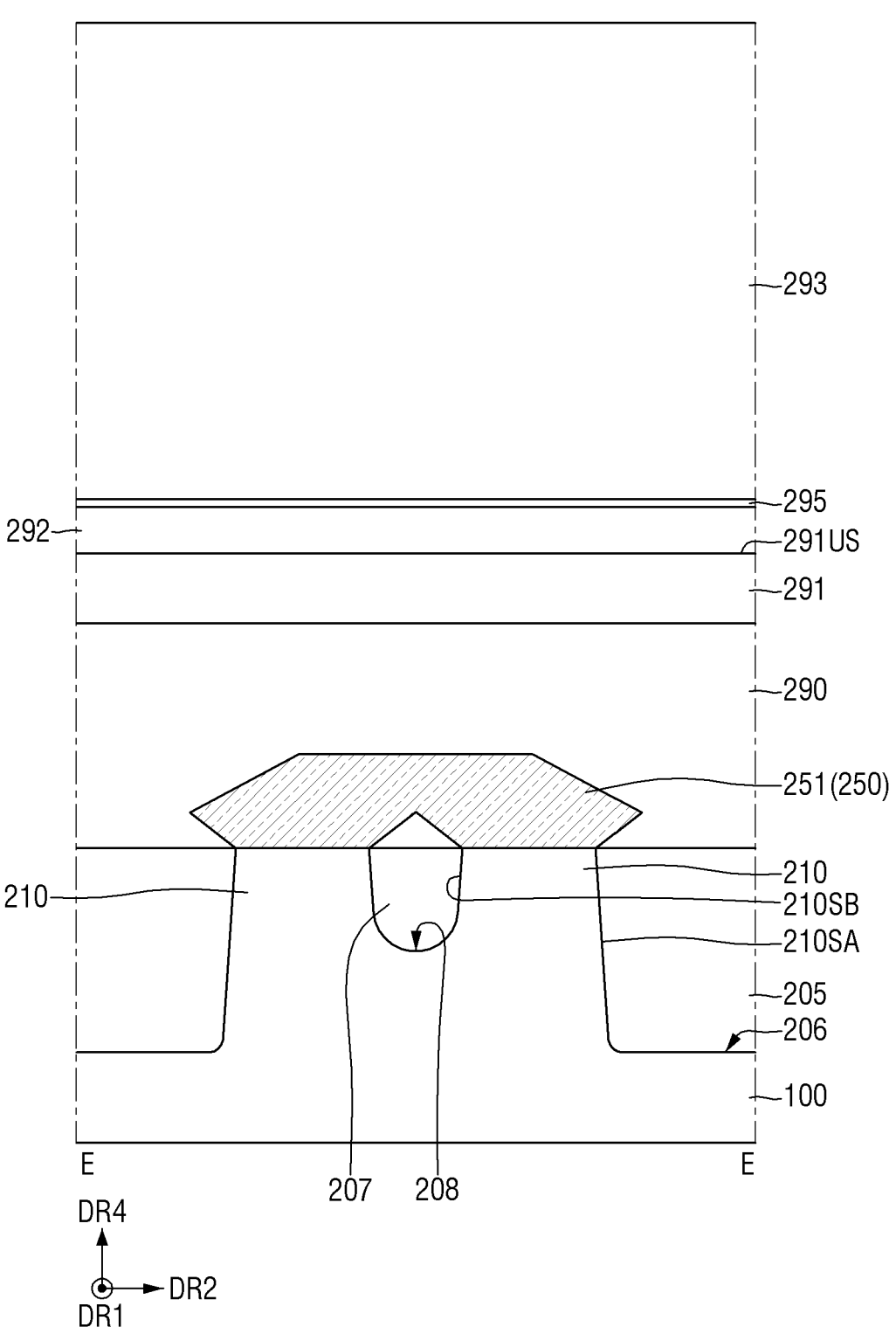
Figure 12:
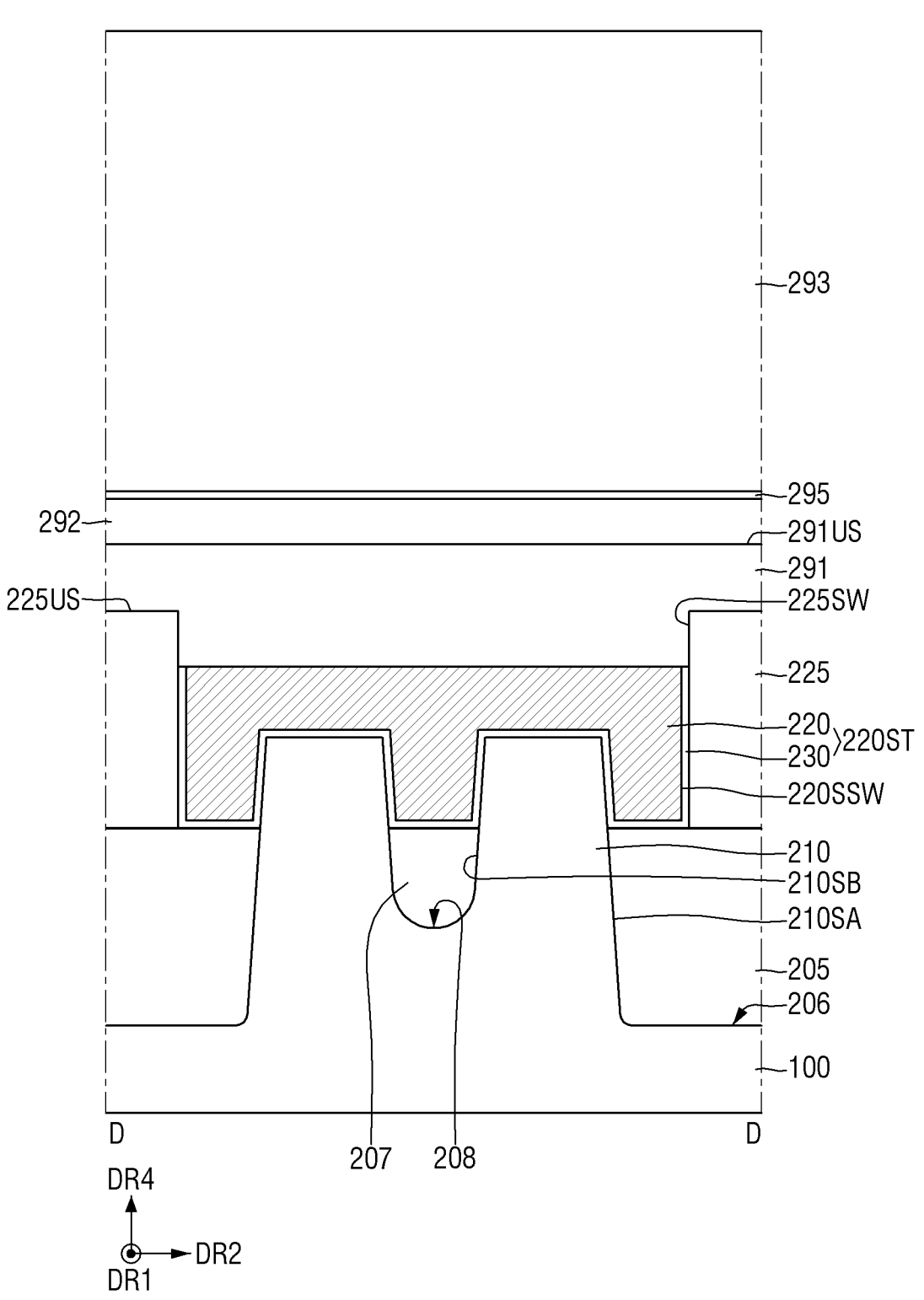
FIGS. 12 and 13 are views for describing a semiconductor memory device according to some exemplary embodiments.
Figure 13:
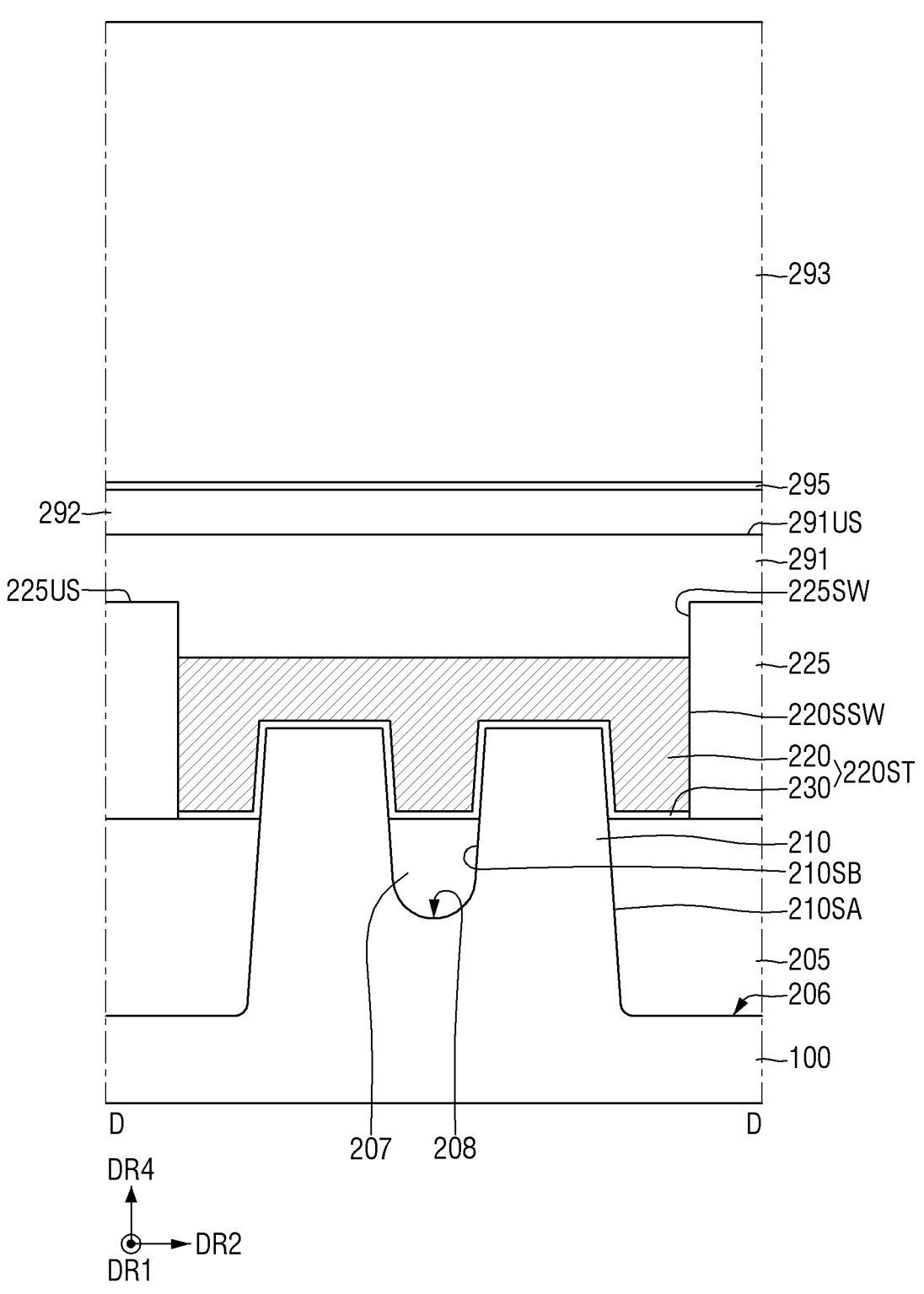

FIGS. 10 and 11 are views for describing a semiconductor memory device according to some exemplary embodiments. FIGS. 12 and 13 are views for describing a semiconductor memory device according to some exemplary embodiments. For convenience of explanation, contents different from those described with reference to FIGS. 1 to 9 will be mainly described.

Referring to FIGS. 10 and 11, in a semiconductor memory device according to some exemplary embodiments, the peripheral source/drain region 250 may include or may be a semiconductor epitaxial pattern 251 disposed on the fin-type active pattern 210.

For example, the semiconductor epitaxial pattern 251 may be connected to the plurality of fin-type active patterns 210. One semiconductor epitaxial pattern 251 may be connected to the plurality of fin-type active patterns 210. Unlike illustrated in FIGS. 10 and 11, the semiconductor epitaxial patterns 251 disposed on the respective fin-type active patterns 210 may be separated from each other.

In FIG. 10, in a portion adjacent to the peripheral element separation film 205, the semiconductor epitaxial pattern 251 may include a facet, but is not limited thereto.

The semiconductor epitaxial pattern 251 may vary depending on a conductivity type of a transistor. When the peripheral source/drain region 250 is included in a p-type transistor, the semiconductor epitaxial pattern 251 may include or may be formed of silicon germanium. When the peripheral source/drain region 250 is included in an n-type transistor, the semiconductor epitaxial pattern 251 may include or may be formed of silicon or silicon carbide. However, the above-described materials are only examples, and the technical spirit of the present disclosure is not limited thereto.

Referring to FIGS. 12 and 13, in a semiconductor memory device according to some exemplary embodiments, the peripheral gate separation pattern 225 does not include the peripheral gate spacer 240 and the lower peripheral interlayer insulating film 290.

The peripheral gate spacer 240 is disposed on the second sidewall 220LSW of the peripheral gate electrode, but is not disposed on the first sidewall 220SSW of the peripheral gate electrode. The peripheral gate separation pattern 225 may include or may be formed of, for example, at least one of silicon nitride (SiN), silicon oxynitride (SiON), and silicon oxide ($SiO_2$), but is not limited thereto.

In FIG. 12, the peripheral gate insulating film 230 may extend along the sidewall 225SW of the peripheral gate separation pattern. The peripheral gate separation pattern 225 may be formed by cutting a mold dummy gate for forming a replacement metal gate.

In FIG. 13, the peripheral gate insulating film 230 does not extend along the sidewall 225SW of the peripheral gate separation pattern. The peripheral gate separation pattern 225 may be formed by forming a replacement metal gate and then cutting the replacement metal gate.

Figure 14:
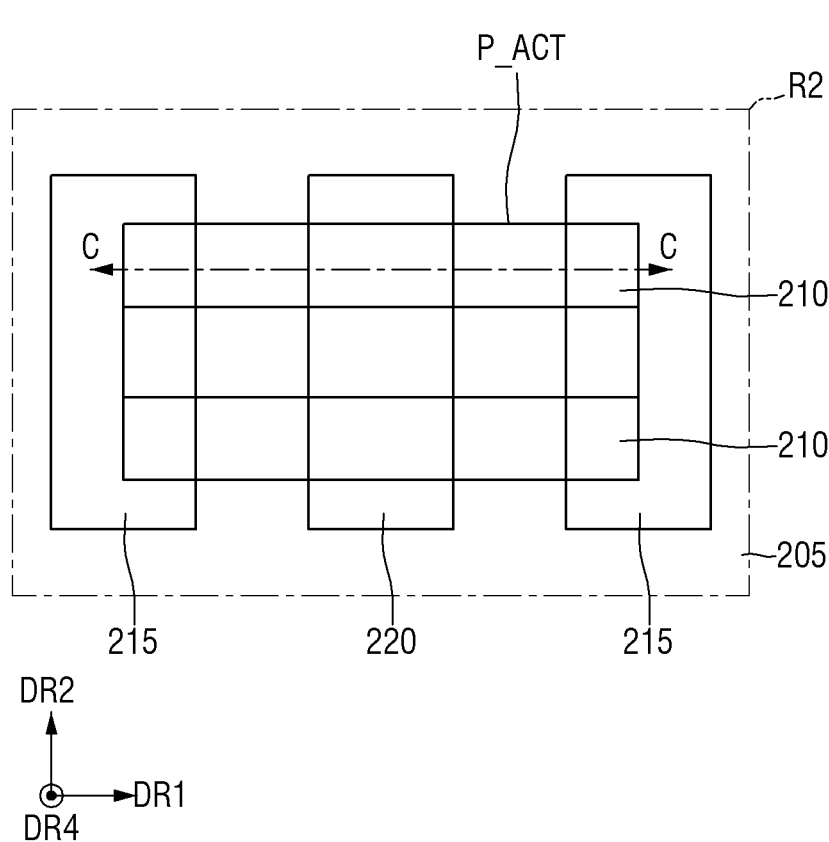
FIGS. 14 and 15 are views for describing a semiconductor memory device according to some exemplary embodiments.
Figure 15:
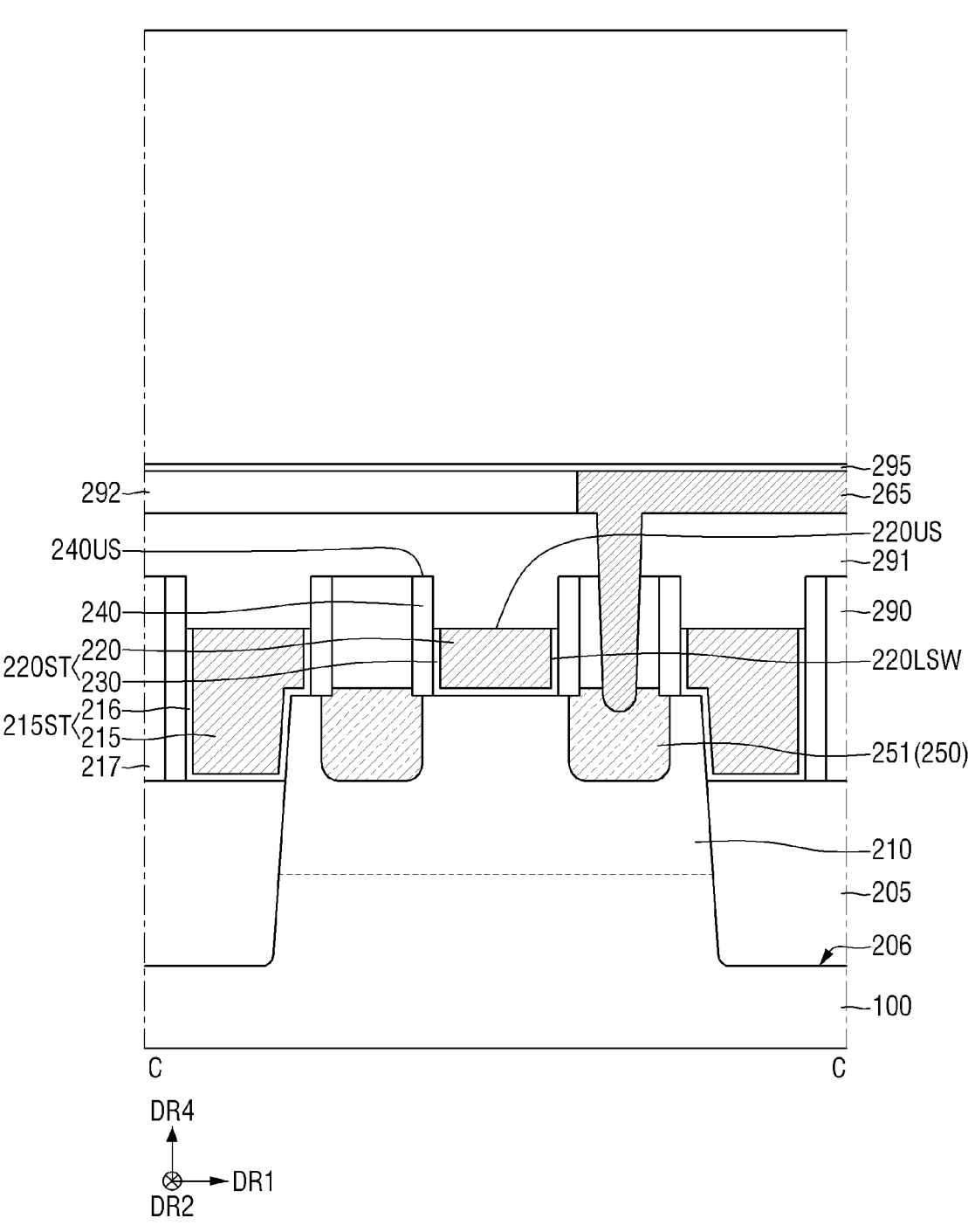

FIGS. 14 and 15 are views for describing a semiconductor memory device according to some exemplary embodiments. For convenience of explanation, contents different from those described with reference to FIGS. 1 to 9 will be mainly described. For reference, FIG. 14 is a schematic layout diagram of region R2 of FIG. 1. FIG. 15 is a cross-sectional view taken along line C-C of FIG. 14.

Referring to FIGS. 14 and 15, a semiconductor memory device according to some exemplary embodiments may further include a fin-cut gate structure 215ST disposed in the peripheral region 24.

The fin-cut gate structure 215ST may be disposed at an end of the fin-type active pattern 210. The fin-cut gate structure 215ST may include a fin-cut gate electrode 215 and a fin-cut gate insulating film 216.

The fin-cut gate electrode 215 may surround the end of the fin-type active pattern 210. The fin-cut gate insulating film 216 may be disposed between the fin-type active pattern 210 and the fin-cut gate electrode 215. A fin-cut gate spacer 217 may be disposed on a sidewall of the fin-cut gate electrode 215. The fin-cut gate structure 215ST and the fin-cut gate spacer 217 may be formed together with the peripheral gate structure 220ST and the peripheral gate spacer 240.

The peripheral source/drain region 250 may be disposed between the fin-cut gate structure 215ST and the peripheral gate structure 220ST.

Figure 16:
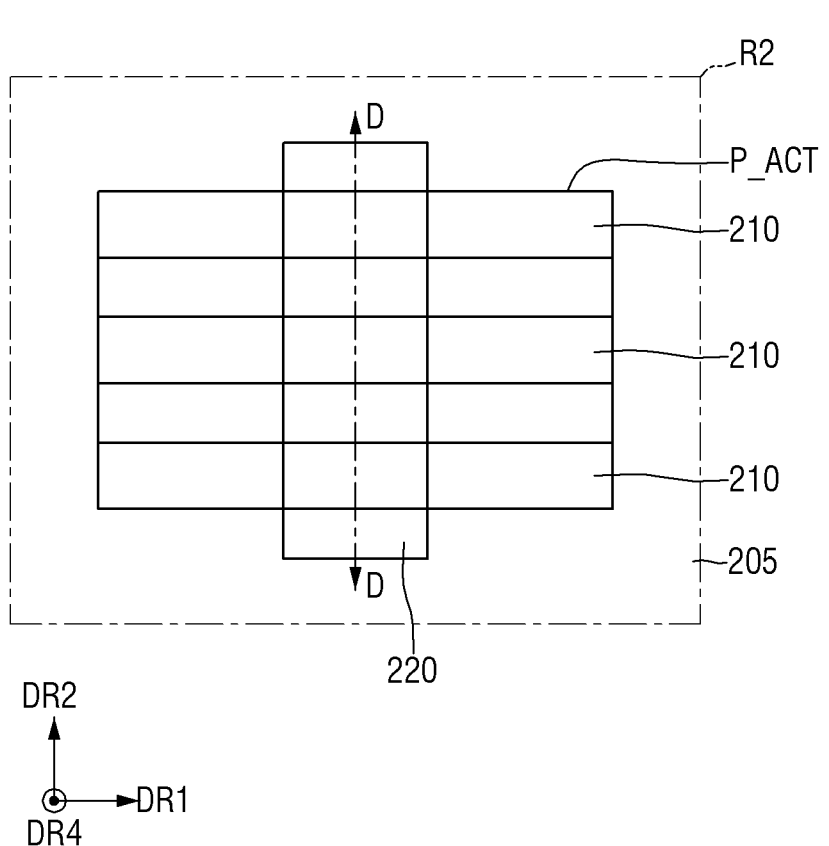
FIGS. 16 and 17 are views for describing a semiconductor memory device according to some exemplary embodiments.
Figure 17:
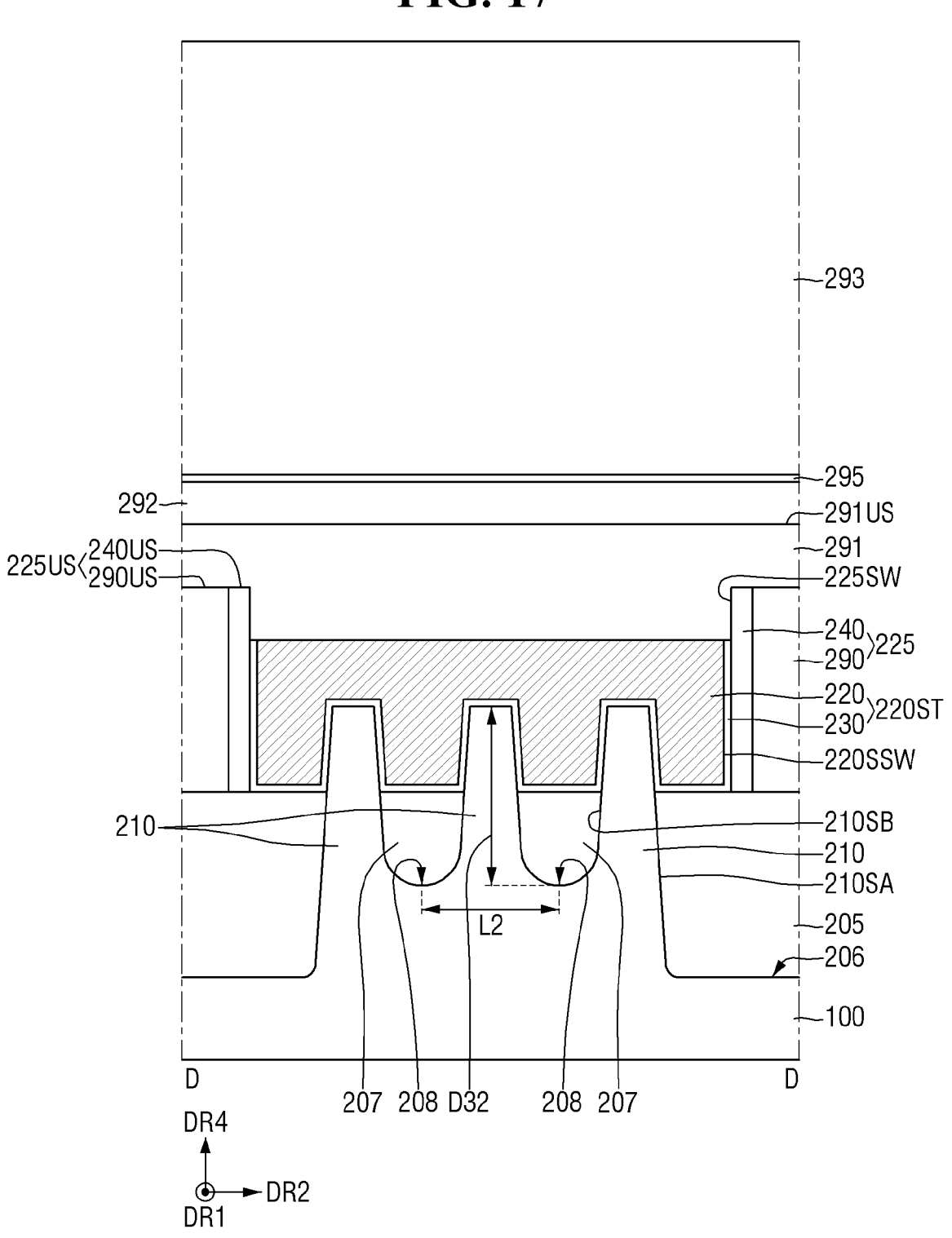

FIGS. 16 and 17 are views for describing a semiconductor memory device according to some exemplary embodiments. For convenience of explanation, contents different from those described with reference to FIGS. 1 to 9 will be mainly described. For reference, FIG. 16 is a schematic layout diagram of region R2 of FIG. 1. FIG. 17 is a cross-sectional view taken along line D-D of FIG. 16.

Referring to FIGS. 16 and 17, in a semiconductor memory device according to some exemplary embodiments, a plurality of fin trenches 208 may be disposed in one peripheral active region P_ACT.

The plurality of fin-type active patterns 210 may include three or more fin-type active patterns 210 separated from each other by the plurality of fin trenches 208. The respective fin trenches 208 extend in the first direction DR1. The respective fin trenches 208 are spaced apart from each other in the second direction DR2.

Two fin-type active patterns 210 disposed at the outermost portion, of the plurality of fin-type active patterns 210 include sidewalls defined by the peripheral separation trenches 206 and the fin trenches 208. The other fin-type active patterns 210 of the plurality of fin-type active patterns 210 include sidewalls defined by the fin trenches 208.

The fin trenches 208 may be spaced apart from each other by a second interval L2 and be disposed in the second direction DR2. That is, an interval between the fin trenches 208 adjacent to each other in the second direction DR2 is the second interval L2.

In FIGS. 16 and 17, the interval L2 between the fin trenches 208 spaced apart from each other in the second direction DR2 may be the same as the interval L1 between the cell gate trenches 115 spaced apart from each other in the second direction DR2. In other words, the interval L2 between the fin trenches 208 spaced apart from each other in the second direction DR2 may be the same as the interval L1 between the cell gate electrodes 112 adjacent to each other in the second direction DR2.

Figure 18:
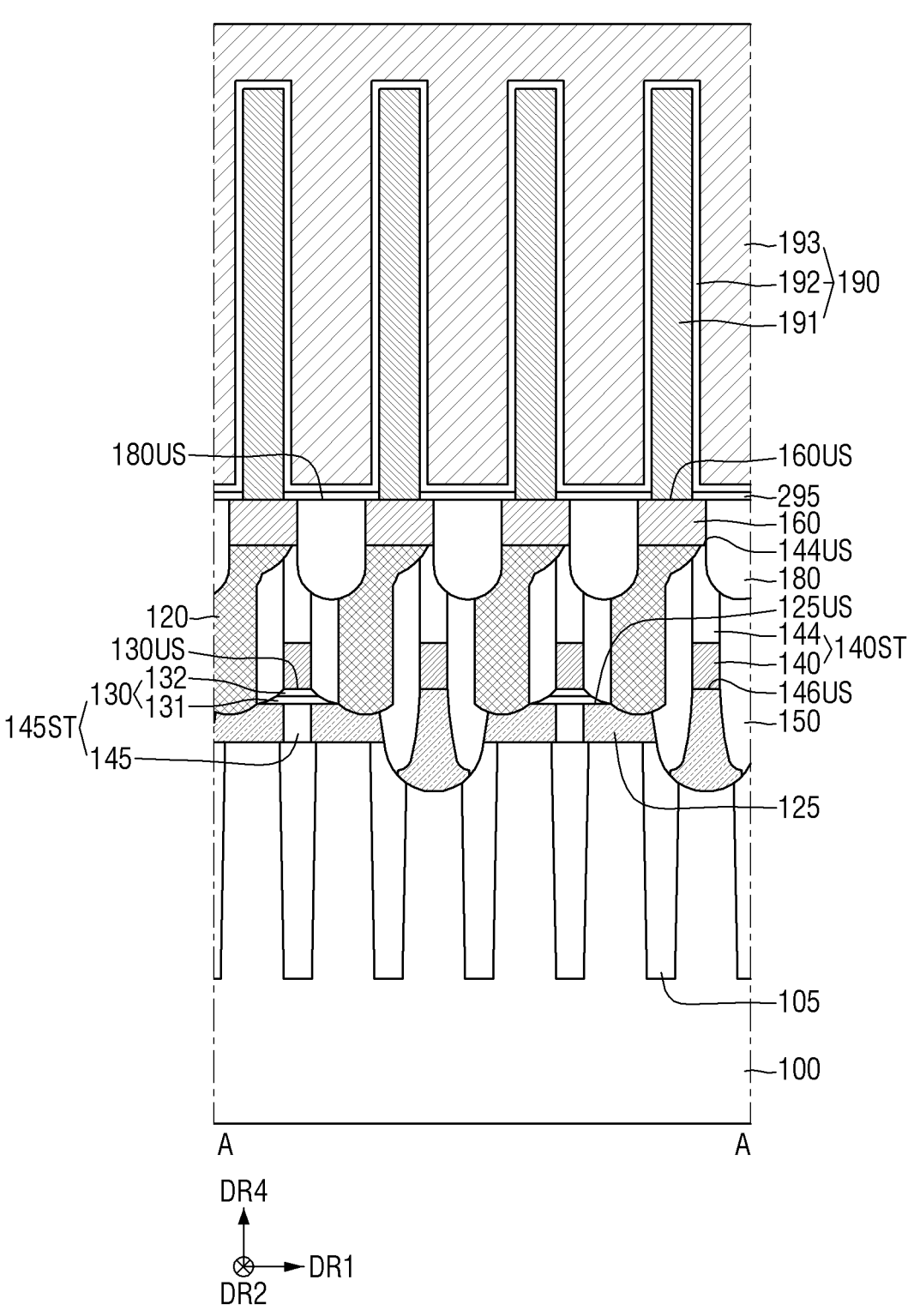
FIGS. 18 and 19 are views for describing a semiconductor memory device according to some exemplary embodiments.
Figure 19:
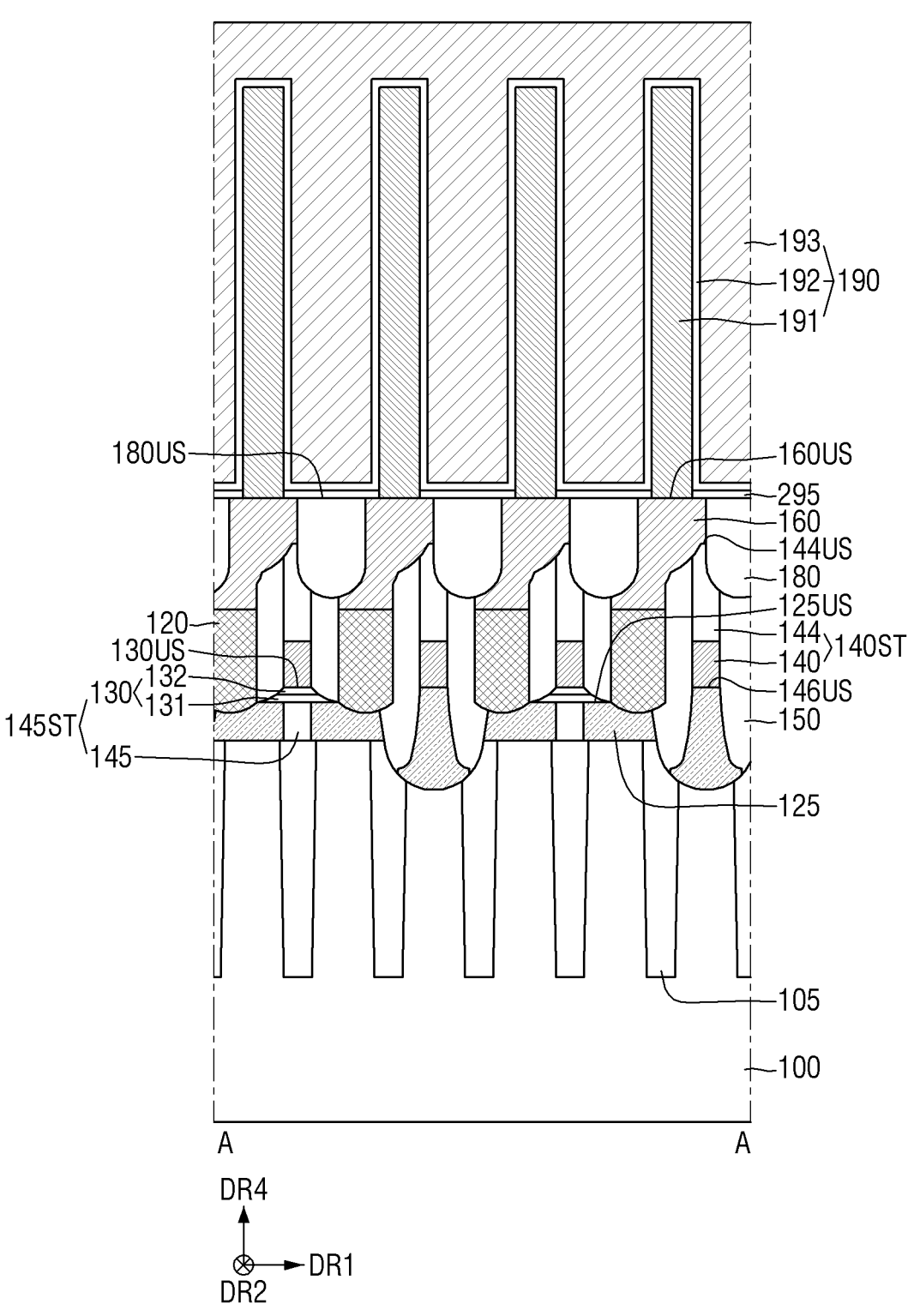

FIGS. 18 and 19 are views for describing a semiconductor memory device according to some exemplary embodiments. For convenience of explanation, contents different from those described with reference to FIGS. 1 to 9 will be mainly described.

Referring to FIGS. 18 and 19, a semiconductor memory device according to some exemplary embodiments may further include a storage contact 120 disposed between the node connection pad 125 and the storage pad 160.

The storage contact 120 connects the node connection pad 125 and the storage pad 160 to each other. The storage contact 120 may include or may be formed of, for example, at least one of a semiconductor material doped with impurities, a conductive silicide compound, conductive metal nitride, a metal, and a metal alloy.

In FIG. 18, an upper surface of the storage contact 120 may be disposed on the same plane as the upper surface 144US of the cell line capping film.

In FIG. 19, an upper surface of the storage contact 120 is lower than the upper surface 144US of the cell line capping film.

Figure 20:
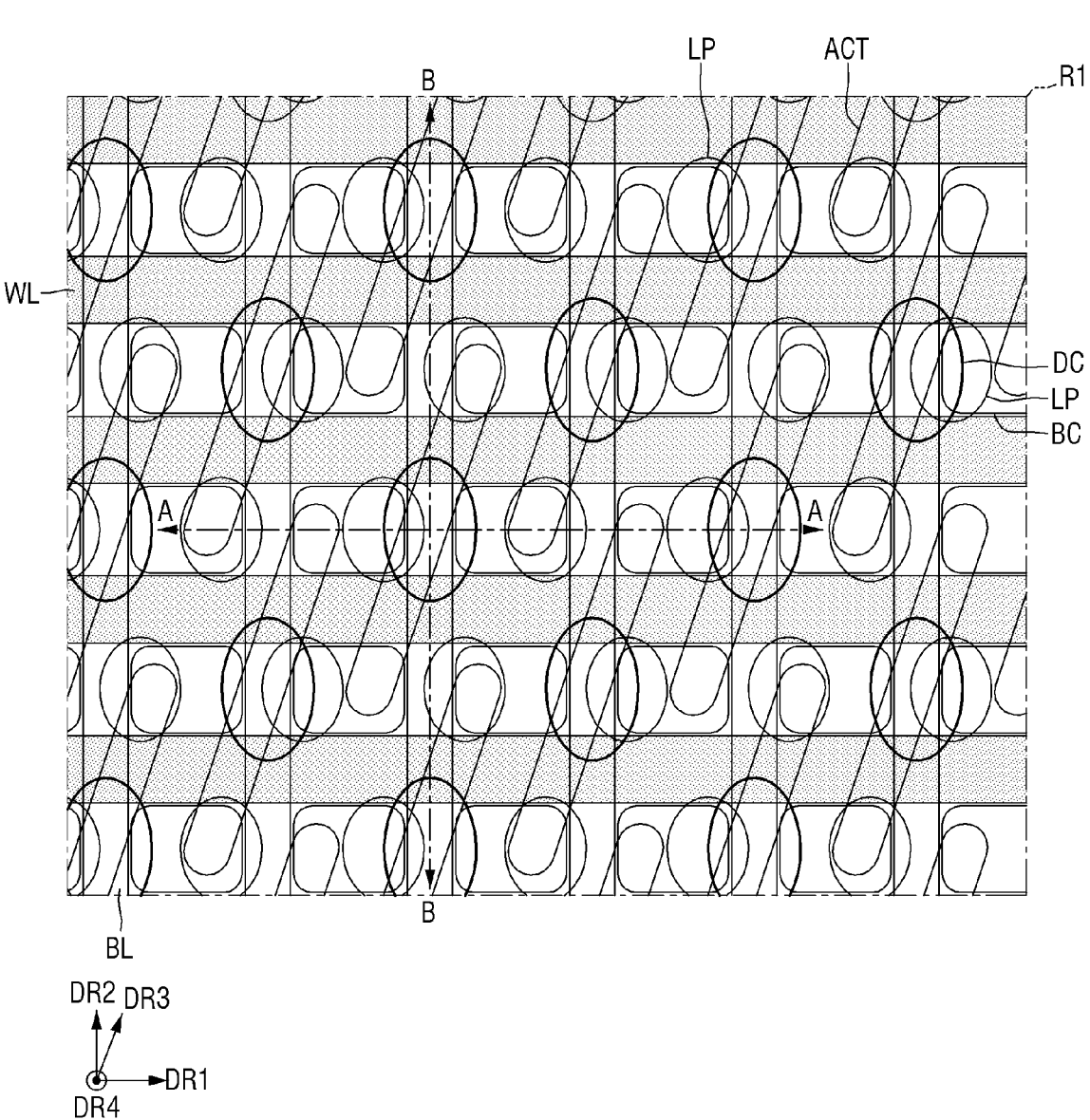
FIGS. 20 to 22 are views for describing a semiconductor memory device according to some exemplary embodiments.
Figure 21:
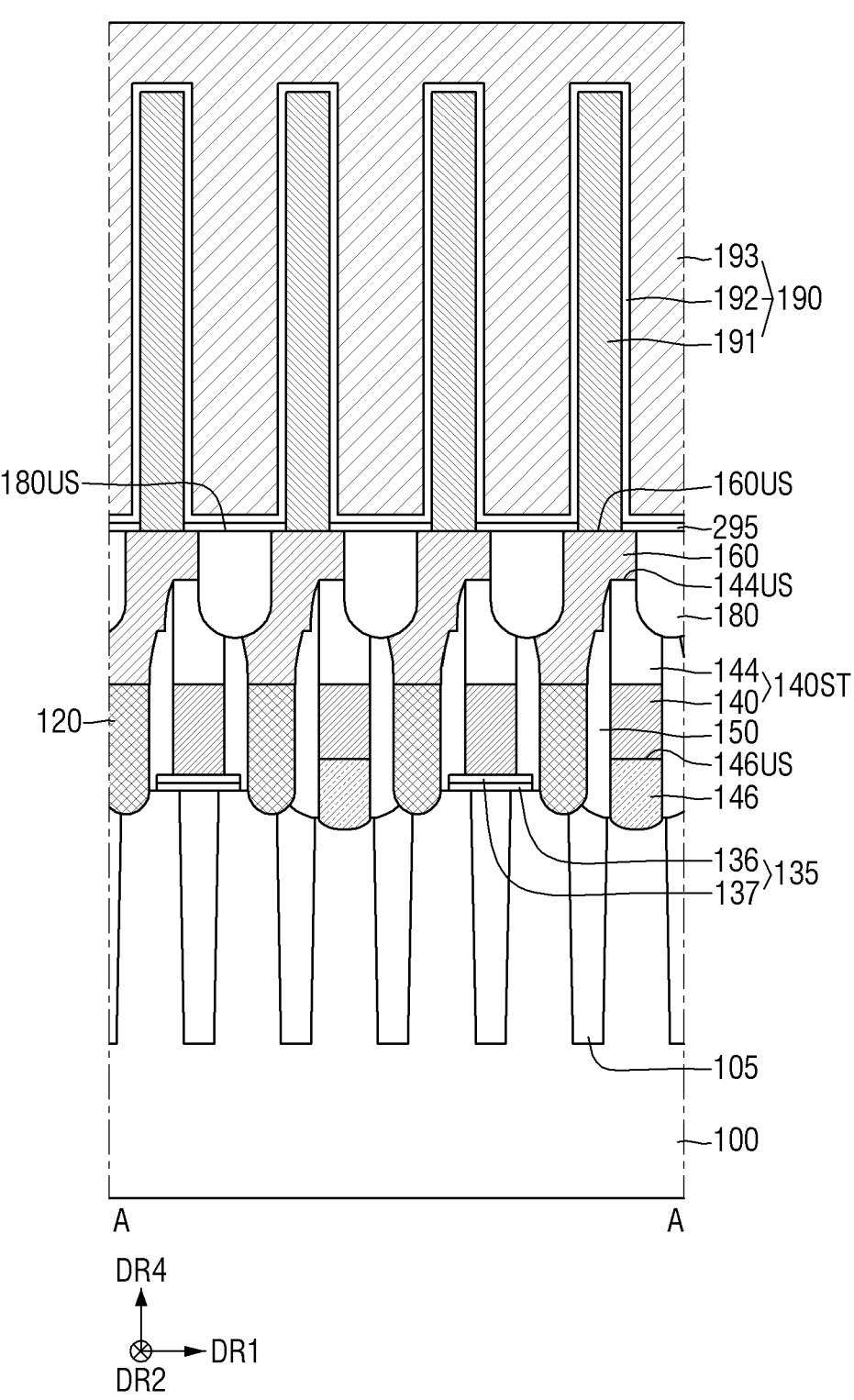
Figure 22:
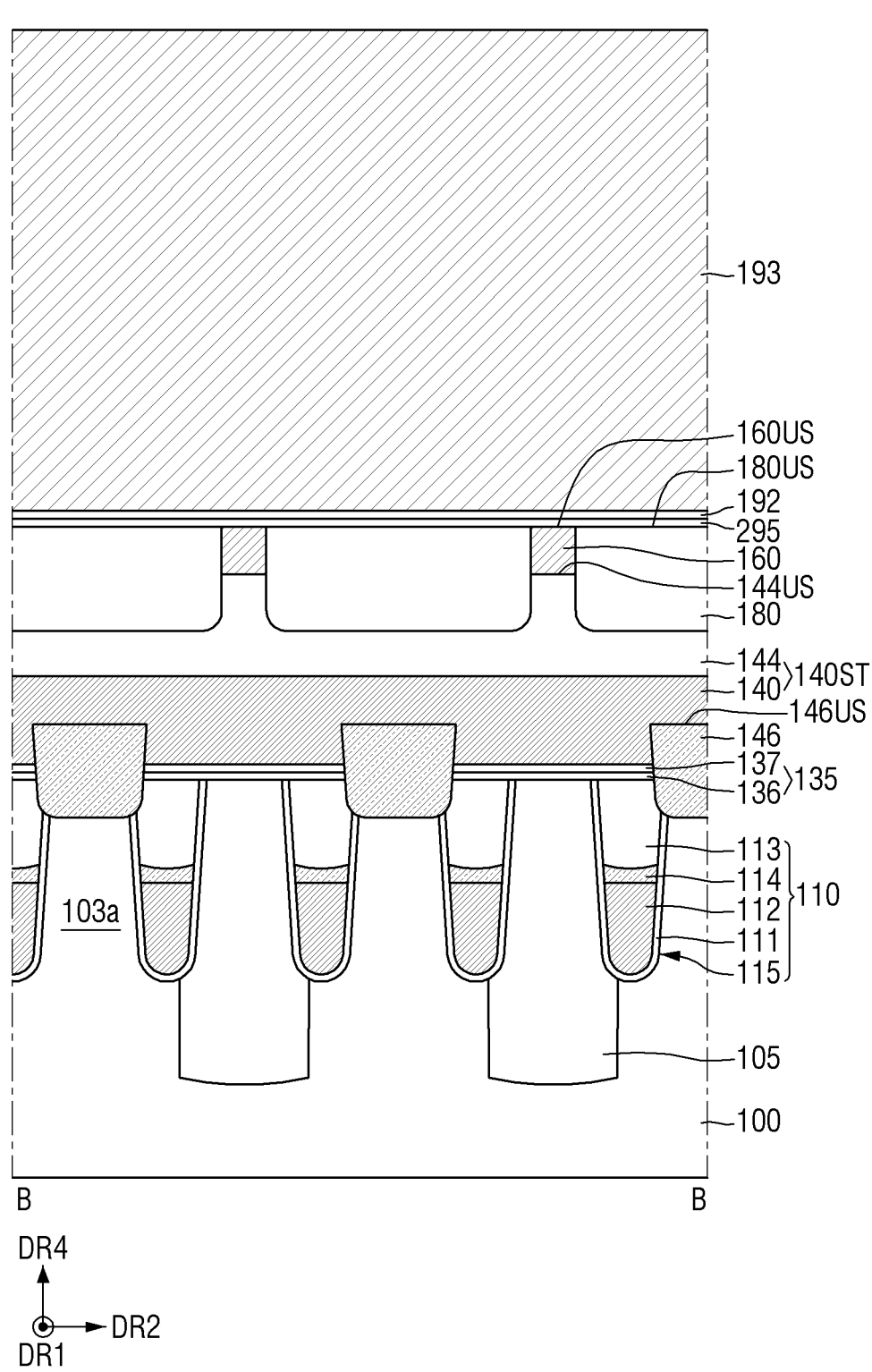

FIGS. 20 to 22 are views for describing a semiconductor memory device according to some exemplary embodiments.

For convenience of explanation, contents different from those described with reference to FIGS. 1 to 9 will be mainly described. For reference, FIG. 20 is a schematic layout diagram of region R1 of FIG. 1. FIGS. 21 and 22 are cross-sectional views taken along line A-A and line B-B of FIG. 20, respectively.

Referring to FIGS. 20 to 22, a semiconductor memory device according to some exemplary embodiments includes buried contacts BC connecting the cell active regions ACT to the lower electrodes 191 of the capacitors, and does not include the node pads XP (see FIG. 2).

The landing pad LP may be disposed between the buried contact BC and the lower electrode 191 of the capacitor.

A lower cell insulating film 135 may be formed on the substrate 100 and the cell element separation film 105. More specifically, the lower cell insulating film 135 may be disposed on the substrate 100 and the cell element separation film 105 on which the bit line contact 146 is not formed. The lower cell insulating film 135 may be disposed between the substrate 100 and the cell conductive line 140 and between the cell element separation film 105 and the cell conductive line 140.

The lower cell insulating film 135 may be a single film, but as illustrated in FIGS. 21 and 22, the lower cell insulating film 135 may be multiple films including a first lower cell insulating film 136 and a second lower cell insulating film 137. For example, the first lower cell insulating film 136 may include or may be a silicon oxide film, and the second lower cell insulating film 137 may include or may be a silicon nitride film, but the present disclosure is not limited thereto. Unlike illustrated in FIGS. 21 and 22, the second lower cell insulating film 137 may include three or more insulating films.

A portion of the bit line contact 146 may be recessed into the cell conductive line 140. The upper surface 146US of the bit line contact may protrude above an upper surface of the lower cell insulating film 135. Based on the upper surface of the cell element separation film 105, a height of the upper surface 146US of the bit line contact is greater than a height of the upper surface of the lower cell insulating film 135.

A plurality of storage contacts 120 may be disposed between the cell conductive lines 140 adjacent to each other in the first direction DR1. The storage contact 120 may overlap the substrate 100 and the cell element separation film 105 between the adjacent cell conductive lines 140. The storage contact 120 may be connected to the storage connection region 103b (see FIG. 3) of the cell active region ACT. Here, the storage contact 120 may correspond to the buried contact BC.

The plurality of storage contacts 120 may include or may be formed of, for example, at least one of a semiconductor material doped with impurities, a conductive silicide compound, conductive metal nitride, a metal, and a metal alloy.

The storage pad 160 may be formed on the storage contact 120. The storage pad 160 may be electrically connected to the storage contact 120.

FIGS. 23 to 56 are views for describing intermediate steps of a method for fabricating a semiconductor memory device according to some exemplary embodiments. Contents overlapping those described above with reference to FIGS. 1 to 22 in a description of a method for fabricating a semiconductor memory device will be briefly described or a description thereof will be omitted.

Figure 23:
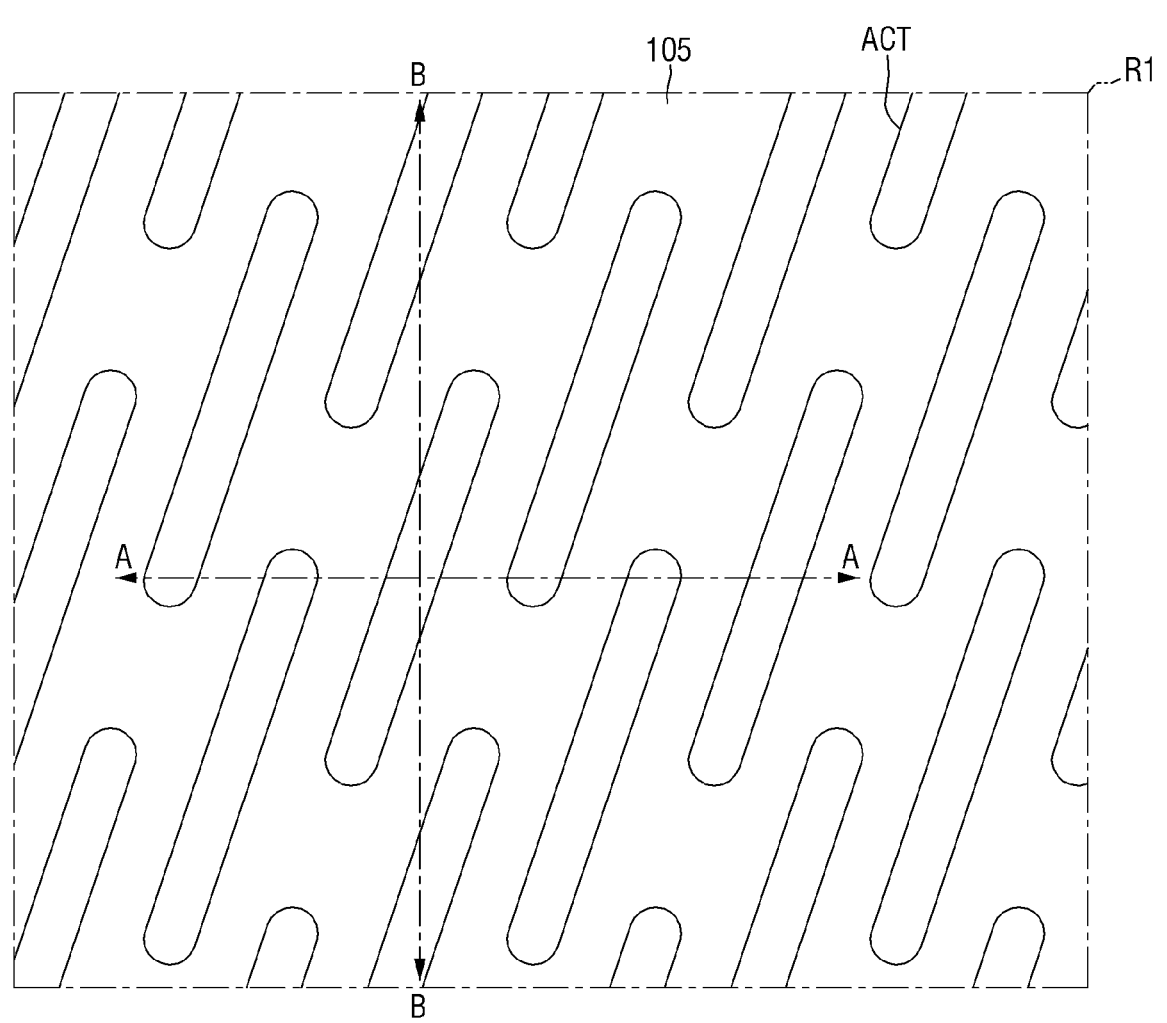
Figure 23:
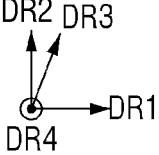
Figure 24:
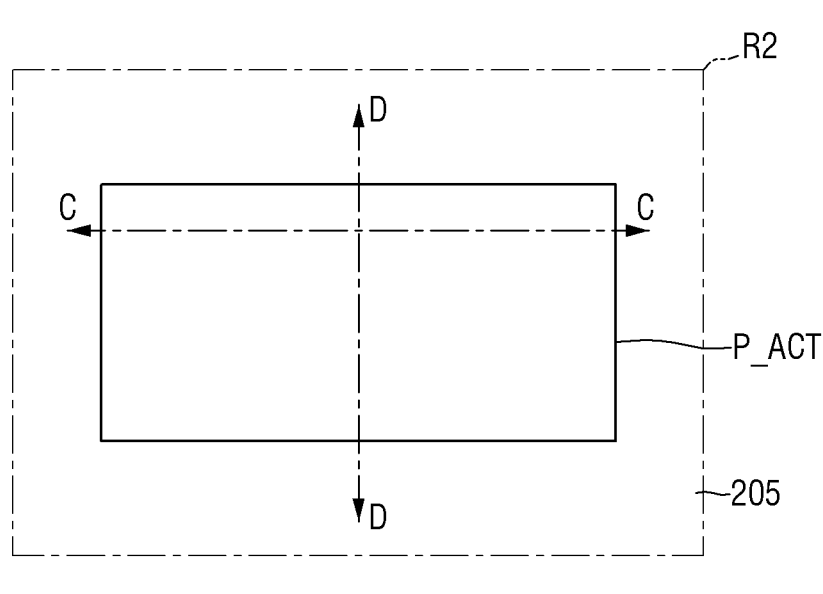
Figure 24:
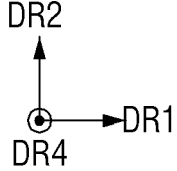
Figure 25:
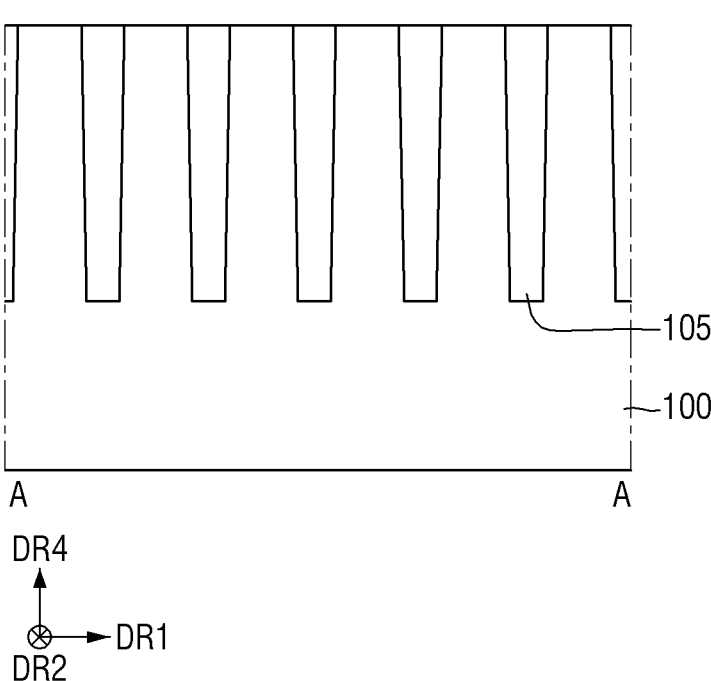
Figure 26:
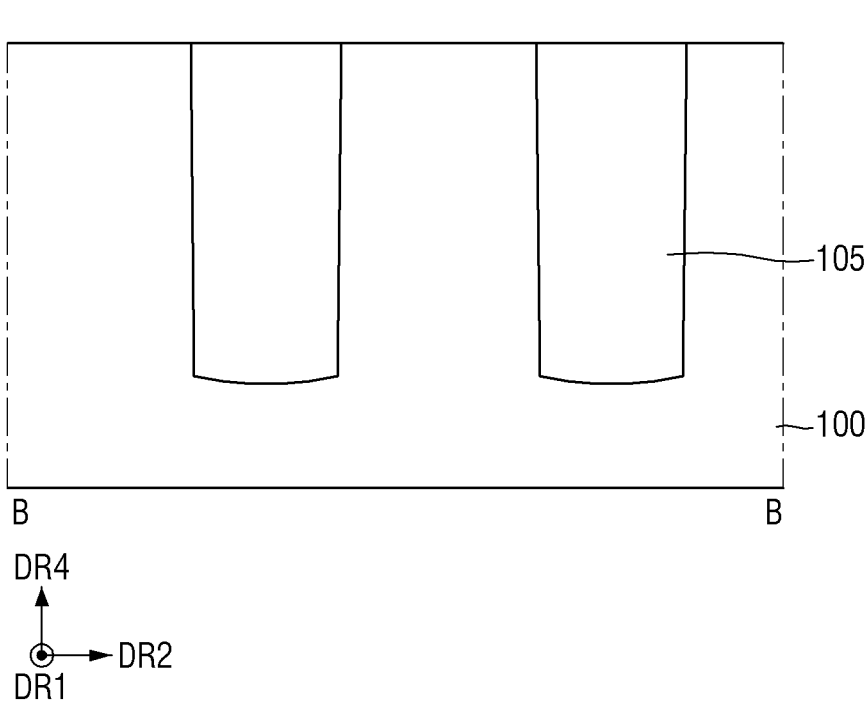
Figure 27:
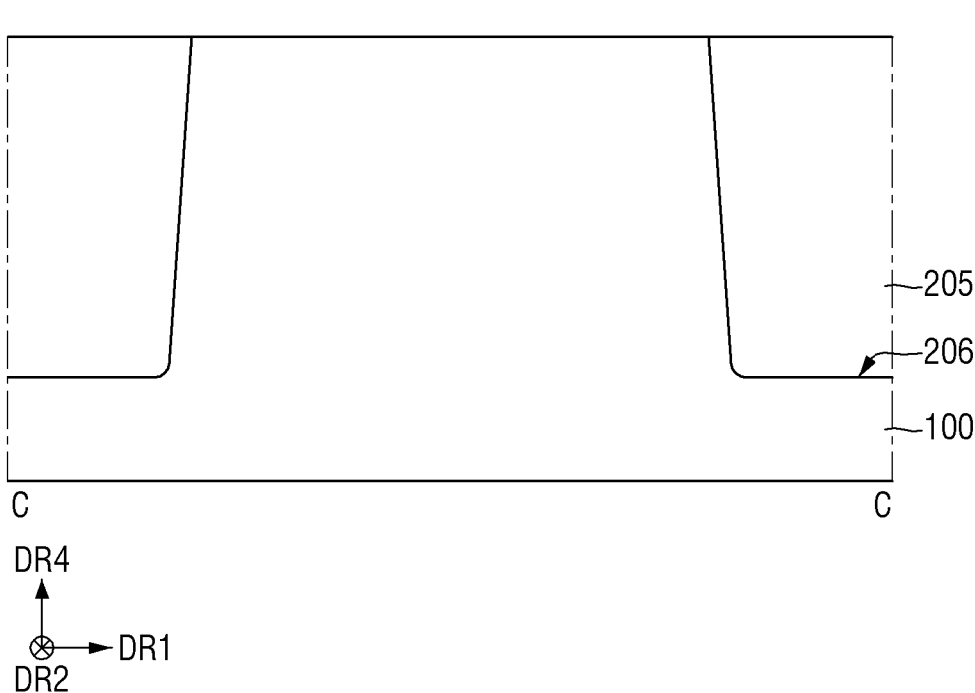
Figure 28:
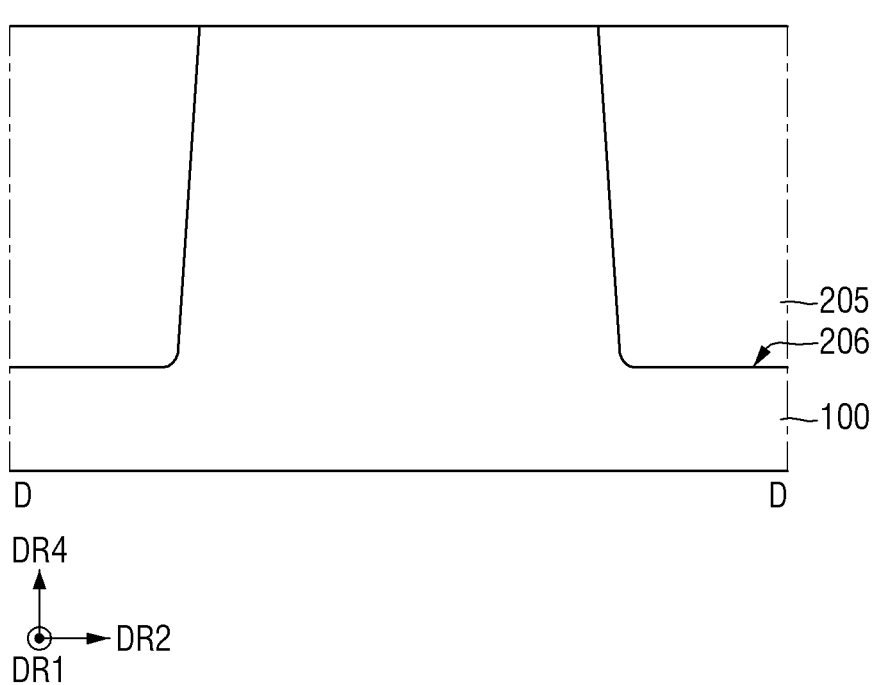
Figure 29:
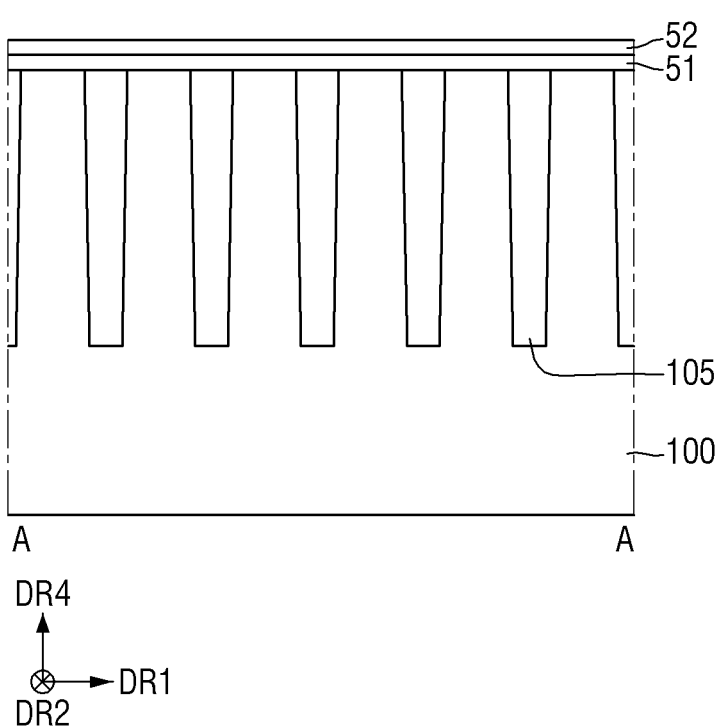
Figure 30:
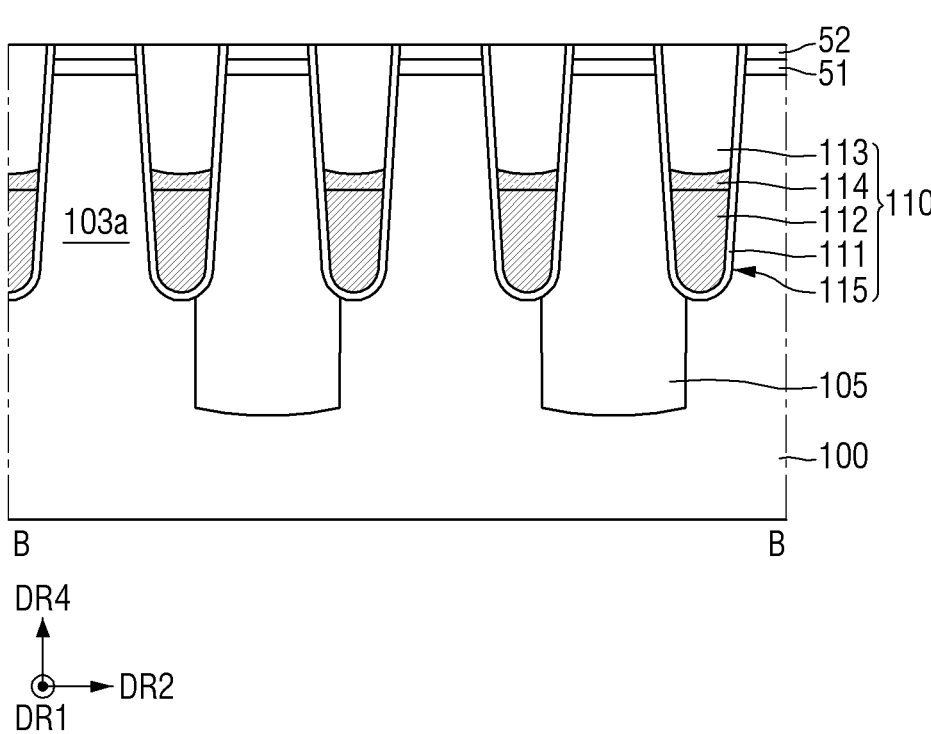
Figure 31:
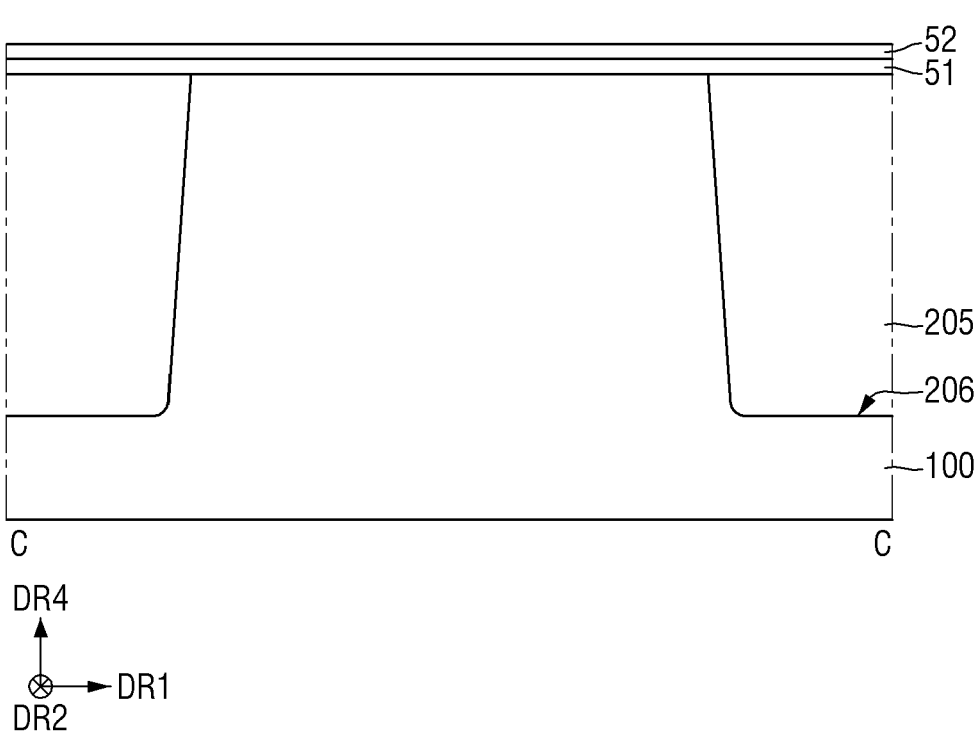
Figure 32:
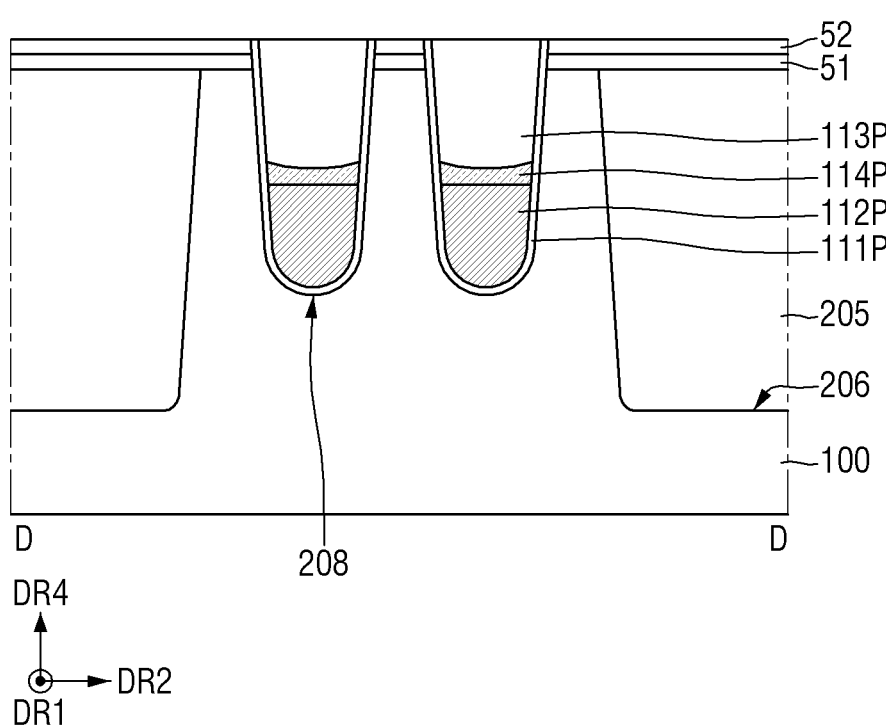
Figure 33:
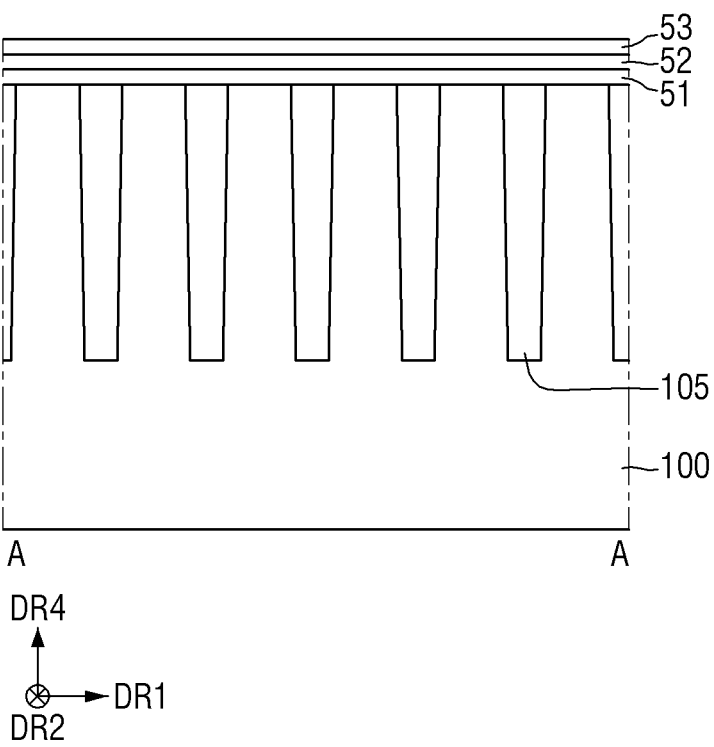
Figure 34:
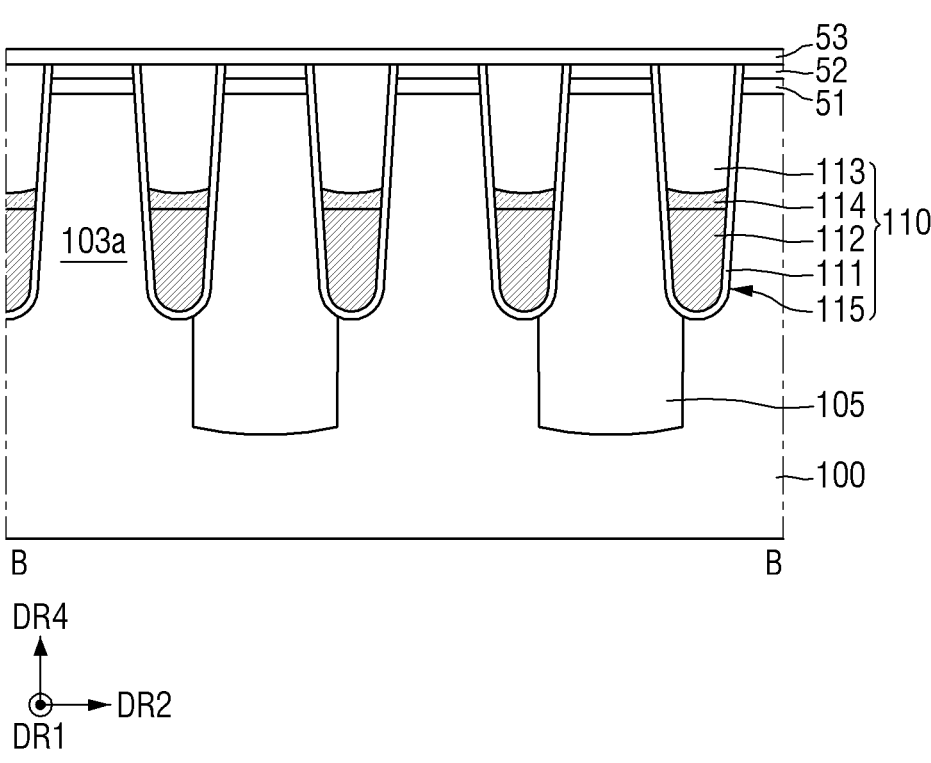
Figure 35:
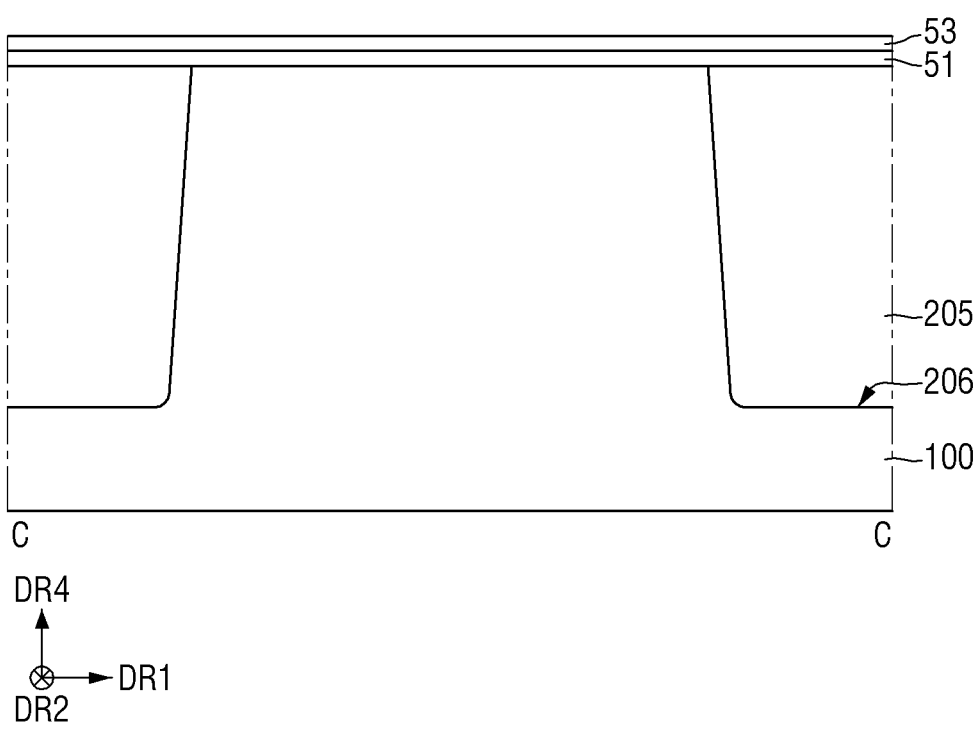
Figure 36:
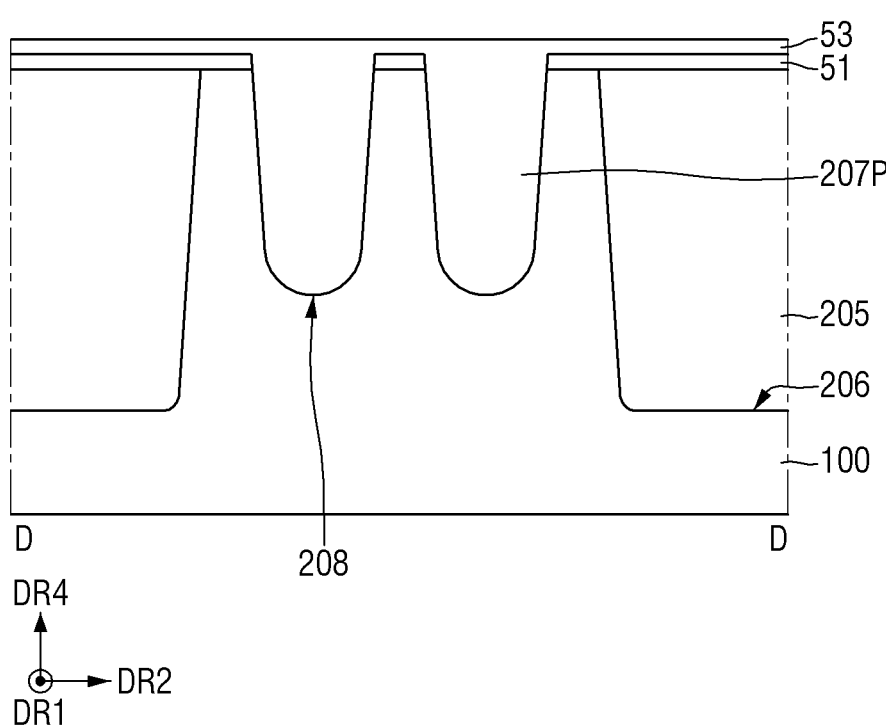
Figure 37:
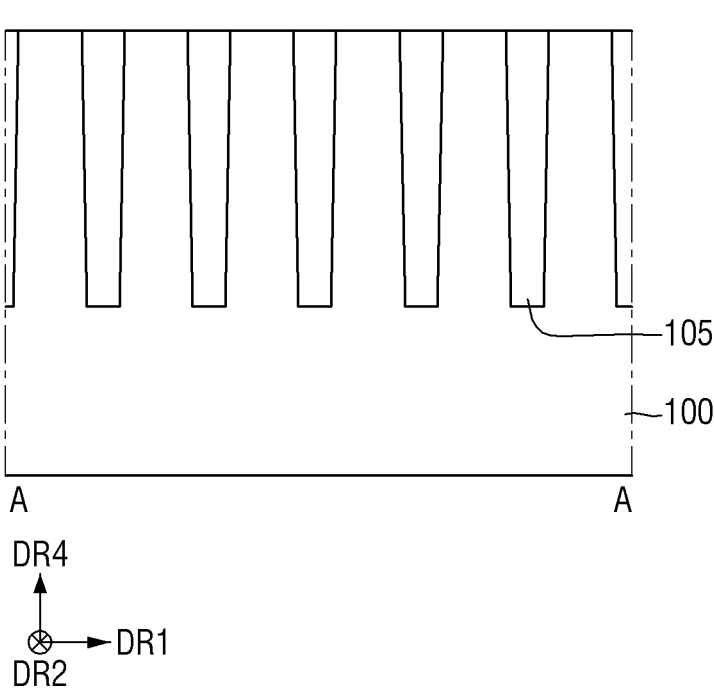
Figure 38:
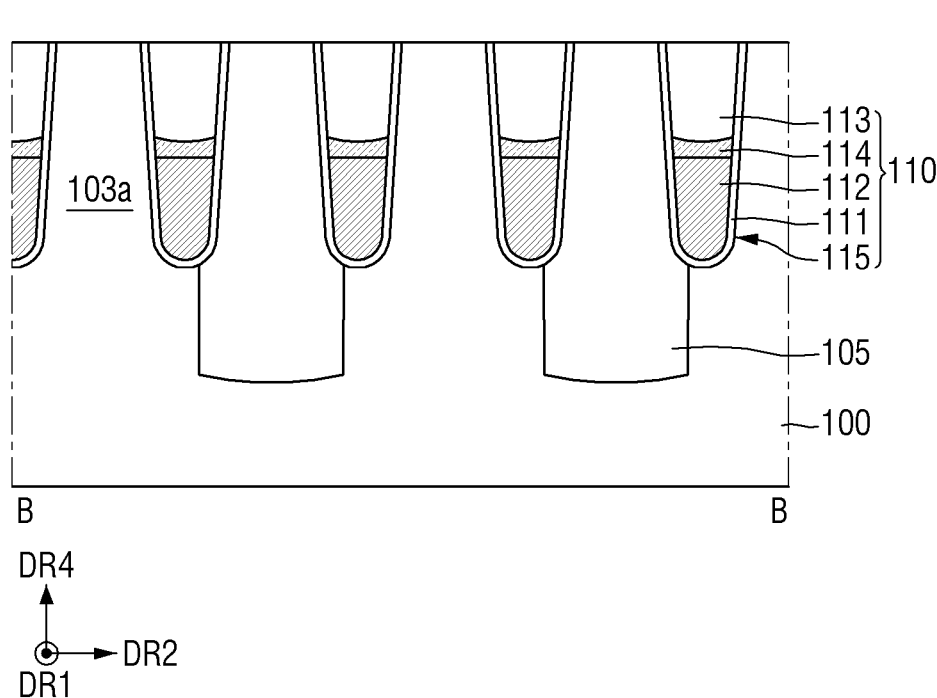
Figure 41:
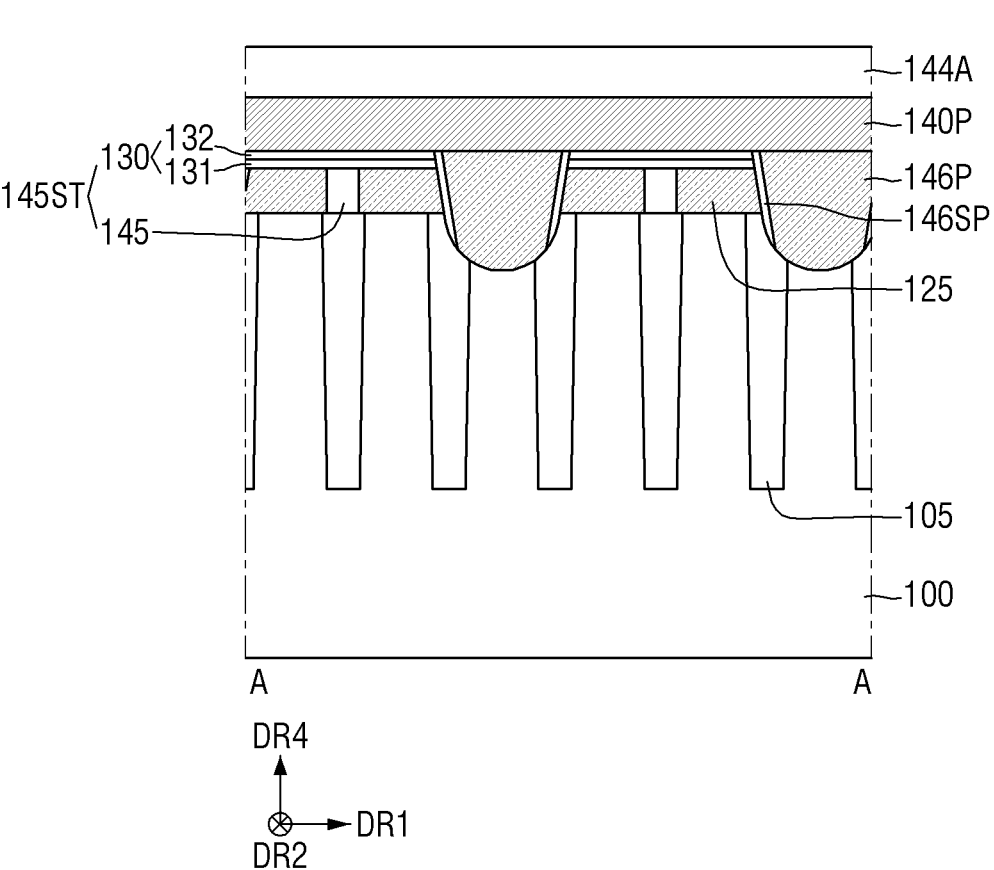
Figure 42:
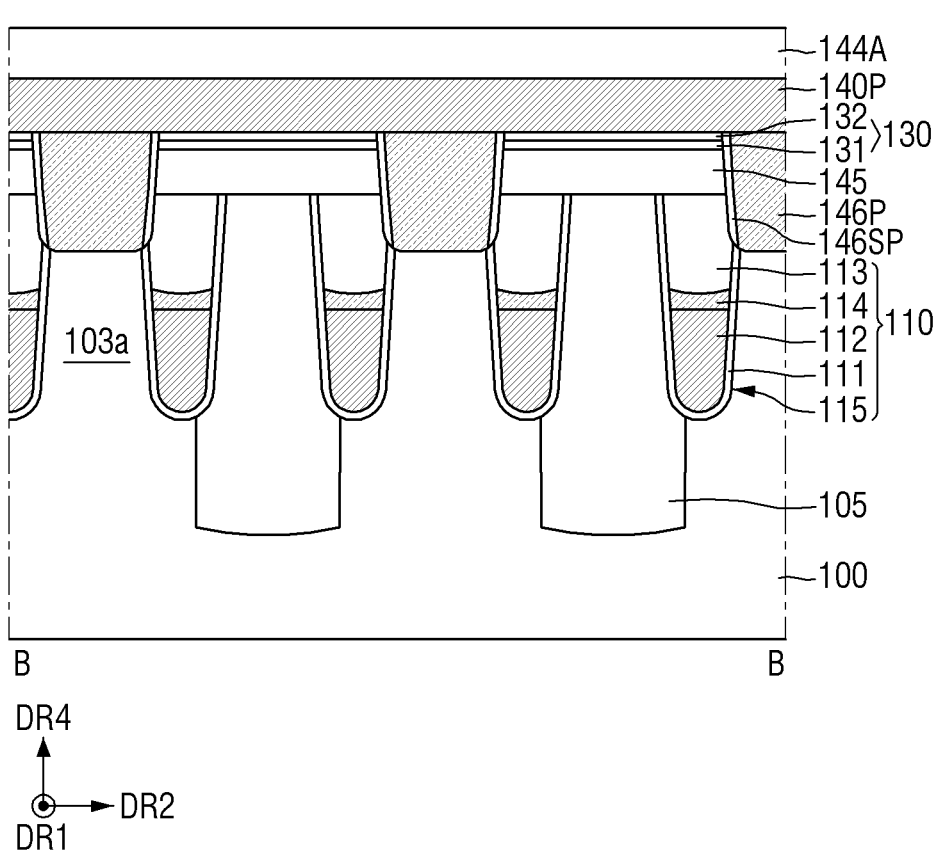
Figure 43:
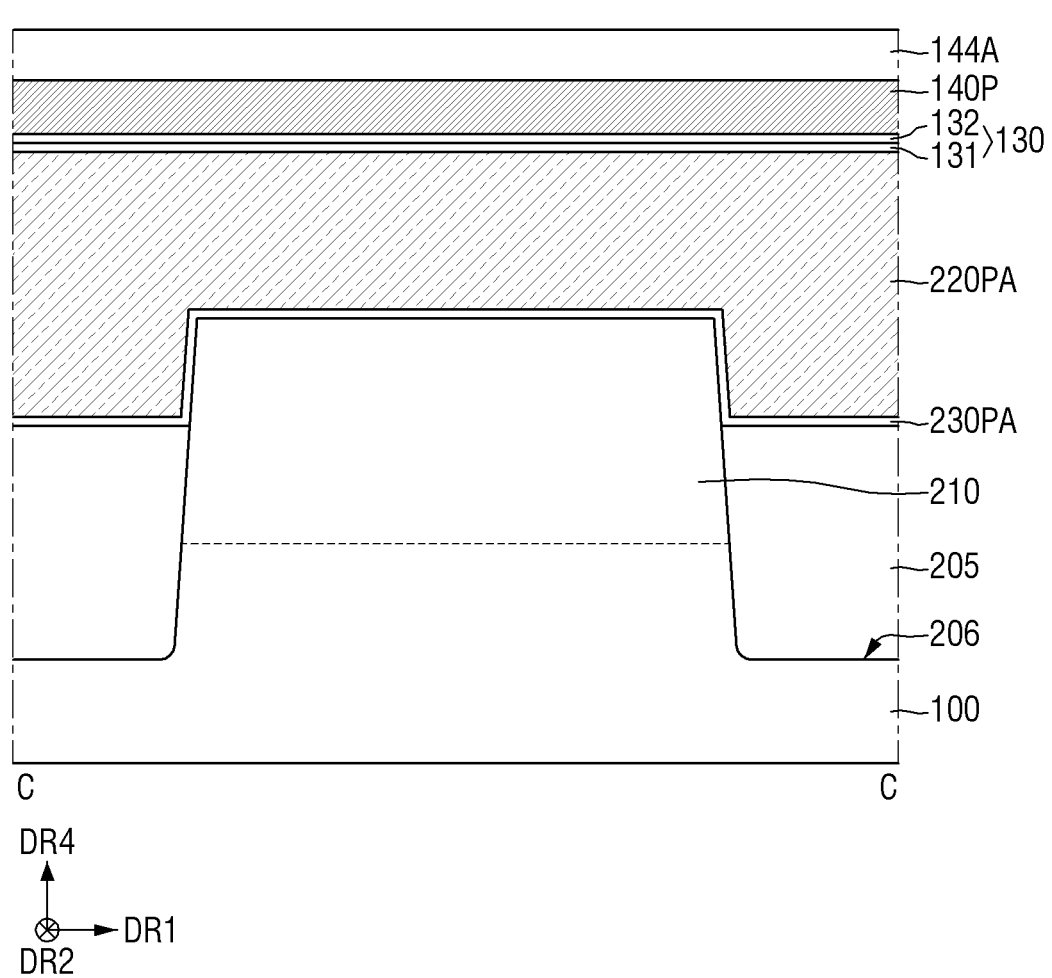
Figure 44:
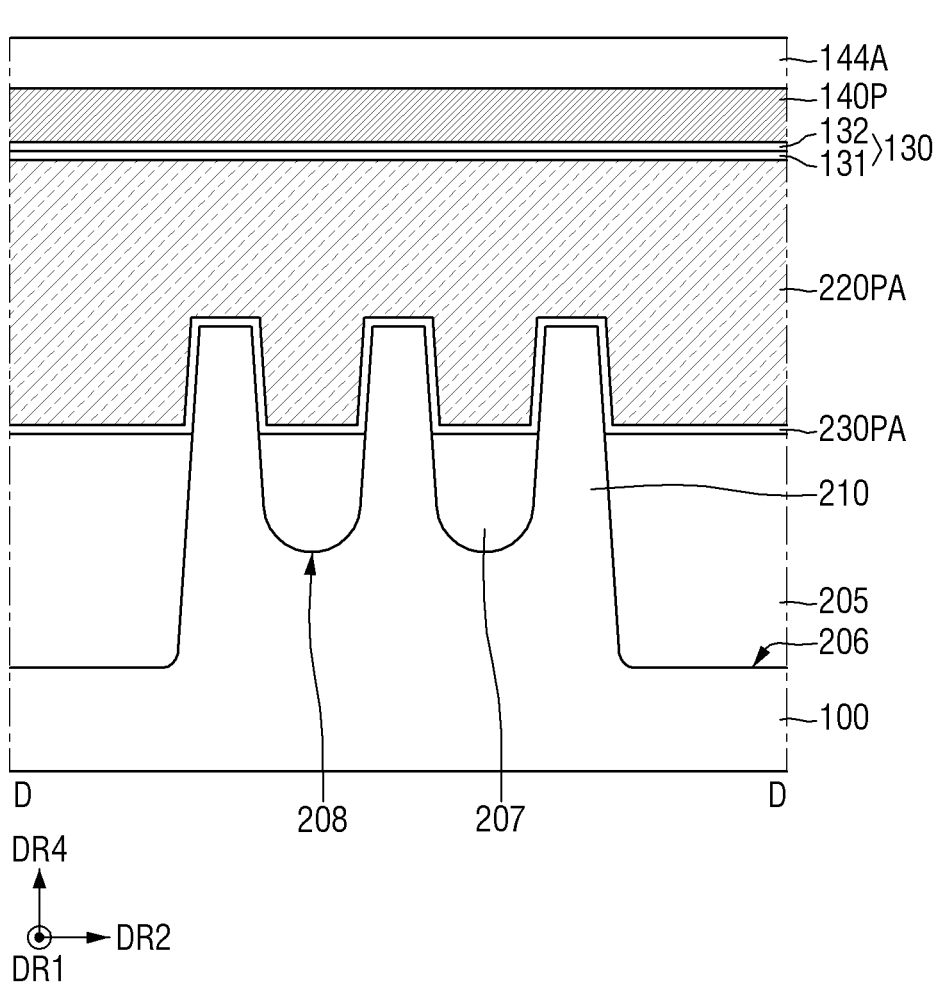

FIGS. 23 and 24 are layouts illustrating region R1 and region R2 of FIG. 1. FIGS. 25 and 26 are cross-sectional views of a semiconductor memory device fabricated using the layouts taken along line A-A and line B-B of FIG. 23, respectively. FIGS. 27 and 28 are cross-sectional views of a semiconductor memory device fabricated using the layouts taken along line C-C and line D-D of FIG. 24, respectively. FIG. 57 shows a flowchart of fabricating a semiconductor memory device.

Referring to FIGS. 1 and 23 to 28, the substrate 100 including the cell region 20 and the peripheral region 24 defined around the cell region 20 may be provided.

The cell element separation films 105 may be formed at the substrate 100 of the cell region 20 (S100). The cell region 20 may include the cell active regions ACT defined by the cell element separation films 105.

The peripheral element separation film 205 may be formed at the substrate 100 of the peripheral region 24 (S200). The peripheral element separation film 205 may fill the peripheral separation trench 206 formed in the substrate 100. The peripheral region 24 may include or may be the peripheral active region P_ACT defined by the peripheral element separation film 205. In an embodiment, the cell element separation films 105 and the peripheral element separation film 205 may be formed separately or simultaneously.

Referring to FIGS. 29 to 32, a first buffer film 51 and a second buffer film 52 may be sequentially formed on the substrate 100. The first buffer film 51 and the second buffer film 52 may be formed not only in the cell region 20 but also in the peripheral region 24.

The first buffer film 51 may include or may be formed of, for example, silicon oxide, and the second buffer film 52 may include or may be formed of, for example, silicon nitride, but the present disclosure is not limited thereto.

The cell gate structures 110 extending in the first direction DR1 may be formed at the substrate 100 of the cell region 20. For example, the cell gate trenches 115 extending in the first direction DR1 may be formed at the substrate 100 of the cell region 20. The cell gate trenches 115 may penetrate through the first buffer film 51 and the second buffer film 52 and be formed at the substrate 100. The cell gate insulating films 111 may be formed in the cell gate trenches 115, and the cell gate electrodes 112 may then be formed in the cell gate trenches 115. Subsequently, the cell gate capping conductive films 114 and the cell gate capping patterns 113 may be formed. In step S300, the cell gate trenches 115 may be formed at the substrate 100 of the cell region 20 and the cell gate electrodes 112 may be formed in the cell gate trenches 115.

The fin trenches 208 extending in the first direction DR1 may be formed at the substrate 100 of the peripheral region 24. The fin trenches 208 may penetrate through the first buffer film 51 and the second buffer film 52 and be formed at the substrate 100. Dummy buried gate insulating films 111P may be formed in the fin trench 208, and dummy buried gate electrodes 112P may then be formed in the fin trenches 208. The dummy buried gate electrodes 112P are formed in the peripheral active region P_ACT of the peripheral region 24. Subsequently, dummy buried gate capping conductive films 114P and dummy buried gate capping patterns 113P may be formed. In step S400, the fin trenches 208 may be formed at the substrate 100 of the peripheral region 24, and then the dummy buried gate electrodes 112P may be formed in the fin trenches 208.

For example, the cell gate trenches 115 are formed simultaneously with the fin trenches 208. The cell gate electrodes 112 are formed simultaneously with the dummy buried gate electrodes 112P. For example, during a time when the cell gate structures 110 are formed in the cell region 20, the fin trenches 208, the dummy buried gate insulating films 111P, the dummy buried gate electrodes 112P, the dummy buried gate capping conductive films 114P, and the dummy buried gate capping patterns 113P are formed in the peripheral region 24.

Referring to FIGS. 33 to 36, the dummy buried gate electrodes 112P formed in the peripheral region 24 may be removed (S500).

For example, after a first mask pattern is formed on the cell region 20, the second buffer film 52 and the dummy buried gate capping patterns 113P may be removed. The dummy buried gate capping patterns 113P are removed to expose the dummy buried gate electrodes 112P and the dummy buried gate capping conductive films 114P.

Subsequently, in the fin trench 208, the dummy buried gate electrodes 112P and the dummy buried gate capping conductive films 114P may be removed. Subsequently, the first mask pattern formed on the cell region 20 may be removed.

Subsequently, a third buffer film 53 may be formed on the substrate 100. The third buffer film 53 may be formed in the cell region 20 and the peripheral region 24. The third buffer film 53 may fill the fin trenches 208 in which the dummy buried gate electrodes 112P and the dummy buried gate capping conductive films 114P are removed. The third buffer film 53 may include or may be formed of, for example, silicon oxide, but is not limited thereto.

Pre-field insulating films 207P may be formed in the fin trenches 208. The pre-field insulating films 207P may include or may be formed of the cell gate insulating films 111 and a portion of the third buffer film 53.

Referring to FIGS. 37 to 40, the first to third buffer films 51, 52, and 53 may be removed on the substrate 100 of the cell region 20. During a time when the first to third buffer films 51, 52, and 53 are removed, portions of the cell gate capping patterns 113 may also be removed.

The first buffer film 51 and the third buffer film 53 may be removed on the substrate 100 of the peripheral region 24. In addition, portions of the pre-field insulating films 207P and the peripheral element separation film 205 may be removed. Portions of the pre-field insulating films 207P are removed to form the peripheral field insulating films 207 in the fin trenches 208.

Portions of the pre-field insulating films 207P and the peripheral element separation film 205 are removed to form the plurality of fin-type active patterns 210 extending in the first direction DR1 on the substrate 100 of the peripheral region 24 (S600).

Referring to FIGS. 41 to 44, the node connection pads 125 and a pad separation structure 145ST may be formed on the substrate 100 of the cell region 20.

Subsequently, pre-bit line contacts 146P may be formed at positions where the bit line contacts 146 (FIGS. 5 and 6) are to be formed. After contact recesses for forming the pre-bit line contacts 146P are formed, the bit line contact spacers 146SP may be formed on sidewalls of the contact recesses. The pre-bit line contacts 146P may be formed on the bit line contact spacers 146SP.

Subsequently, a cell conductive film 140P and a lower cell capping film 144A may be formed on the pre-bit line contacts 146P and the upper cell insulating film 130.

A pre-gate insulating film 230PA and a pre-gate film 220PA may be formed on the substrate 100 of the peripheral region 24. The pre-gate insulating film 230PA and the pre-gate film 220PA may cover the fin-type active patterns 210. The pre-gate film 220PA may include or may be formed of, for example, a semiconductor material. The pre-gate insulating film 230PA may include or may be formed of, for example, silicon oxide, but is not limited thereto.

Subsequently, an upper cell insulating film 130 may be formed on the pre-gate film 220PA. During a time when the upper cell insulating film 130 is formed in the cell region 20, the upper cell insulating film 130 may also be formed on the pre-gate film 220PA of the peripheral region 24.

A cell conductive film 140P and a lower cell capping film 144A may be formed on the upper cell insulating film 130. The cell conductive film 140P and the lower cell capping film 144A may be formed not only in the cell region 20 but also in the peripheral region 24.

Figure 45:
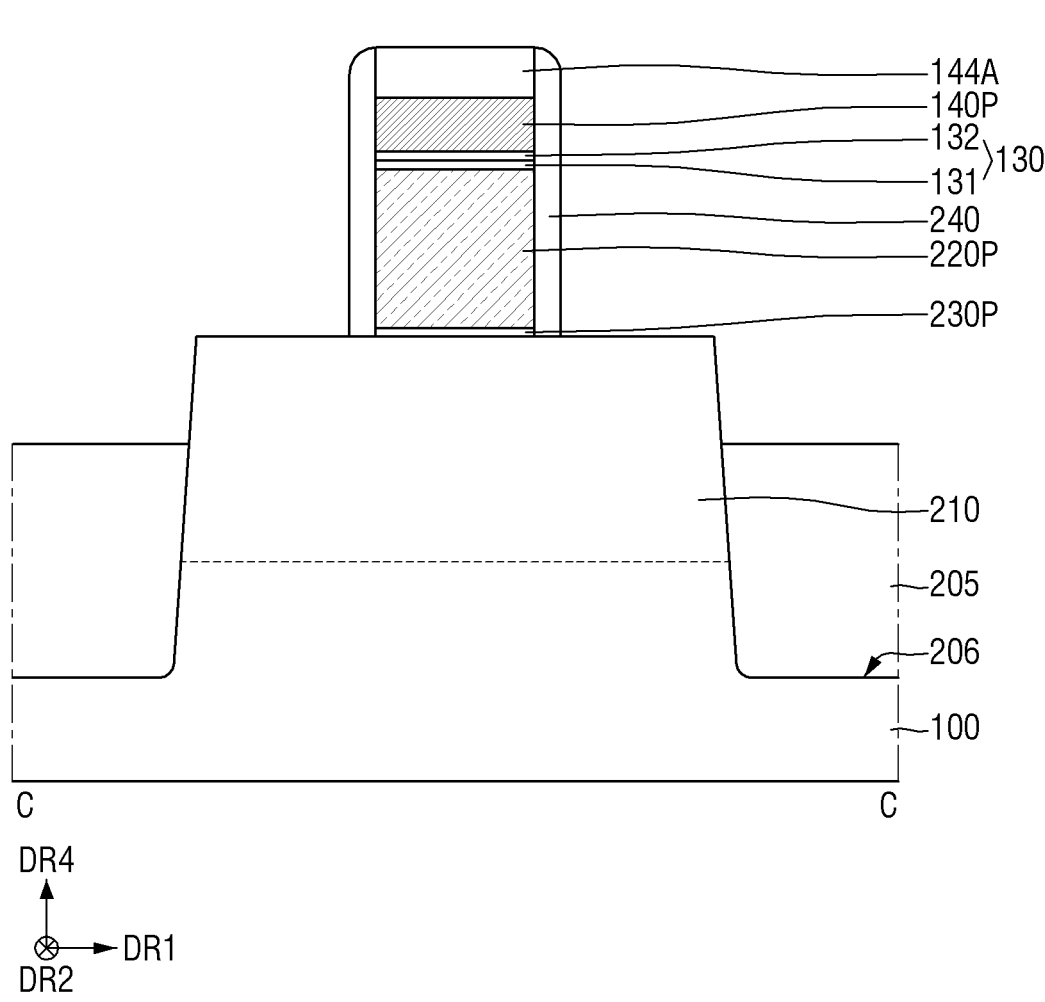
Figure 46:
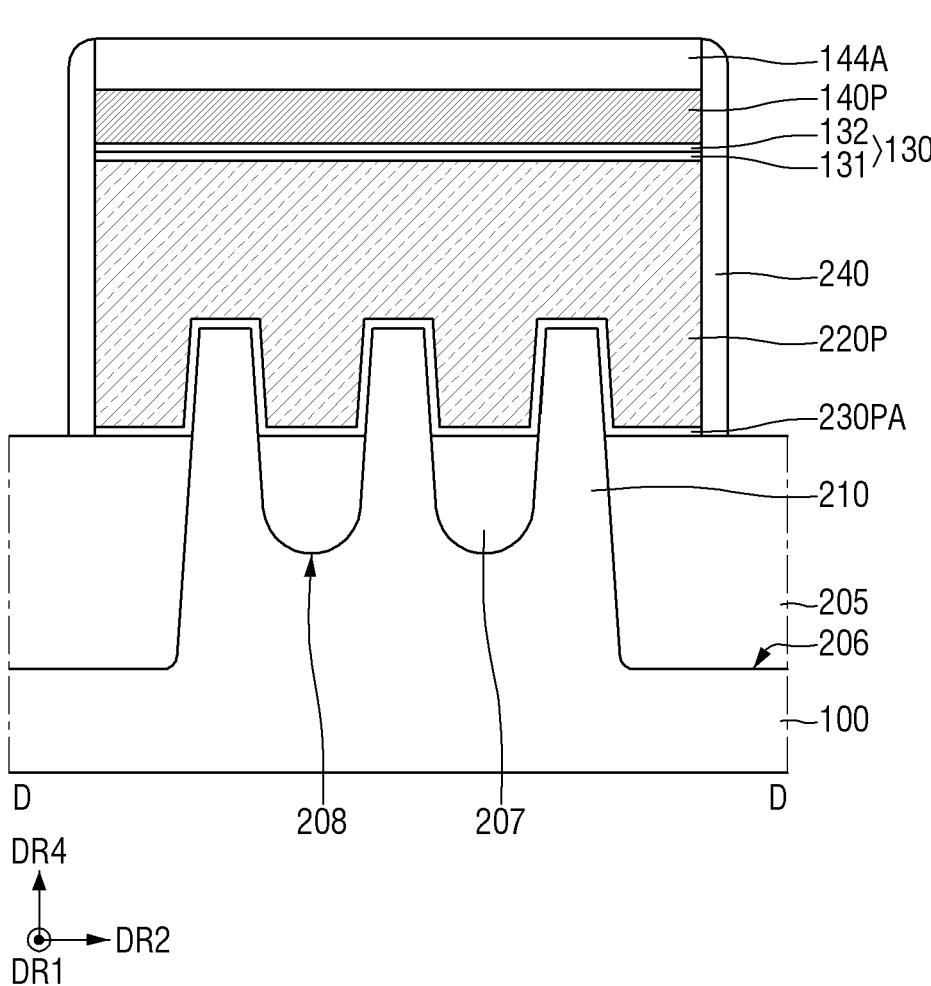

Referring to FIGS. 45 and 46, the pre-gate insulating film 230PA and the pre-gate film 220PA are patterned to form a dummy peripheral gate insulating film 230P and a dummy peripheral gate electrode 220P crossing the fin-type active pattern 210. The dummy peripheral gate insulating film 230P and the dummy peripheral gate electrode 220P are formed on the fin-type active pattern 210.

During a time when the dummy peripheral gate insulating film 230P and the dummy peripheral gate electrode 220P are formed, the upper cell insulating film 130, the cell conductive film 140P, and the lower cell capping film 144A may also be patterned. The patterned upper cell insulating film 130, the patterned cell conductive film 140P, and the patterned lower cell capping film 144A may be disposed on the dummy peripheral gate electrode 220P.

Subsequently, peripheral gate spacers 240 may be formed on sidewalls of the dummy peripheral gate insulating film 230P and sidewalls of the dummy peripheral gate electrode 220P. The peripheral gate spacers 240 are formed on sidewalls of the patterned upper cell insulating film 130, sidewalls of the patterned cell conductive film 140P, and sidewalls of the patterned lower cell capping film 144A.

Figure 47:
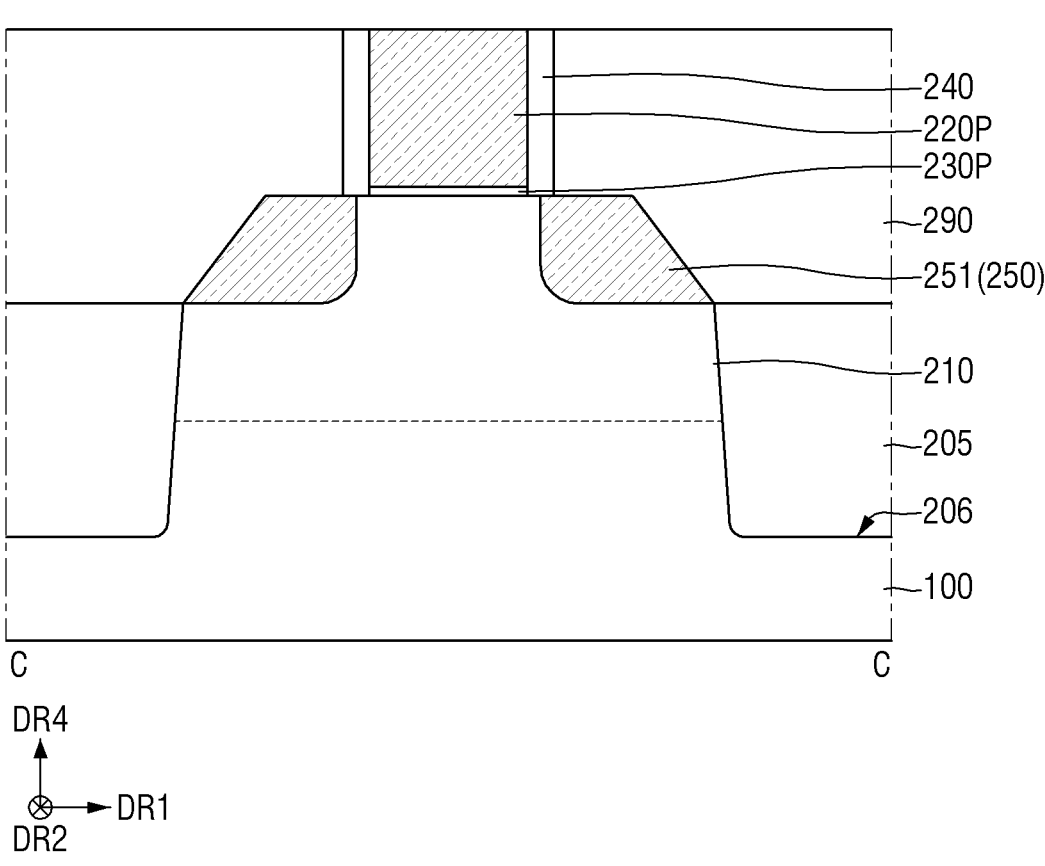
Figure 48:
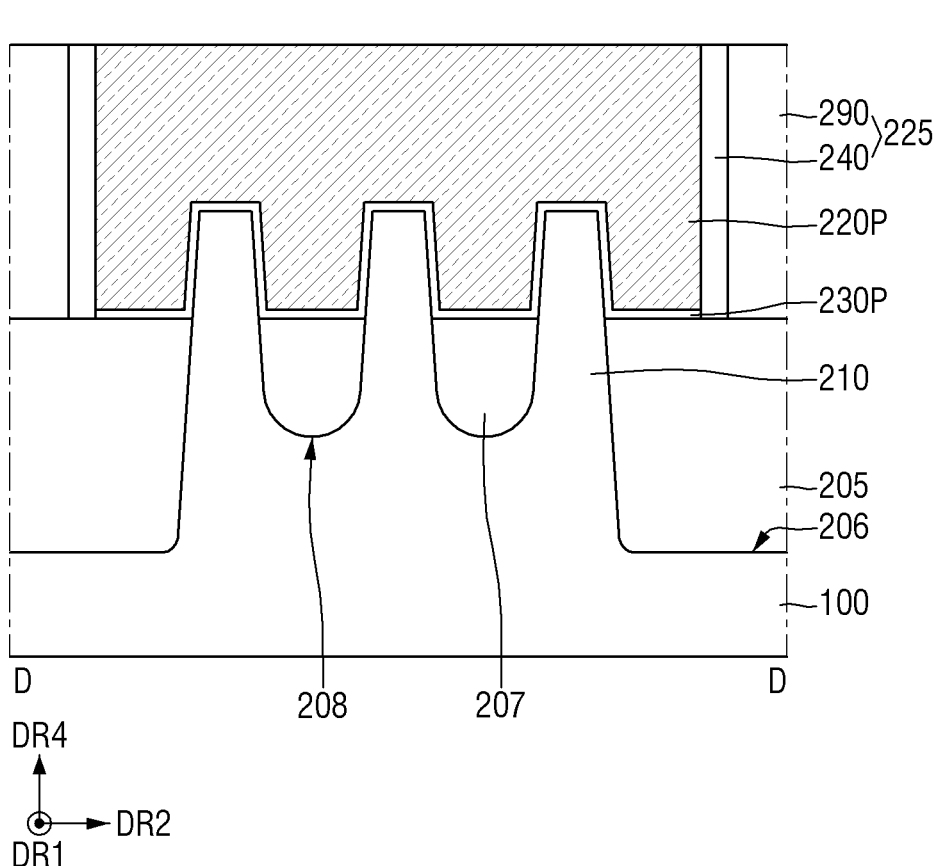
Figure 49:
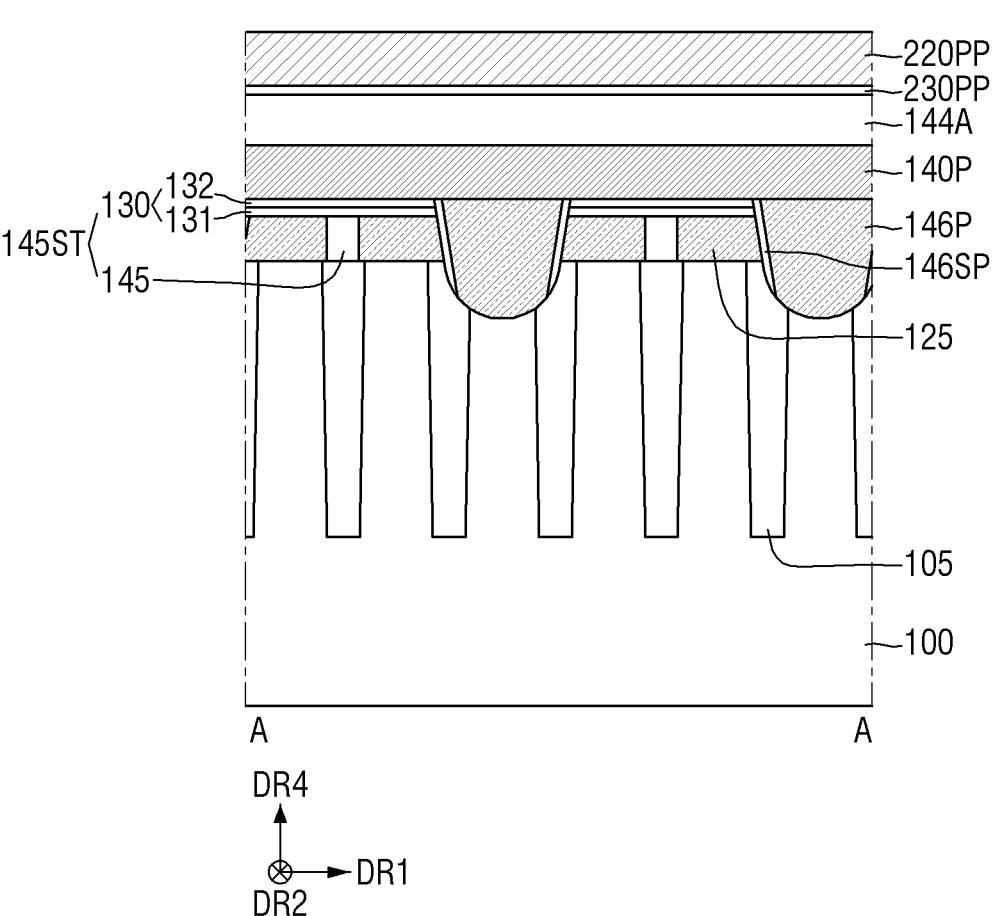
Figure 50:
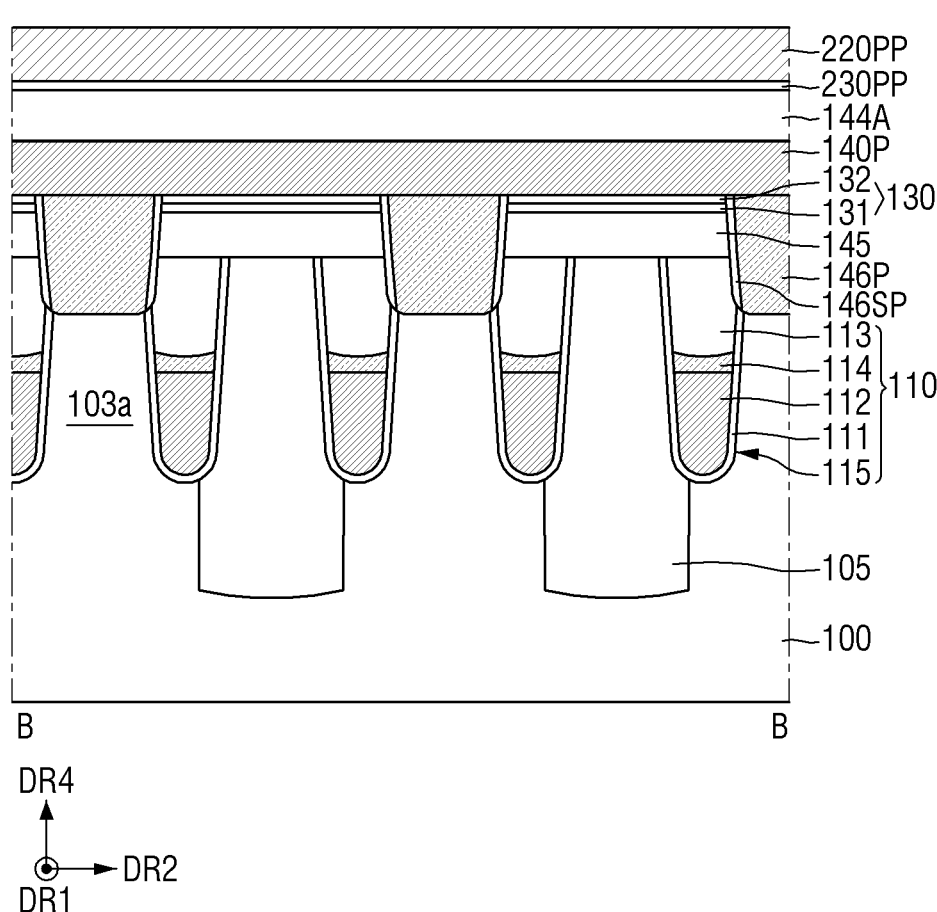
Figure 51:
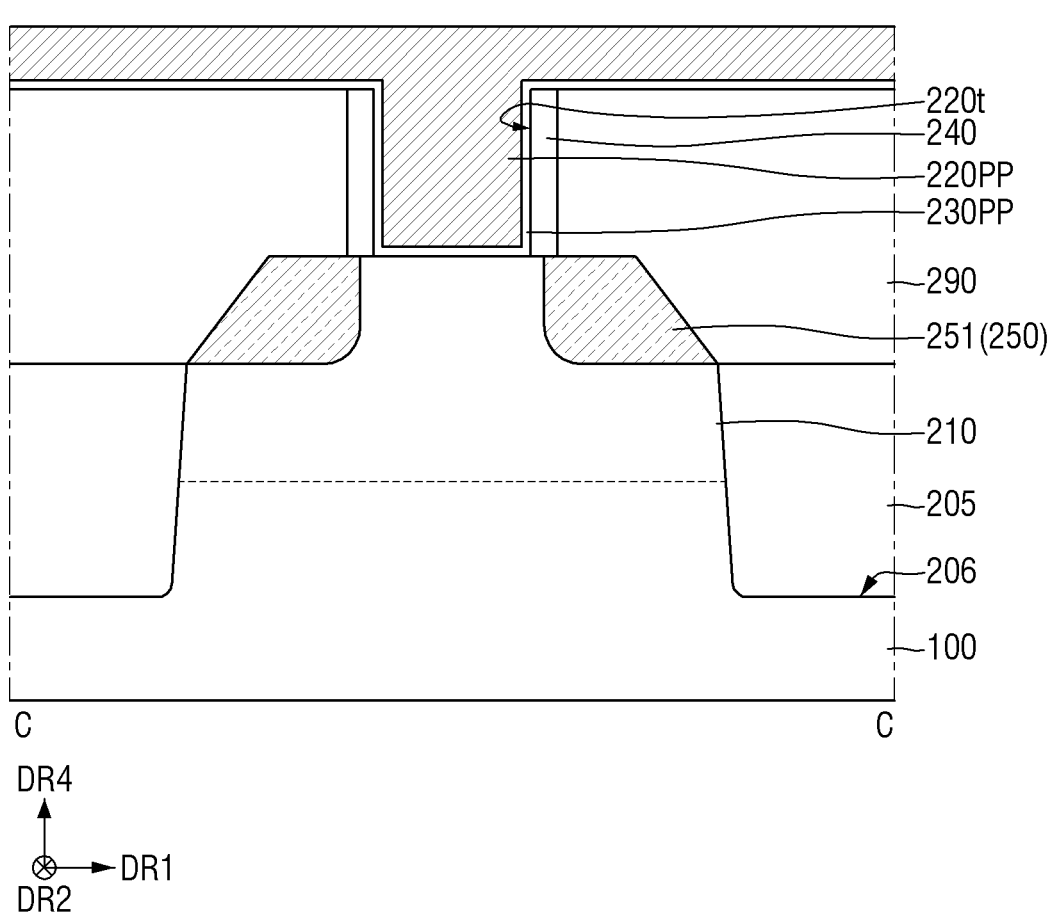
Figure 52:
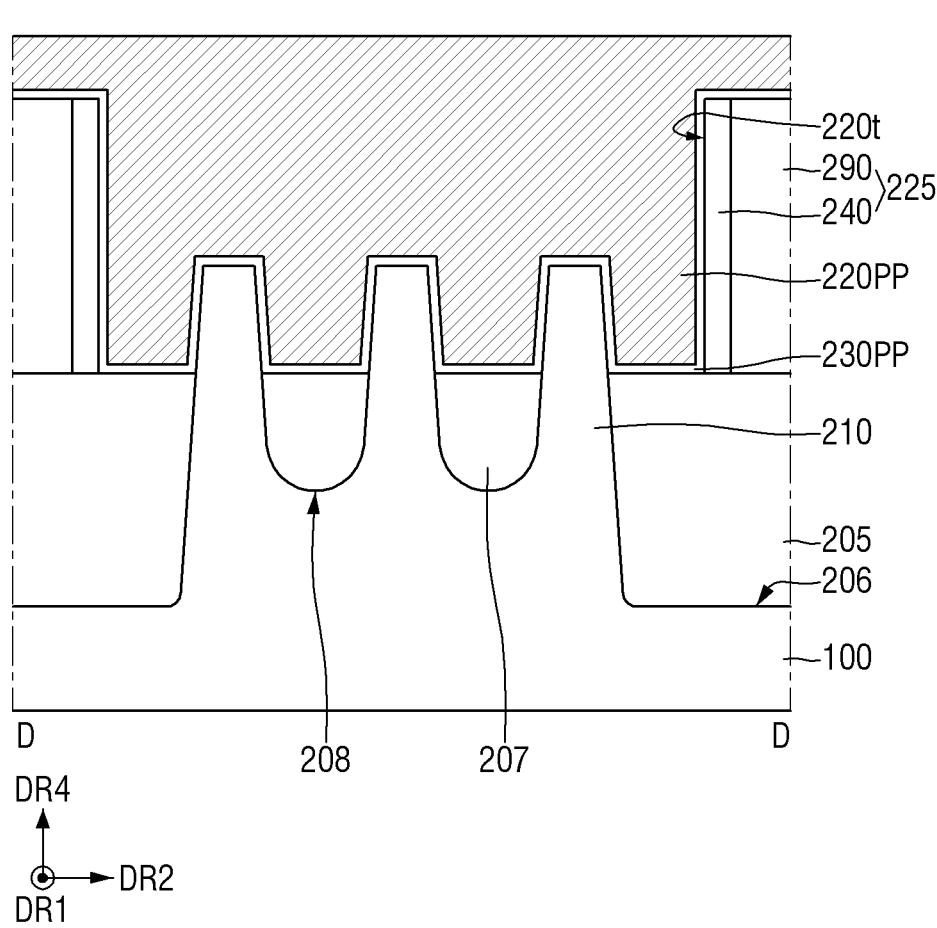
Figure 53:
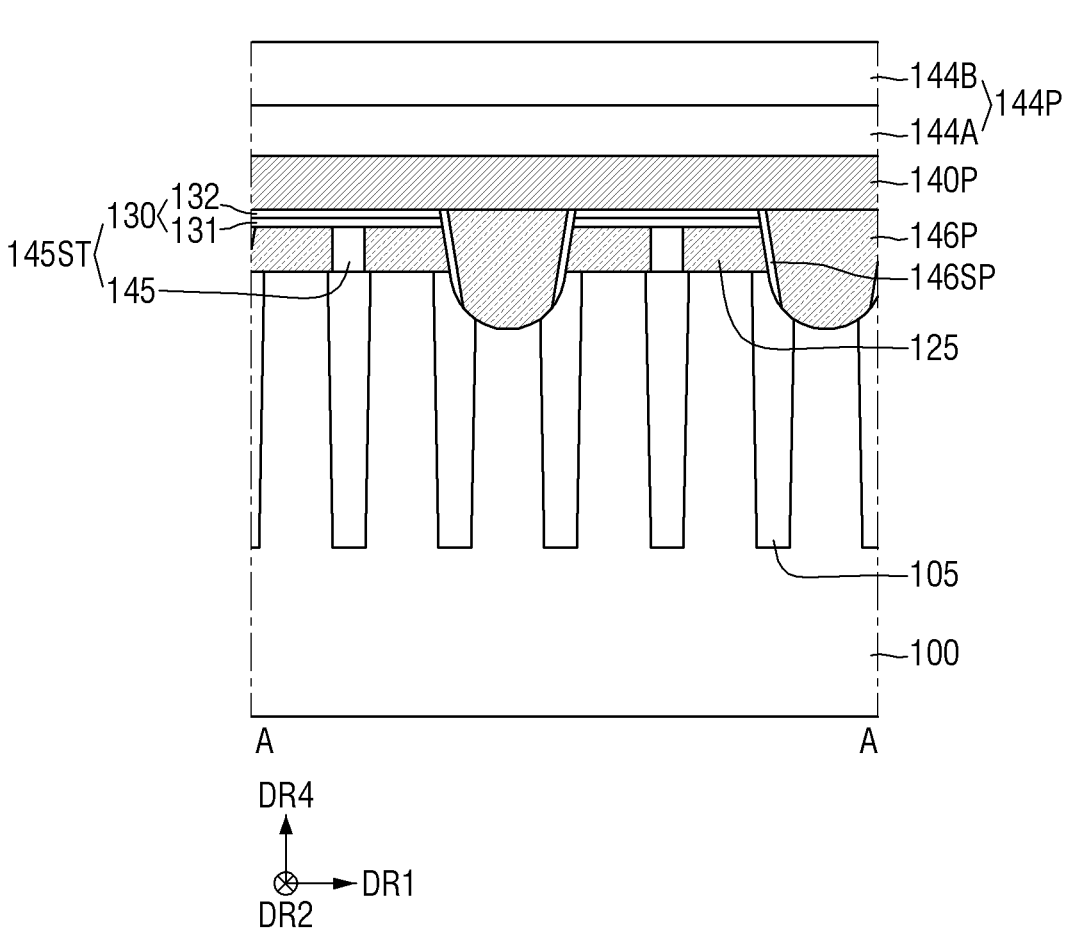
Figure 54:
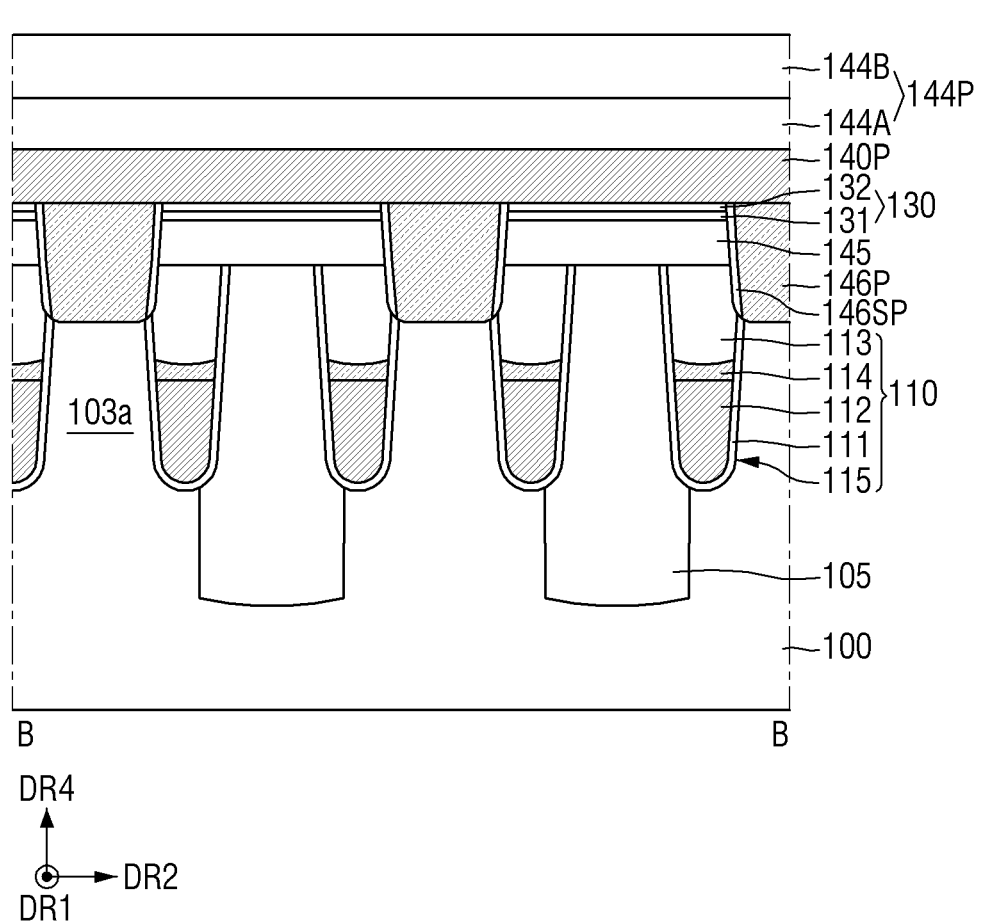
Figure 55:
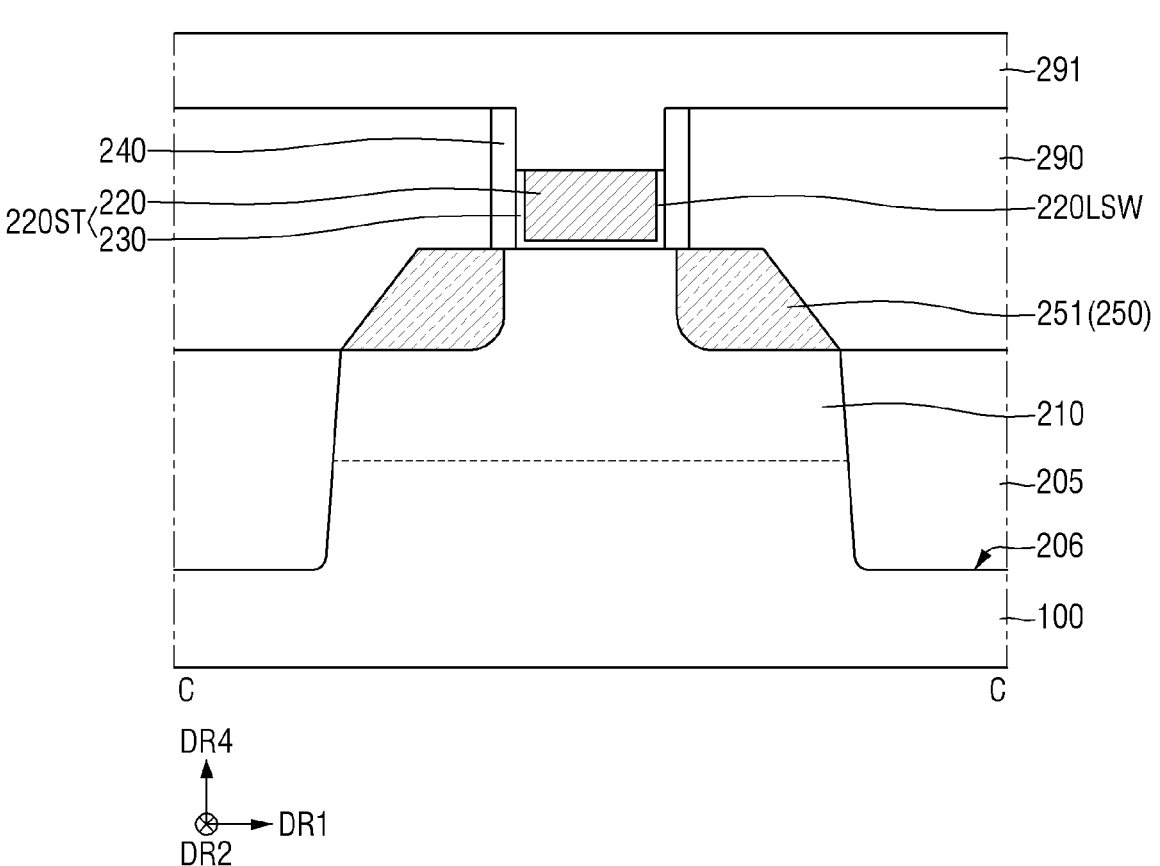
Figure 56:
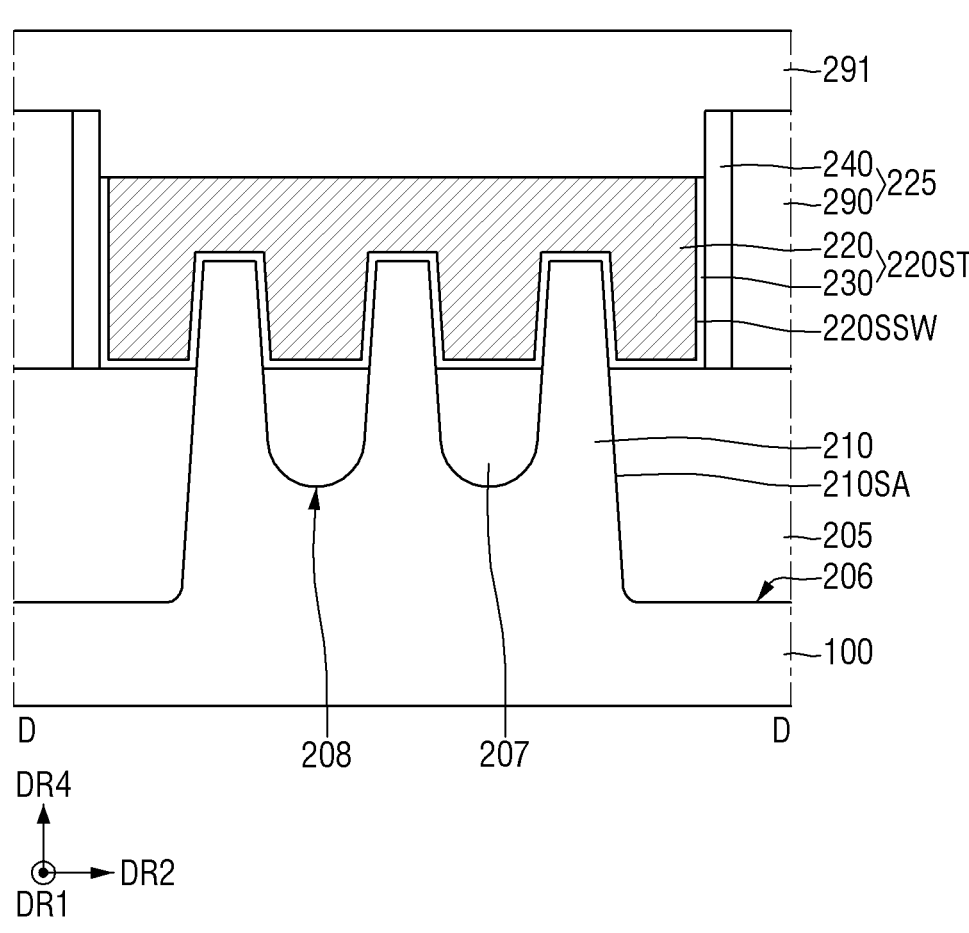

Referring to FIGS. 47 and 48, peripheral source/drain regions 250 may be formed on opposite sides of the dummy peripheral gate electrode 220P.

The peripheral source/drain region 250 may include or may be a semiconductor epitaxial pattern 251 on the fin-type active pattern 210.

Subsequently, lower peripheral interlayer insulating films 290 are formed on the substrate 100 of the peripheral region 24. The lower peripheral interlayer insulating films 290 cover sidewalls of the peripheral gate spacers 240.

During a time when the lower peripheral interlayer insulating films 290 are formed, the patterned upper cell insulating film 130, the patterned cell conductive film 140P, and the patterned lower cell capping film 144A may be removed. The lower peripheral interlayer insulating films 290 are formed, and the dummy peripheral gate electrode 220P may be exposed. An upper surface of the exposed dummy peripheral gate electrode 220P may be disposed on the same plane as an upper surface of the lower cell capping film 144A.

Referring to FIGS. 49 to 52, the dummy peripheral gate insulating film 230P and the dummy peripheral gate electrode 220P are removed to form a peripheral gate trench 220t. The peripheral gate trench 220t may expose the fin-type active pattern 210.

Subsequently, a pre-gate insulating film 230PP may be formed along sidewalls and a bottom surface of the peripheral gate trench 220t and an upper surface of the lower peripheral interlayer insulating film 290. A pre-peripheral gate electrode 220PP filling the peripheral gate trench 220t may be formed on the pre-gate insulating film 230PP. The pre-peripheral gate electrode 220PP may also be formed on the upper surface of the lower peripheral interlayer insulating film 290.

The pre-peripheral gate electrode 220PP and the pre-gate insulating film 230PP may also be formed on the lower cell capping film 144A of the cell region 20.

Referring to FIGS. 53 to 56, portions of the pre-peripheral gate electrode 220PP and the pre-gate insulating film 230PP are removed to form the peripheral gate electrode 220 and the peripheral gate insulating film 230 (S700).

The peripheral gate electrode 220 and the peripheral gate insulating film 230 are formed on the fin-type active pattern 210. The peripheral gate electrode 220 and the peripheral gate insulating film 230 cross the fin-type active pattern 210.

During a time when the peripheral gate electrode 220 and the peripheral gate insulating film 230 are formed, the pre-peripheral gate electrode 220PP and the pre-gate insulating film 230PP on the upper surface of the lower peripheral interlayer insulating film 290 are removed. An upper surface of the peripheral gate electrode 220 is lower than an upper surface of the peripheral gate spacer 240 and an upper surface of the lower peripheral interlayer insulating film 290.

During a time when the peripheral gate electrode 220 and the peripheral gate insulating film 230 are formed, the pre-peripheral gate electrode 220PP and the pre-gate insulating film 230PP on the lower cell capping film 144A may be removed.

Subsequently, an upper peripheral interlayer insulating film 291 may be formed on the peripheral gate electrode 220. In addition, an upper cell capping film 144B may be formed on the lower cell capping film 144A. The upper peripheral interlayer insulating film 291 and the upper cell capping film 144B may be simultaneously formed.

A pre-cell capping film 144P may be formed on the cell conductive film 140P. The pre-cell capping film 144P includes or is formed of the upper cell capping film 144B and the lower cell capping film 144A.

An upper surface of the pre-cell capping film 144P may be disposed on the same plane as the upper surface of the upper peripheral interlayer insulating film 291.

Referring to FIGS. 5 and 6, the pre-cell capping film 144P and the cell conductive film 140P are patterned to form the bit line structures 140ST. In addition, the pre-bit line contacts 146P are patterned to form the bit line contacts 146.

Subsequently, the cell line spacers 150 and the storage pads 160 may be formed. In addition, the information storage parts 190 connected to the storage pads 160 may be formed on the storage pads 160.

Those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor memory device comprising:
a substrate including a cell region and a peripheral region surrounding the cell region, the cell region including a cell active region;
a cell gate electrode disposed at the substrate of the cell region and extending in a first direction;
a bit line structure disposed at the substrate of the cell region, wherein the bit line structure includes:
a cell conductive line extending in a second direction different from the first direction, and
a cell line capping film disposed on the cell conductive line;
a first node connection pad and a second node connection pad being spaced apart from each other in the first direction, wherein the first node connection pad and the second node connection pad are in contact with the substrate of the cell region;
a pad separation structure separating the first node connection pad and the second node connection pad from each other and covering an upper surface of the first node connection pad and an upper surface of the second node connection pad;
a plurality of fin-type patterns disposed at the substrate of the peripheral region, extending in the first direction, and being spaced apart from each other in the second direction;
a peripheral gate electrode crossing the plurality of fin-type patterns and including a first sidewall extending in the first direction and a second sidewall extending in the second direction;
a peripheral gate separation pattern disposed on the first sidewall of the peripheral gate electrode and having an upper surface higher than an upper surface of the peripheral gate electrode; and
a peripheral interlayer insulating film covering the upper surface of the peripheral gate electrode, the upper surface of the peripheral gate separation pattern and a portion of a sidewall of the peripheral gate separation pattern,
wherein an upper surface of the peripheral interlayer insulating film and an uppermost surface of the cell line capping film are positioned at the same height relative to the substrate, and
wherein the cell conductive line is disposed on an upper surface of the pad separation structure.

2. The semiconductor memory device of claim 1, further comprising:
a fin trench separating the plurality of fin-type patterns adjacent to each other in the second direction from each other; and
a cell gate trench disposed in the substrate of the cell region,
wherein the cell gate electrode is disposed in the cell gate trench, and
wherein a depth of the cell gate trench is the same as a depth of the fin trench.

3. The semiconductor memory device of claim 2,
wherein the cell gate trench is disposed at the cell active region, and
wherein a depth of the cell gate trench in the cell active region is the same as the depth of the fin trench.

4. The semiconductor memory device of claim 1,
wherein the plurality of fin-type patterns include a first fin-type pattern including a first sidewall and a second sidewall opposite to each other in the second direction, and
wherein a height of the first sidewall of the first fin-type pattern is different from a height of the second sidewall of the first fin-type pattern.

5. The semiconductor memory device of claim 1, further comprising:
a peripheral gate insulating film disposed between the peripheral gate electrode and each of the plurality of fin-type patterns,
wherein the peripheral gate insulating film extends along the sidewall of the peripheral gate separation pattern.

6. The semiconductor memory device of claim 1, further comprising:
a pair of source/drain regions disposed on opposite sidewalls of the peripheral gate electrode, wherein the pair of source/drain regions include a semiconductor epitaxial pattern disposed at a corresponding fin-type pattern of the plurality of fin-type patterns.

7. The semiconductor memory device of claim 1, further comprising:

a bit line contact connecting the cell conductive line to the cell active region, wherein the bit line contact includes a portion with a decreasing width toward the cell active region.

8. The semiconductor memory device of claim 1, further comprising:

an information storage part disposed on the cell region; and a storage pad connecting the first node connection pad to a lower electrode of the information storage part, wherein the storage pad contacts the uppermost surface of the cell line capping film.

9. A semiconductor memory device comprising:

a substrate including a cell region and a peripheral region surrounding the cell region, the cell region including a cell active region;

a cell element separation film on the substrate and defining the cell active region;

a cell gate structure disposed at the substrate of the cell region, wherein the cell gate structure includes:

a cell gate trench extending in a first direction across the cell element separation film and the cell active region, wherein the cell gate trench extends from an upper surface of the cell element separation film toward a bottom surface of the substrate, and a cell gate electrode in the cell gate trench;

a bit line structure disposed at the substrate of the cell region, wherein the bit line structure includes:

a cell conductive line extending in a second direction different from the first direction, and a cell line capping film disposed on the cell conductive line;

a plurality of fin-type patterns disposed at the substrate of the peripheral region, extending in the first direction, and being spaced apart from each other in the second direction;

a fin trench separating the plurality of fin-type patterns adjacent to each other in the second direction from each other, wherein the fin trench extends from an upper surface of a first fin-type pattern of the plurality of fin-type patterns adjacent to the fin trench toward the bottom surface of the substrate;

a peripheral gate electrode crossing the plurality of fin-type patterns; and a peripheral interlayer insulating film disposed on the peripheral gate electrode, wherein a depth of the cell gate trench relative to the upper surface of the cell element separation film is the same as a depth of the fin trench relative to the upper surface of the first fin-type pattern of the plurality of fin-type patterns adjacent to the fin trench.

10. The semiconductor memory device of claim 9, wherein the depth of the cell gate trench and the depth of the fin trench are measured from the upper surface of the cell element separation film.

11. The semiconductor memory device of claim 9, further comprising:

a peripheral gate spacer disposed on a sidewall of the peripheral gate electrode, wherein an upper surface of the peripheral gate electrode is lower than an upper surface of the peripheral gate spacer.

12. The semiconductor memory device of claim 11, further comprising:

a peripheral gate insulating film disposed between the peripheral gate electrode and a corresponding fin-type pattern of the plurality of fin-type patterns, wherein the peripheral gate insulating film extends along a sidewall of the peripheral gate spacer.

13. The semiconductor memory device of claim 9, further comprising:

a pair of source/drain regions disposed on opposite sidewalls of the peripheral gate electrode, wherein the pair of source/drain regions include a semiconductor epitaxial pattern connected to a corresponding fin-type pattern of the plurality of fin-type patterns.

14. The semiconductor memory device of claim 9, further comprising:

a first node connection pad and a second node connection pad being spaced apart from each other in the first direction, wherein the first node connection pad and the second node connection pad are in contact with the substrate of the cell region; and a pad separation structure separating the first node connection pad and the second node connection pad from each other and covering an upper surface of the first node connection pad and an upper surface of the second node connection pad.

15. The semiconductor memory device of claim 14, wherein the pad separation structure includes a pad separation pattern and a cell insulating film disposed on the pad separation pattern, wherein the pad separation pattern separates the first node connection pad and the second node connection pad from each other, and wherein the cell insulating film covers the upper surface of the first node connection pad and the upper surface of the second node connection pad.

16. A semiconductor memory device comprising:

a substrate including a cell region and a peripheral region surrounding the cell region, the cell region including a cell active region;

a plurality of cell gate electrodes disposed at the substrate of the cell region and extending in a first direction;

a bit line structure disposed at the substrate of the cell region, wherein the bit line structure includes:

a cell conductive line extending in a second direction different from the first direction, and a cell line capping film disposed on the cell conductive line;

a plurality of fin-type patterns disposed at the substrate of the peripheral region, extending in the first direction, and being spaced apart from each other in the second direction;

a plurality of fin trenches separating the plurality of fin-type patterns from each other and being spaced apart from each other in the second direction;

a peripheral gate electrode crossing the plurality of fin-type patterns; and a peripheral interlayer insulating film disposed on the peripheral gate electrode, wherein an interval between two adjacent cell gate electrodes of the plurality of cell gate electrodes spaced apart from each other in the second direction is the same as an interval between two adjacent fin trenches of the plurality of fin trenches spaced apart from each other in the second direction.

17. The semiconductor memory device of claim 16, further comprising:

a peripheral gate spacer disposed on a sidewall of the peripheral gate electrode; and a peripheral gate insulating film disposed between the peripheral gate electrode and a corresponding fin-type pattern of the plurality of fin-type patterns, wherein the peripheral gate insulating film extends along a sidewall of the peripheral gate spacer.

18. The semiconductor memory device of claim 16, further comprising:

a cell gate trench disposed in the substrate of the cell region, wherein the cell gate trench is filled with a corresponding cell gate electrode of the plurality of cell gate electrodes, and wherein a depth of the cell gate trench is the same as depths of the plurality of fin trenches.

* * * * *